United States Patent
Yano et al.

(10) Patent No.: US 6,291,852 B1
(45) Date of Patent: Sep. 18, 2001

(54) SEMICONDUCTOR ELEMENT AND SEMICONDUCTOR MEMORY DEVICE USING THE SAME

(75) Inventors: Kazuo Yano, Hino; Tomoyuki Ishii, Kodaira; Takashi Hashimoto, Iruma; Koichi Seki, Hino; Masakazu Aoki, Tokorozawa; Takeshi Sakata, Kunitachi; Yoshinobu Nakagome, Hamura; Kan Takeuchi, Kodaira, all of (JP)

(73) Assignees: Hitachi, Ltd.; Hitachi Device Engenering Co., Ltd., both of Tokyo (JP)

( * ) Notice: Subject to any disclaimer, the term of this patent is extended or adjusted under 35 U.S.C. 154(b) by 0 days.

(21) Appl. No.: 09/521,970

(22) Filed: Mar. 9, 2000

Related U.S. Application Data

(63) Continuation of application No. 09/126,437, filed on Jul. 30, 1998, now Pat. No. 6,104,056, which is a continuation of application No. 08/778,260, filed on Jan. 8, 1997, now abandoned, which is a continuation of application No. 08/291,752, filed on Aug. 16, 1994, now Pat. No. 5,600,163.

(30) Foreign Application Priority Data

Aug. 19, 1993 (JP) .................................... 5-204922
Nov. 22, 1993 (JP) .................................... 5-291638

(51) Int. Cl.[7] ........................ H01L 29/76; H01L 29/94; H01L 31/062; H01L 31/113; H01L 21/119
(52) U.S. Cl. .................. 257/314; 257/368; 257/390; 257/617
(58) Field of Search ................. 257/66, 67, 314, 257/368, 390, 617

(56) References Cited

U.S. PATENT DOCUMENTS

| | | |
|---|---|---|
| 3,878,549 | 4/1975 | Yamazaki et al. |
| 4,047,974 | 9/1977 | Harari et al. |
| 4,173,791 | 11/1979 | Bell |
| 4,503,447 | 3/1985 | Iafrate et al. |
| 4,987,463 | 1/1991 | Goronkin et al. |
| 5,019,882 | 5/1991 | Solomon et al. |
| 5,420,055 | 5/1995 | Vu et al. |
| 6,104,056 * | 8/2000 | Yano et al. ............ 257/314 |

FOREIGN PATENT DOCUMENTS

| | | |
|---|---|---|
| 2149303 | 10/1971 | (DE) |
| A366146 | 10/1989 | (EP) |
| 1297899 | 4/1984 | (GB) |
| 52013782 | 2/1977 | (JP) |
| 59074680 | 4/1984 | (JP) |

OTHER PUBLICATIONS

Chang et al., "Nonvolatile Semiconductor Memory Devices", Proceedings of IEEE, vol. 64, No. 7, Jul. 1976.
Scott–Thomas et al., "Conductance Oscillations Periodic in Density of One–Dimensional Electronic Gas", American Physical Society, 1989.
Yamanaka et al., "A 5.9 $\mu m^2$ Super Low Power SRAM Cell Using a New Phase Shift Lithography", IEEE 1990.
*Electronics Letters*, Nakazato et al., "Single–Electron Memory", Feb. 18, 1993, vol. 29, No. 4, pp. 384–385.
Fang et al., "Characterizing a Single Hot–Electron–Induced Trap in Submicron MOSFET Using Random Telegraph Noise", 1990 Symposium on VLSI Technology, pp. 37–38.

* cited by examiner

*Primary Examiner*—Ngân V. Ngô
(74) *Attorney, Agent, or Firm*—Antonelli, Terry, Stout & Kraus, LLP

(57) ABSTRACT

A field-effect semiconductor element implemented with a reduced number of elements and a reduced area and capable of storing data by itself without need for cooling at a cryogenic temperature, and a memory device employing the same. Gate-channel capacitance is set so small that whether or not a trap captures one electron or hole can definitely and distinctively be detected in terms of changes of a current of the semiconductor FET element. By detecting a change in a threshold voltage of the semiconductor element brought about by trapping of electron or hole in the trap, data storage can be realized at a room temperature. In accordance with one embodiment, a carrier confinement region, isolated from a channel and a gate of the semiconductor FET element, is provided to operate as a storage node for trapping the carrier or carriers.

9 Claims, 35 Drawing Sheets

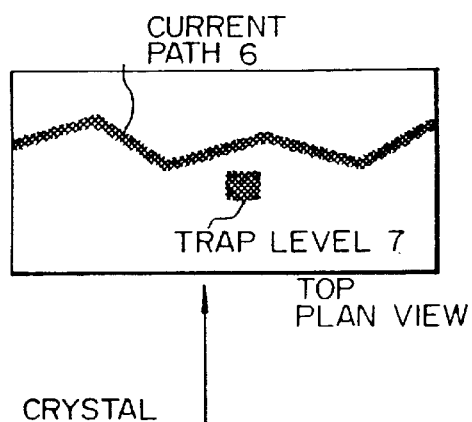
FIG. 1A
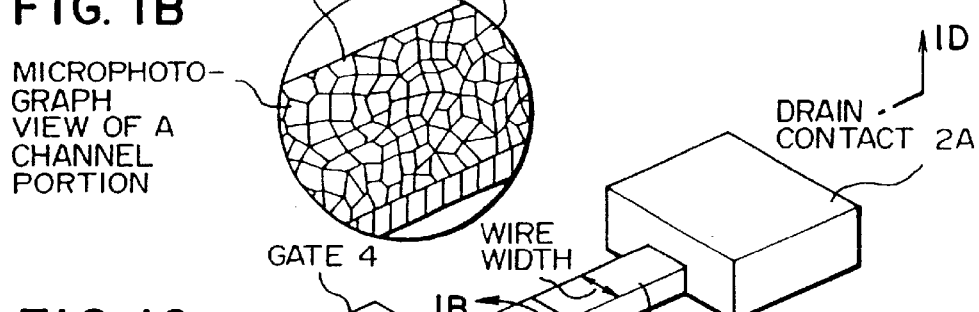
FIG. 1B
FIG. 1C
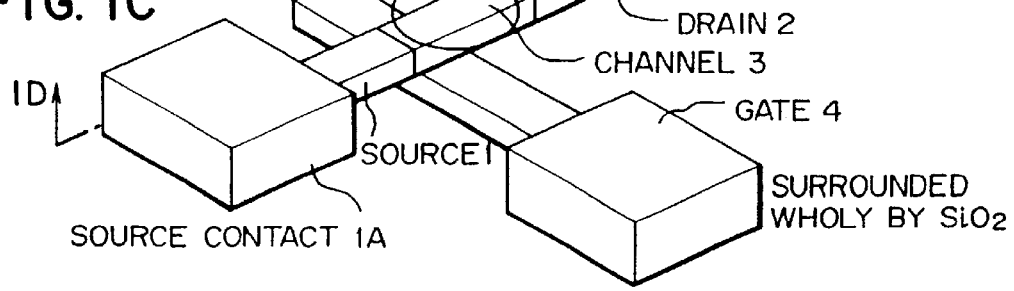
FIG. 1D
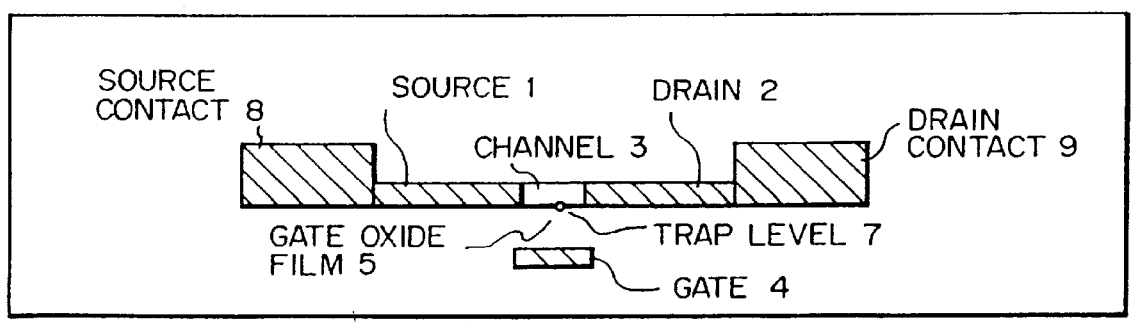

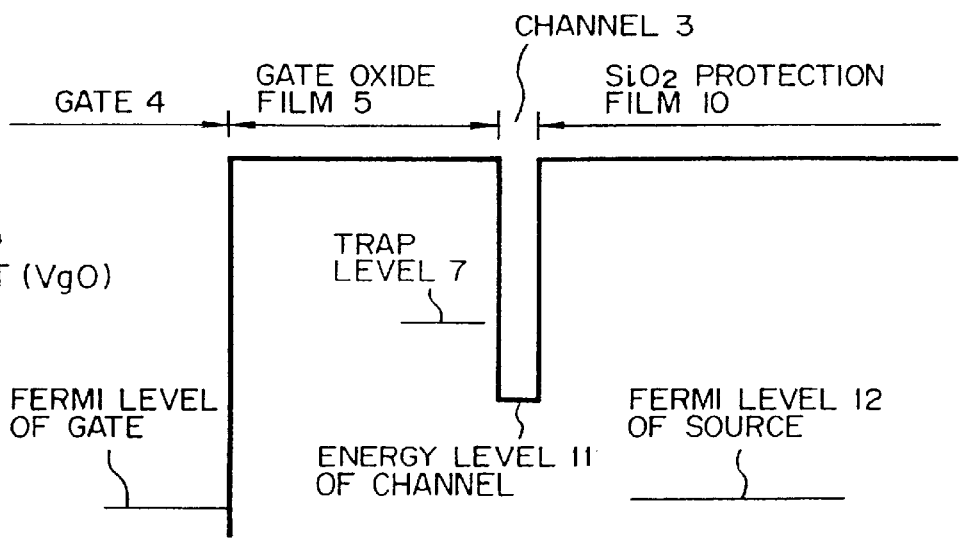
FIG. 4A Vgs = 0 VOLT (Vg0)
FIG. 4B 0 < Vgs < Vg1
FIG. 4C Vgs = Vg1

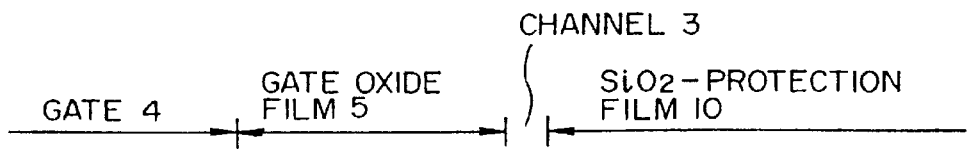
FIG. 5A
Vh < Vgs < Vg1
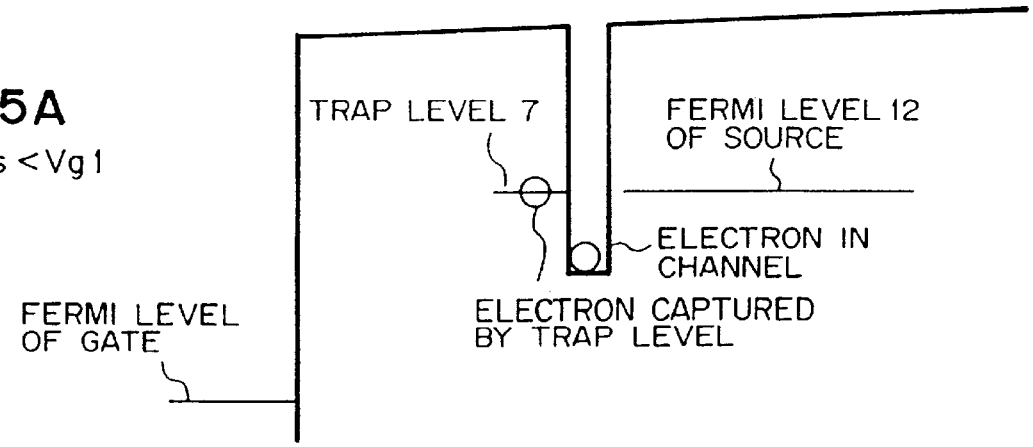
FIG. 5B
Vg0 < Vgs < Vh
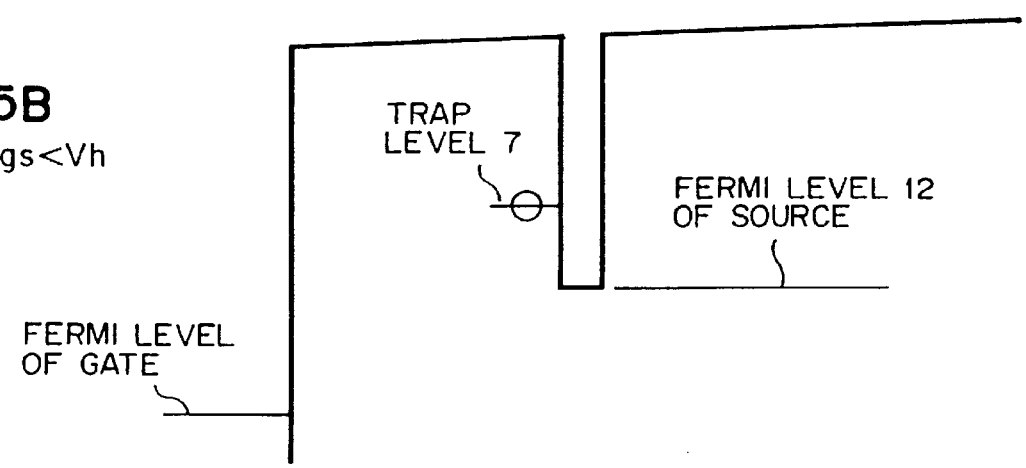
FIG. 5C
Vgs = 0 VOLT (Vg0)
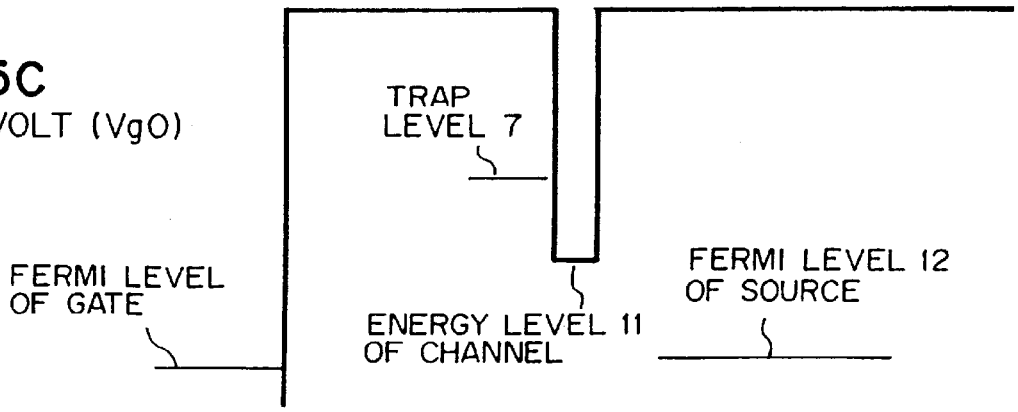

GATE-SOURCE VOLTAGE

PERSPECTIVE VIEW

HOLD OF "0"

WRITE

WRITE

POTENTIAL OF PRECEDING ELECTRON PREVENTS SUCCEEDING ONE FROM CAPTURE

HOLD OF "1"

ERASE

P = 0

|  |  | W | | D | |
| --- | --- | --- | --- | --- | --- |
|  |  | SELECT | NON-SELECT | SELECT | NON-SELECT |
| READ | 1 | Vr | 0 | Vr | — |
|  | 0 |  |  | Vr−Δ |  |
| WRITE | 1 | Vr | 0 | −Vr | 0 |
|  | 0 | −Vr | 0 | Vr | 0 |

P=Vr

|  |  | W | | D | |
|---|---|---|---|---|---|
|  |  | SELECTED | NON-SELECTED | SELECTED | NON-SELECTED |
| READ | 1 | Vr | O | O | - |
|  | 0 |  |  | △ |  |
| WRITE | 1 | Vp | O | Vc | O |
|  | 0 | Ve | O | Vp | O |

FIG. 25A
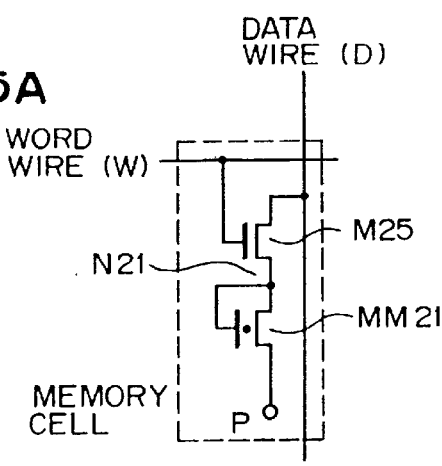
FIG. 25B
P=Vcc/2
|  |  | W | | D | |
|---|---|---|---|---|---|
|  |  | SELECTED | NON-SELECTED | SELECTED | NON-SELECTED |
| READ | 1 | Vcc+Vt | 0 | Vcc/2+Vr | Vcc/2 |
|  | 0 | Vcc+Vt | 0 | Vcc/2+Vr-△ | Vcc/2 |
| WRITE | 1 | Vcc+Vt | 0 | 0 | 0 |
|  | 0 | Vcc+Vt | 0 | Vcc | 0 |
FIG. 25C
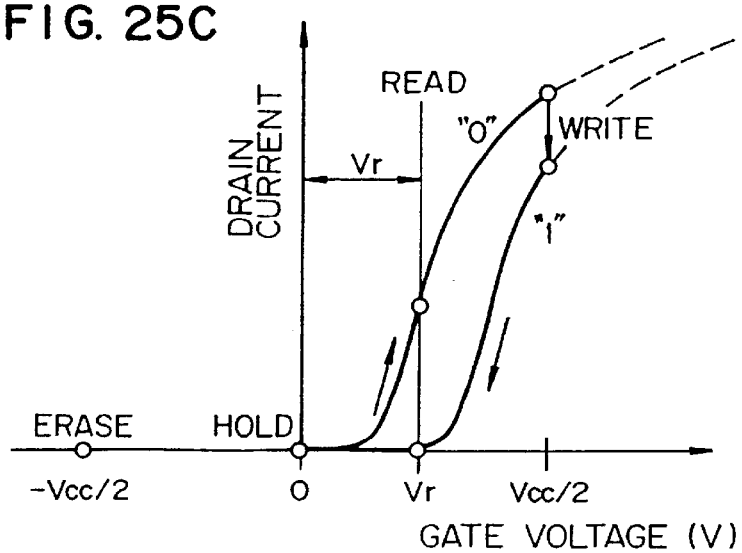

FIG. 29A
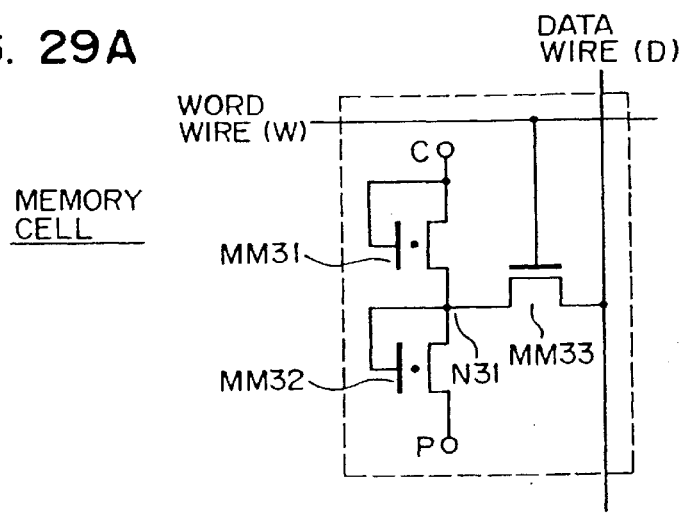
MEMORY CELL
FIG. 29B
C=Vcc  P=0
|  |  | W | | D | | C | |
|---|---|---|---|---|---|---|---|
|  |  | SELECTED | NON SELECTED | SELECTED | NON SELECTED | SELECTED | NON SELECTED |
| READ | 1 | Vcc | 0 | Vcc/2+Δ | 0 | Vcc | 0 |
|  | 0 |  |  | Vcc/2−Δ |  |  |  |
| WRITE | 1 | Vcc | Ve | Ve | 0 | Vcc | 0 |
|  | 0 | Vp | 0 | Vp | 0 | 0 | 0 |
FIG. 29C
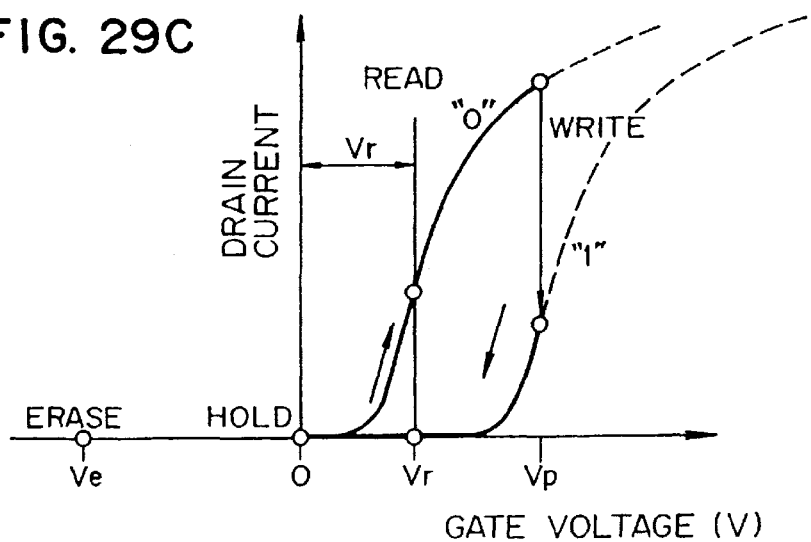

FIG. 31A
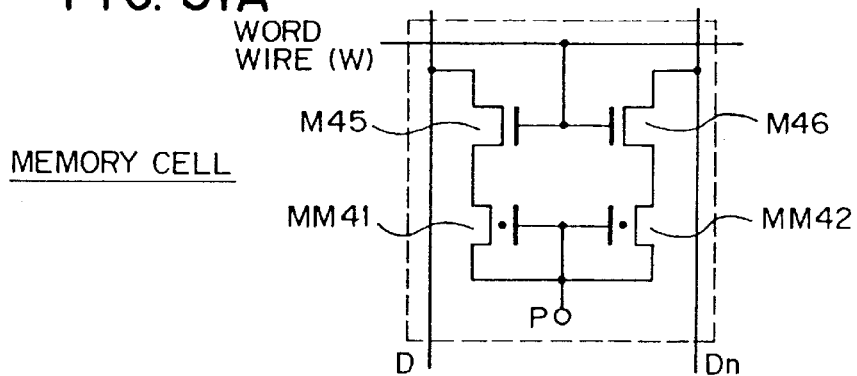
MEMORY CELL
FIG. 31B
P = 0
| | | W | | D | | Dn | |
|---|---|---|---|---|---|---|---|
| | | SELECTED | NON-SELECTED | SELECTED | NON-SELECTED | SELECTED | NON-SELECTED |
| READ | 1 | Vcc | 0 | Vcc | – | Vcc–Δ | – |
| | 0 | | | Vcc–Δ | | Vcc | |
| WRITE | 1 | Vp | Ve | Ve | 0 | Vp | 0 |
| | 0 | Vp | 0 | Vp | 0 | Ve | 0 |
FIG. 31C
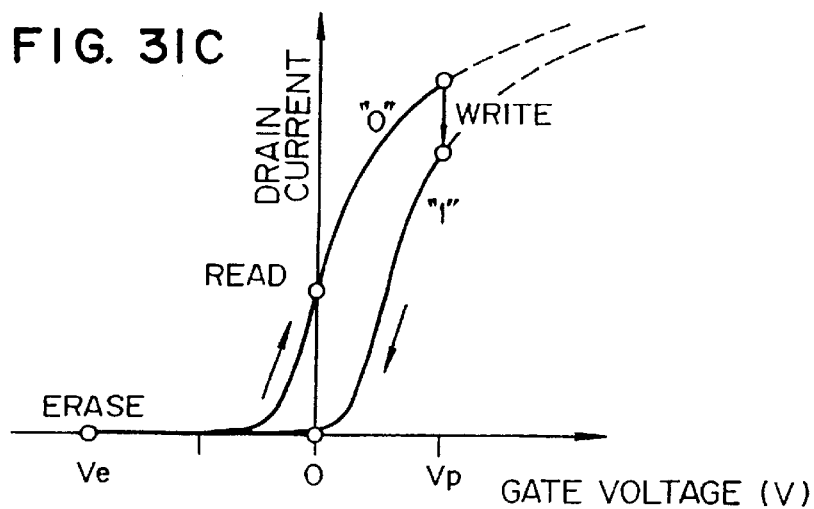

SEMICONDUCTOR ELEMENT AND SEMICONDUCTOR MEMORY DEVICE USING THE SAME

CROSS-REFERENCE TO RELATED APPLICATIONS

This application is a continuation of application Ser. No. 09/126,437, filed on Jul. 30, 1998 now U.S. Pat. No. 6,104,056, which is a continuation of application Ser. No. 08/778,260, filed on Jan. 8, 1997 now abandoned, which is a continuation of application Ser. No. 08/291,752, filed on Aug. 16, 1994 now U.S. Pat. No. 5,600,163, the entire disclosures of which are hereby incorporated by reference.

BACKGROUND OF THE INVENTION

The present invention relates to a semiconductor element suited for integration with a high density and a semiconductor memory device implemented by using the same.

Heretofore, polycrystalline silicon transistors have been used as elements for constituting a static random access memory device (referred to as SRAM in abbreviation). One of the relevant prior art techniques is described in T. Yamanaka et al: IEEE International Electron Device Meeting, pp. 477–480 (1990). By making the most of polycrystalline silicon transistors, integration density of the integrated circuit can be enhanced, the reason for which can be explained by the fact that the polycrystalline silicon transistor can be formed in stack or lamination atop a conventional bulk MOSFET (Metal-Oxide Semiconductor Field Effect Transistor) formed on a surface of a semiconductor substrate with an insulation film being interposed between the polycrystalline silicon transistor and the bulk MOSFET. In the SRAM, implementation of a memory cell for one bit requires four bulk MOSFETs and two polycrystalline silicon transistors. However, because the polycrystalline silicon transistors can be stacked atop the bulk MOSFETs, a single memory cell of the SRAM can be implemented with an area which substantially corresponds to that required for the bulk MOSFETS.

As another preceding technique related to the invention, there may be mentioned a single-electron memory described in K. Nakazato et al: Electronics Letters, Vol. 29, No. 4, pp. 384–385 (1993). It is reported that a memory could have been realized by controlling electron on a one-by-one basis. It is however noted that the operation temperature is as very low as on the order of 30 mK.

As a further prior art technique related to the invention, there may be mentioned one which is directed to the study of RTN (Random Telegraph Noise) of MOSFET, as is disclosed in F. Fang et al: 1990 Symposium on VLSI Technology, pp. 37–38 (1990). More specifically, when a drain current of a MOSFET is measured for a predetermined time under the constant-voltage condition, there makes appearance such phenomenon that state transition takes place at random between a high-current state and a low-current state. This phenomenon is referred to as the RTN, a cause for which can be explained by the capture or entrapping of a single electron in a level node existing at an interface between silicon (Si) and silicon oxide ($SiO_2$) and the release therefrom, whereby the drain current undergoes variations. However, the RTN remains only as a subject for a fundamental study concerning the current noise in the MOSFET, and any attempt or approach for positively making use of the RTN in practical applications has not been reported yet at all.

At present, the technology for processing a semiconductor integrated circuit with high fineness has developed up to such a level where any attempt for realization of higher fineness will encounter difficulty. Even if it is possible technologically, there will then arise a problem that intolerably high cost is involved due to the necessity for much sophisticated technique. Under the circumstances, a great demand exists for a fundamentally novel method of enhancing the integration density in the fabrication of semiconductor integrated circuits instead of relying on a method of implementing the semiconductor elements constituting the semiconductor integrated circuit simply by increasing the fineness thereof.

On the other hand, the polycrystalline silicon transistor known heretofore is basically equivalent to a variable resistor element in the respect that resistance between a source and a drain of the polycrystalline silicon transistor can be controlled by a gate voltage. Consequently, implementation of a memory cell of a SRAM requires as many as six semiconductor elements inclusive of the conventional MOSFETs formed in a silicon substrate.

By contrast, in the case of a DRAM (Dynamic Random Access Memory), information or data of one bit can be stored in a memory cell constituted by one MOSFET and one capacitor. For this reason, the DRAM enjoys reputation as a RAM device susceptible to implementation with the highest integration density. However, because the DRAM is based on such a scheme that electric charge is read out onto a data wire of which capacitance is non-negligible, the memory cell thereof is required to have capacitance on the order of several ten fF (femto-Farads), which thus provides a great obstacle to an attempt for further increasing fineness in implementation of the memory cells.

By the way, it is also known that a nonvolatile memory device such as a flash EEPROM (Electrically Erasable and Programmable Read-Only Memory) can be realized by employing MOSFETs each having a floating gate and a control gate. Further, as a semiconductor element for such a nonvolatile memory device, there is known MNOS (Metal Nitride Oxide Semiconductor) element. The MNOS is designed to store charge at interface between a $SiO_2$-film and a $Si_3N_4$-film instead of the floating gate of the flash EEPROM. Although the use of the MOSFET equipped with the floating gate or the MNOS element is certainly advantageous in that one-bit data can be held or stored by one transistor over an extended time span, a lot of time is required for the rewriting operation because a current to this end has to flow through the insulation film, whereby the number of times the rewriting operation can be performed is limited to about 100 millions, which in turn gives rise to a problem that limitation is imposed to the applications which the nonvolatile memory device can find.

On the other hand, the one-electron memory device discussed in the Nakazato et al's article mentioned hereinbefore can operate only at a temperature of cryogenic level, presenting thus a problem which is very difficult to cope with in practice. Besides, a cell of the single-electron memory is comprised of one capacitor and two active elements, which means that a number of the elements as required exceeds that of the conventional DRAM, to a further disadvantage.

As will be appreciated from the forgoing, there exists a great demand for a semiconductor element which requires no capacitance elements, differing from that for the DRAM and which can exhibit stored function by itself in order to implement a memory of higher integration density than the conventional one without resorting to the technique for implementing the memory with higher fineness.

SUMMARY OF THE INVENTION

In the light of the state of the art described above, it is an object of the present invention to provide an epoch-making semiconductor element which allows a semiconductor memory device to be implemented with a lesser number of semiconductor elements and a smaller area and which per se has data or information storing capability while requiring no cooling at a low temperature such as cryogenic level.

Another object of the present invention is to provide a semiconductor memory device which can be implemented by using the semiconductor elements mentioned above.

A further object of the invention is to provide a data processing apparatus which includes as a storage the semiconductor memory device mentioned above.

For achieving the above and other objects which will become apparent as description proceeds, it is taught according to a basic technical concept underlying the invention that capacitance between a gate and a channel of a semiconductor field-effect transistor element is set so small that capture of a single carrier (electron or hole) by a trap level can definitely and discriminately detected as a change in the current of the semiconductor field-effect transistor element. More specifically, correspondences are established between changes in a threshold value of the semiconductor field-effect transistor element as brought about by capture of a carrier in the trap and releasing therefrom and digital values of logic "1" and "0", to thereby impart to the semiconductor field-effect transistor element a function or capability for storing data or information even at a room temperature.

Thus, according to a first aspect of the present invention in its most general sense thereof, there is provided a semiconductor element which includes a source region constituting a source of the semiconductor element, a drain region constituting a drain of the semiconductor element, an effective channel region provided between the source region and the drain region for interconnection thereof, a gate electrode connected to the channel region through a gate insulation film interposed between the gate electrode and the channel region, and a level node formed between the source region and the drain region in the vicinity of a current path in the channel region for capturing at least one carrier, wherein effective capacitance (which will be elucidated later on) between the gate electrode and the effective channel region is set so small as to satisfy a condition given by the following inequality expression:

$$1/C_{gc} > kT/q^2$$

where $C_{gc}$ represents the effective capacitance, k represents Boltzmann's constant, T represents an operating temperature in degree Kelvin, and q represents charge of an electron (refer to FIGS. 1A–1D).

According to another aspect of the present invention, there is provided a semiconductor element which includes a source region and a drain region is connected to the source region through a channel region interposed therebetween, a gate electrode connected to the channel region through a gate insulation film interposed between the gate electrode and the channel region, at least one carrier confinement region formed in the vicinity of the channel region for confining a carrier, and a potential barrier existing between the carrier confinement region and the channel region, wherein effective capacitance between the gate electrode and the effective channel region is set so small as to satisfy a condition given by the following inequality expression:

$$1/C_{gc} > kT/q^2$$

where $C_{gc}$ represents the effective capacitance, k represents Boltzmann's constant, T represents an operating temperature in degree Kelvin, and q represents charge of an electron (refer to FIGS. 10A, 10B).

According to yet another aspect of the present invention, there is provided a semiconductor element which includes a source region constituting a source of the semiconductor element, a drain region constituting a drain of the semiconductor element, the source region being connected to the drain region through a channel region interposed therebetween, a gate electrode connected to the channel region through a gate insulation film interposed between the gate electrode and the channel region, at least one carrier confinement region formed in the vicinity of the channel region for confining a carrier, and a potential barrier existing between the carrier confinement region and the channel region, wherein a value of capacitance between the channel region and the carrier confinement region is set greater than capacitance between the gate electrode and the carrier confinement region, and wherein total capacitance existing around the carrier confinement region is so set as to satisfy a condition given by the following inequality expression:

$$q^2/2C_{tt} > kT$$

where $C_{tt}$ represents the total capacitance, k represents Boltzmann's constant, T represents an operating temperature in degree Kelvin, and q represents charge of an electron (refer to FIGS. 10A, 10B).

At this juncture, it is important to note that with the phrase "total capacitance ($C_{tt}$) means a total sum of capacitances existing between the carrier confinement region and all the other electrodes than the gate electrode.

In order to increase the number of times the semiconductor memory element can be rewritten, it is required to suppress to a possible minimum degradation of a barrier (insulation film) existing between the channel region and the carrier confinement region.

In view of the above, there is provided according to a further aspect of the invention a semiconductor element which includes a source region constituting a source of the semiconductor element, a drain region constituting a drain of the semiconductor element, the source region being connected to the drain region through a channel region interposed therebetween, a gate electrode connected to the channel region through a gate insulation film interposed between the gate electrode and the channel region, at least one carrier confinement region formed in the vicinity of the channel region for confining a carrier, the confinement region being surrounded by a potential barrier, storage of information being effectuated by holding a carrier in the carrier confinement region, and a thin film structure having a thickness not greater than 9 nm and formed of a semiconductor material in an insulation film intervening between the channel region and the carrier confinement region (refer to FIGS. 17A, 17B).

For better understanding of the present invention, the underlying principle or concept thereof will have to be elucidated in some detail.

In a typical mode for carrying out the invention, a polycrystalline silicon element (see e.g. FIGS. 1A–1D) is imparted with such characteristic that when potential difference between the gate and the source thereof is increased and decreased repetitively within a predetermined range with a drain-source voltage being held constant, conductance between the source and the drain exhibits a hysteresis even at a room temperature (see FIG. 2).

More specifically, referring to FIG. 2 of the accompanying drawings, when the gate-source voltage is swept vertically between a first voltage $V_{g0}$ (0 volt) and a second voltage $V_{g1}$ (50 volts), the drain current of the polycrystalline silicon element exhibits hysteresis characteristic. This phenomenon has not heretofore been known at all but discovered experimentally first by the inventors of the present application. The reason why such hysteresis characteristic can make appearance will be explained below.

FIG. 4A shows a band profile in a channel region of a semiconductor device shown in FIGS. 1A–1D in the state where the gate-source voltage $V_{gs}$ is zero volt. A drain current flows in the direction perpendicular to the plane of the drawing. For convenience of discussion, it is assumed in the following description that the drain-source voltage is sufficiently low when compared with the gate voltage, being however understood that the observation mentioned below applies equally valid even in the case where the drain-source voltage is high.

Now referring to FIG. 4A, there is formed in a channel (3) of polycrystalline silicon a potential well of low energy between a gate oxide film (5) and a peripheral $SiO_2$-protection film (10). In this case, energy level (11) of a conduction band in the channel region (3) which may be of p-type or of i-type (intrinsic semiconductor type) or n-type with a low impurity concentration is sufficiently high when compared with energy level of a conduction band in a n-type source region of a high impurity concentration or Fermi level (12) in a degenerate n-type source region of a high impurity concentration. As a consequence, there exist no electrons within the channel (3). Thus, no drain current can flow.

Further, a trap level (7) exists in the vicinity of the channel (3), which can capture or trap carriers such as electrons. As levels which partake in forming the trap level, there are conceivable a level extending to a grain or a level of group of grains (crystal grains in the channel regions of polycrystalline silicon) themselves which are surrounded by a high barrier, level internally of the grain, level at a Si—$SiO_2$ interface (i.e., interface between the channel region (3) and the gate oxide film (5)), level inside the gate oxide film (5) and others. However, it is of no concern which of these levels forms the trap level. Parenthetically, even after the experiments conducted by the inverters, it can not be ascertained at present by which of the aforementioned levels the carriers or electrons are trapped in actuality. Of the levels mentioned above, energy in the trap level (7) which plays a role in realizing the hysteresis characteristic mentioned above is sufficiently higher than the Fermi level (12) in the source region (1). Accordingly, no electrons exist in the trap level (7). At this juncture, it should be added that although the trap level is shown in FIGS. 4A–4C as existing within the gate oxide film, the trap level need not exist internally of the oxide film. It is only necessary that the trap level exists in the vicinity of the channel.

As the potential difference $V_{gs}$ between the gate (4) and the source (1) is increased from zero volt to the low threshold voltage $V_l$, potential in the channel region (3) increases. Consequently, as compared with the initial energy level of the channel region (3) in the state where the potential difference $V_{gs}$ is zero (refer to FIG. 4A), the potential of the channel region (3) for electrons becomes lower under the condition that the potential difference $V_{gs}$ is higher than zero volt and lower than the low threshold voltage $V_l$. When the gate source potential difference $V_{gs}$ has attained the low threshold voltage $V_l$, the Fermi level in the source region (1) approaches to the energy level in the conduction band of the channel region (3) (with a difference of about kT, where k represents Boltzmann's constant and T represents operating temperature in Kelvin). Consequently, electrons are introduced into the channel region (3) from the source. Thus, a current flow takes place between the drain and the source.

When the gate voltage is further increased, the number of electrons within the channel region (3) increases correspondingly. However, when the potential difference $V_{gs}$ has reached a capture voltage $V_{g1}$, energy of the trap level (7) approaches to the Fermi level (12), whereby at least one electron is entrapped or captured by the trap level (7) because of distribution of electrons under the influence of thermal energy of those electrons which are introduced from the source region (1). At that time, since the level of the trap (7) is sufficiently lower than potentials of the gate oxide (5) and peripheral $SiO_2$-protection film (10), the electron captured by the trap level (7) is inhibited from migration to the gate oxide film (5) and the peripheral $SiO_2$-protection film due to thermal energy of electron. Besides, because a grain boundary of high energy of the polycrystalline silicon channel region (3) exists in the vicinity of the trap level (7), for example, at the Si—$SiO_2$ interface, the electron captured by the trap level (7) can not move from the trap level (refer to FIG. 4C). However, since the other electrons can move, the drain current continues to flow.

In this way, once a single electron is entrapped or captured by the trap level (7), the threshold voltage of the polycrystalline silicon semiconductor element shown in FIGS. 1A—1D changes from the low threshold voltage $V_l$ to the high threshold voltage $V_h$, the reason for which will be explained below.

When the gate-source potential difference $V_{gs}$ is lowered from the state shown in FIG. 4C within the range of $V_h < V_{gs} < V_{g1}$, the number of electrons within the channel region (3) is decreased. However, in general, a high energy region exists in the periphery of the trap level (7). Accordingly, the electron captured by the trap level (7) remains as it is (refer to FIG. 5A).

When the gate voltage is further lowered to a value at which the potential difference $V_{gs}$ attains the high threshold voltage $V_h$, the Fermi level (12) of the source region (1) becomes different from the energy level of the conduction band of the channel (3) by ca. kT, as a result of which substantially all of the electrons within the channel disappear (see FIG. 5B). Consequently, the drain current can flow no more. However, the threshold voltage $V_h$ at which no drain current flow becomes higher than the low threshold voltage $V_l$ by a voltage corresponding to the charge of electron captured in the trap level (7).

Further, by lowering the gate-source potential difference $V_{gs}$ to a value where the potential difference $V_{gs}$ becomes equal to zero, potential in the peripheral high-energy region of the trap level (7) becomes lower in accompanying the lowering of the gate voltage, which results in that the electron captured by the trap level (7) is released to the region of low energy through tunneling under the effect of the electric field (refer to FIG. 5C).

Subsequently, the gate-source potential difference $V_{gs}$ is again increased for the vertical sweeping. By repeating this operation, hysteresis can be observed in the drain current-versus-gate voltage characteristic owing to trapping and release of the electron.

In this conjunction, the inventors have discovered that the hysteresis characteristic mentioned above appears only when the capacitance between the gate and the channel is small. Incidentally, the experiment conducted by the inventors shows that although a semiconductor element having a gate length and a gate width each of 0.1 micron can exhibit the aforementioned hysteresis characteristic, a semiconductor element whose gate length and gate width are on the order of 1 (one) micron is incapable of exhibiting such hysteresis characteristic.

Thus, it must be emphasized that smallness of the capacitance $C_{gc}$ between the gate electrode and the channel region is indispensable for the aforementioned hysteresis characteristic to make appearance, the reason for which may be explained as follows. There exists between an amount of charge $Q_s$ stored in the trap level and a change $\Delta V_t (=V_h-V_l)$ in the threshold value or voltage the following relation:

$$\Delta V_t = Q_s/C_{gc} \quad (1)$$

where $C_{gc}$ represents capacitance between the gate and an effective channel. With the phrase "effective channel", it is intended to mean a region of the channel which restrictively regulates magnitude of a current flowing therethrough and which corresponds to a region of highest potential energy in the current path. Thus, this region may also be termed a bottle-neck region. In order to make use of the aforementioned hysteresis characteristic as the memory function, it is necessary that the state in which the threshold value is high $(V_h)$ and the state where the threshold value is low $(V_l)$ can definitely and discriminatively be detected as a change in the drain current. In other words, difference between the threshold values $V_h$ and $V_l$ has to be clearly or definitely sensed in terms of a difference or change appearing in the drain current. The conditions to this end can be determined in the manner described below. In general, the drain current $I_d$ of a MOS transistor having a threshold value $V_t$ can be represented in the vicinity of the threshold value by the following expression:

$$I_d = A \cdot \exp[q(V_{gs}-V_t)/(kT)] \quad (2)$$

where A represents a proportional constant, q represents charge of an electron, $V_{gs}$ represents a gate-source voltage of the MOS transistor, $V_t$ represents the threshold voltage, k represents Boltzmann's constant and T represents an operating temperature in degree Kelvin. Thus, when $V_t=V_h$, the drain current is given by $$I_{dh} = A \cdot \exp[q(V_{gs}-V_h)/(kT)] \quad (3)$$

while when $V_t=V_l$, the drain current is given by $$I_{dl} = A \cdot \exp[q(V_{gs}-V_l)/(kT)] \quad (4)$$

Thus, ratio between the drain currents in the state where $V_t=V_h$ and the state $V_t=V_l$ can be determined as follows:

$$I_{dl}/I_{dh} = \exp[q(V_h-V_l)/(kT)] \quad (5)$$

Thus, it can be appreciated that in order to make it possible to discriminate the two states mentioned above from each other on the basis of the drain currents as sensed, it is necessary that the drain current ratio $I_{dl}/I^{dh}$ as given by the expression (5) is not smaller than the base e (2.7) of natural logarithm at minimum, and for the practical purpose, the current ratio of concern should preferably be greater than "10" (ten) inclusive. On the condition that the drain current ratio is not smaller than the base e of natural logarithm, the following expression holds true.

$$\Delta V_t(=V_h-V_l) > kT/q \quad (6)$$

Thus, from the expression (1), the following condition has to be satisfied.

$$Q_s'/C_{gc} > kT/q \quad (7)$$

In order that the capture of a single electron can meet the current sense condition mentioned above, it is then required that the following condition be satisfied.

$$q/C_{gc} > kT/q \quad (8)$$

From the above expression (8), it is apparent that in order to enable operation at a room temperature, the gate-channel capacitance $C_{gc}$ should not exceed 6 aF (where a is an abbreviation of "atto-" meaning $10^{-18}$). Incidentally, in the case of the semiconductor element having the gate length on the order of 1 micron, the gate-channel capacitance $C_{gc}$ will amount to about 1 fF (where f is an abbreviation of "femto-" meaning $10^{-15}$) and deviate considerably from the above-mentioned condition. By contrast, in the case of a semiconductor element fabricated by incarnating the teaching of the invention, the gate-channel capacitance $C_{gc}$ is as extremely small as on the order of 0.01 aF, and it has thus been ascertained that a shift in the threshold value which can be sensed is brought about by the capture of only a single even electron at a room temperature.

Further, in the course of the experiment, the inventors have found that by holding the gate-source potential difference $V_{gs}$ between zero volt and the voltage level $V_{g1}$, the immediately preceding threshold value can be held stably over one hour or more. FIG. 3 of the accompanying drawing shows the result of this experiment. More specifically, FIG. 3 illustrates changes in the drain current as measured under the condition indicated by a in FIG. 2 while holding the gate voltage to be constant. As can be seen in the figure, in the state of low threshold value, a high current level can be held, while in the state of high threshold value, a low current level can be held. Thus, by making use of the shift of the threshold value, it is possible to hold information or data, i.e., to store information or data, to say in another way. Further, by sensing the drain current in these states, it is possible to read out the data. Namely, the state in which the drain current is smaller than a reference value 13 may be read out as logic "1" data, while the state in which the drain current is greater than the reference value (13) may be read out as logic "0" (refer to FIG. 3).

On the other hand, data write operation can be effectuated by controlling the gate voltage. Now, description will be directed to the data write operation. It is assumed that in the initial state, the gate voltage is at the low level $V_{g0}$. By sweeping the gate voltage in the positive direction to the level $V_{g1}$ the threshold voltage at is set the high level $V_h$. With this operation, logic "1" of digital data can be written in the semiconductor element according to the invention. Subsequently, the gate voltage is swept in the negative direction to the zero volt level to thereby change the threshold voltage to the low level $V_l$. In this way, logic "0" of digital data can be written.

As will now be understood from the foregoing description, it is possible to write, hold and read the data or information only with a single semiconductor element. This means that a memory device can be implemented with a significantly smaller number of semiconductor elements per unit area when compared with the conventional memory device.

The semiconductor element according to the invention in which data storage is realized by capturing or entrapping only a few electrons in a storage node (which may also be referred to as the carrier confinement region or level node or carrier trap or carrier confinement trap, quantum confinement region or the like terms) can enjoy an advantage that no restriction is imposed on the number of times the data can be rewritten due to deterioration of the insulation film as encountered in a floating-gate MOSFET or restriction, if imposed, is relatively gentle.

It is however noted that in the case of the mode illustrated in FIGS. 1A–1D for carrying out the invention, relative positional relationship (i.e., relative distance) between the carrier trap level serving for the carrier confinement and the effective channel region serving as the current path is rather difficult to fix, involving non-ignorable dispersions of the threshold value change characteristic among the elements as fabricated.

As one of the measures for coping with the difficulty mentioned above, there is proposed another mode for carrying out the invention such as one illustrated in FIGS. 10A and 10B of the accompanying drawings in which the carrier confinement region (24) surrounded by a potential barrier is provided independently in the vicinity of a channel region (21). With this structure, the dispersion mentioned above can be reduced.

From the stand point of performance stability of the semiconductor element, it is preferred that dispersion of the voltage difference $\Delta V_t$ between the high threshold voltage $V_h$ and the low threshold voltage $V_l$ among the semiconductor elements as fabricated should be suppressed to a possible minimum.

Certainly, the condition given by the expression (1) can apply valid when the capacitance $C_{gt}$ between the gate region and the carrier confinement region as well as the capacitance C between the carrier confinement region and the channel region is sufficiently small. In the other cases than the above, the condition given by the following expression applies valid:

$$\Delta V_t = q/(1+C_{gt}/C)C_{gc} \quad (9)$$

where $C_{gc}$ represents capacitance between the gate region (22) and the channel region (21), $C_{gt}$ represents capacitance between the carrier confinement region (24) and the channel (21).

In conjunction with the mode shown in FIGS. 1A–1D for carrying out the invention, the inventors have found that the term C representing the capacitance between the carrier confinement region and the channel region in the expression (9) is most susceptible to the dispersion because the carrier confinement region is so implemented as to assume the carrier trap level. In order that the potential difference $\Delta V_t$ mentioned above scarcely undergoes variation notwithstanding of variation in the capacitance C between the carrier confinement region and the channel region, the capacitance $C_{gt}$ between the gate electrode and the channel region must be sufficiently smaller than the capacitance C (i.e., $C_{gt}<C$).

Thus, according to another preferred mode for carrying out the invention, it is proposed to set at a small value the capacitance $C_{gt}$ between the gate electrode (22) and the carrier confinement region (24) by interposing a gate insulation film (23) of a great thickness while setting at a large value the capacitance C between the carrier confinement region (24) and the channel region (21) by interposing therebetween an insulation film (25) of a small thickness.

On the other hand, in conjunction with the holding of data in the carrier confinement region (24), it is necessary to ensure stability against thermal fluctuations. At this juncture, let's represent by $C_{tt}$ the total capacitance existing between the carrier confinement region and all the other regions. In general, in the absolute temperature (T) system, energy fluctuation on the order of kT (where k represents Boltzmann's constant and T represents temperature in degree Kelvin) will be unavoidable. Accordingly, in order to hold the data stably, it is required that change of energy given by $q^2/2\ C_{tt}$ as brought about by capturing a single electron is greater than the fluctuation mentioned above. To say in another way, the condition given by the following expression will have to be satisfied.

$$q^2/2\ C_{tt} > kT \quad (10)$$

This condition requires that the total capacitance $C_{tt}$ defined above has to be smaller than 3 aF inclusive in order to permit operation at a room temperature.

In still another mode for carrying out the invention as illustrated in FIGS. 17A and 17B of the accompanying drawings, a thin semiconductor film structure (48) is formed interiorly of an insulation film (49, 50) which is interposed between the storage region (47) and the channel region (46) with a view to reducing deterioration of the insulation film (49, 50).

Thus, in the semiconductor element implemented in accordance with the instant mode for carrying out the invention, a potential barrier provided by the thin film structure (48) is formed interiorly of the insulation film (49, 50) so that the thin film structure (48) plays effectively a same role as the insulation film, while making it possible to decrease the thickness of the insulation film in practical applications.

As can be seen in FIGS. 17A and 17B, the semiconductor thin film (48) provided internally of the insulation film (49, 50) has an energy level shifted by the conduction band under the effect of the quantum confinement effect in the direction thickness wise of the semiconductor thin film and serves essentially as a potential barrier between the storage region and a carrier supply region for the write/erase operations, the reason of which will be elucidated below.

Representing the film thickness of the semiconductor thin film by L, effective mass of the carrier in the thin film by n and Planck's constant by h, energy in the lowest energy state in quantum fluctuation of the carrier due to the confinement effect in the thickness wise direction can appropriately be given by the following expression:

$$h^2/8\ mL^2 \quad (11)$$

In order that the energy shift due to the quantum confinement effect is made effective in consideration of the thermal energy fluctuation, the condition given by the following inequality expression (12) is required to be satisfied.

$$h^2/8\ mL^2 > kT \quad (12)$$

In the light of the above expression (12), the thickness of the semiconductor thin film (48) formed of silicon (Si) will have to be smaller than 9 nm inclusive in order that the barrier is effective at a room temperature.

Thus, although there is a probability of the carrier existing in the semiconductor thin film for a short time upon moving of the carriers between the channel region (46) and the carrier confinement region (47) via the insulation film (49, 50), the probability of the carriers staying in the semiconductor thin film (48) for a long time is extremely low. As a result of this, the semiconductor thin film (48) operates as a temporary passage for the carriers upon migration thereof between the channel region (46) and the carrier confinement region (47), which means that the semiconductor thin film (48) will eventually serve as the potential barrier because of incapability of the carrier confining operation.

With the structure described above, the semiconductor element can exhibit the barrier effect with the insulation film of a smaller thickness when compared with the semiconductor element in which the above structure is not adopted. Thus, film fatigue of the insulation film (49, 50) can be suppressed. For further mitigating the film fatigue, the semiconductor thin film (48) may be formed in a multi-layer structure.

The structure in which the semiconductor thin film is provided in the insulation film can enjoy a further advantage that the height of the potential barrier between the carrier confinement region and the source region can properly be set. Since the energy shift due to the quantum confinement is determined in accordance with the size L of the carrier confinement region, it is possible to adjust the height of the barrier by adjusting the film thickness in addition to the selection of the thin film material. In this connection, it should be noted that in the semiconductor element of the structure known heretofore, the height of the barrier is determined only on the basis of the material constituting the insulation film.

The above other objects, features and attendant advantages of the present invention will more clearly be understood by reading the following description of the preferred embodiments thereof taken, only by way of example, in conjunction with the drawings.

BRIEF DESCRIPTION OF THE DRAWINGS

FIGS. 1A to 1D are views for illustrating a structure of a memory element according to a first embodiment of the invention, wherein FIG. 1A is a top plan view, FIG. 1B is microphotographic view of a channel portion of the same FIG. 1C is a schematic perspective view illustrating an overall structure of the memory element, and FIG. 1D is a sectional view of the same taken along a line C–C' in FIG. 1C;

FIGS. 4A to 4C are views for illustrating changes of a band profile in the vicinity of a channel region of the semiconductor element according to the first embodiment of the invention when gate voltage is increased;

FIGS. 5A to 5C are views for illustrating changes of a band profile in the vicinity of a channel region of the semiconductor element according to the first embodiment of the invention when gate voltage is lowered;

FIGS. 11A and 11B are enlarged views showing exaggeratedly a channel region, a carrier confinement region and a gate electrode of the memory element according to the second embodiment of the invention, wherein FIG. 11A is a perspective view and FIG. 11B is a sectional view;

FIGS. 16A to 16C are views showing a structure of a semiconductor memory element according to a fourth embodiment of the invention, wherein FIG. 16A is a sectional view, FIG. 16B shows a section taken along a line a–a' in FIG. 16A and FIG. 16C is a top plan view;

FIGS. 17A and 17B are views for illustrating a semiconductor memory element according to a fifth embodiment of the present invention wherein FIG. 17A is a sectional view of the same and FIG. 17B shows a potential distribution profile in the memory element;

FIGS. 18A, 18B and 18C are views for illustrating a memory cell according to a sixth embodiment of the invention, wherein FIG. 18A shows a circuit configuration of the memory cell, FIG. 18B shows voltages applied to a word wire and a data wire of the memory cell upon read and write operations, respectively, and FIG. 18C is a view for graphically illustrating dependency of a drain current on a gate-source voltage of a semiconductor element employed in the memory cell;

FIGS. 22A to 22C are views showing a memory cell set according to a seventh embodiment of the invention, wherein FIG. 22A shows a circuit configuration of the cell set, FIG. 22B shows voltages applied to a memory element thereof upon write and read operations, and FIG. 22C graphically illustrates characteristic of the memory element;

FIGS. 25A to 25C are views for illustrating a memory cell according to an eighth embodiment of the invention, wherein FIG. 25A shows a circuit configuration of the memory cell, FIG. 25B shows voltages applied to a word wire and a data wire of the memory cell upon read and write operations, respectively, and FIG. 25C is a view for graphically illustrating dependency of a drain current on a gate-source voltage of a semiconductor element employed in the memory cell;

FIGS. 29A to 29C are views for illustrating a memory cell according to a ninth embodiment of the invention, wherein FIG. 29A shows a circuit configuration of the memory cell, FIG. 29B shows voltages applied to a word wire and a data wire of the memory cell upon read and write operations, respectively, and FIG. 29C is a view for graphically illustrating dependency of a drain current on a gate-source voltage of a semiconductor element employed in the memory cell;

FIGS. 31A, 31B and 31C are views for illustrating a memory cell according to a tenth embodiment of the invention, wherein FIG. 31A shows a circuit configuration of the memory cell, FIG. 31B shows voltages applied to a word wire and a data wire of the memory cell upon read and write operations, respectively, and FIG. 31C is a view for graphically illustrating dependency of a drain current on a gate-source voltage of a semiconductor element employed in the memory cell;

DESCRIPTION OF THE PREFERRED EMBODIMENTS

Figure 2:
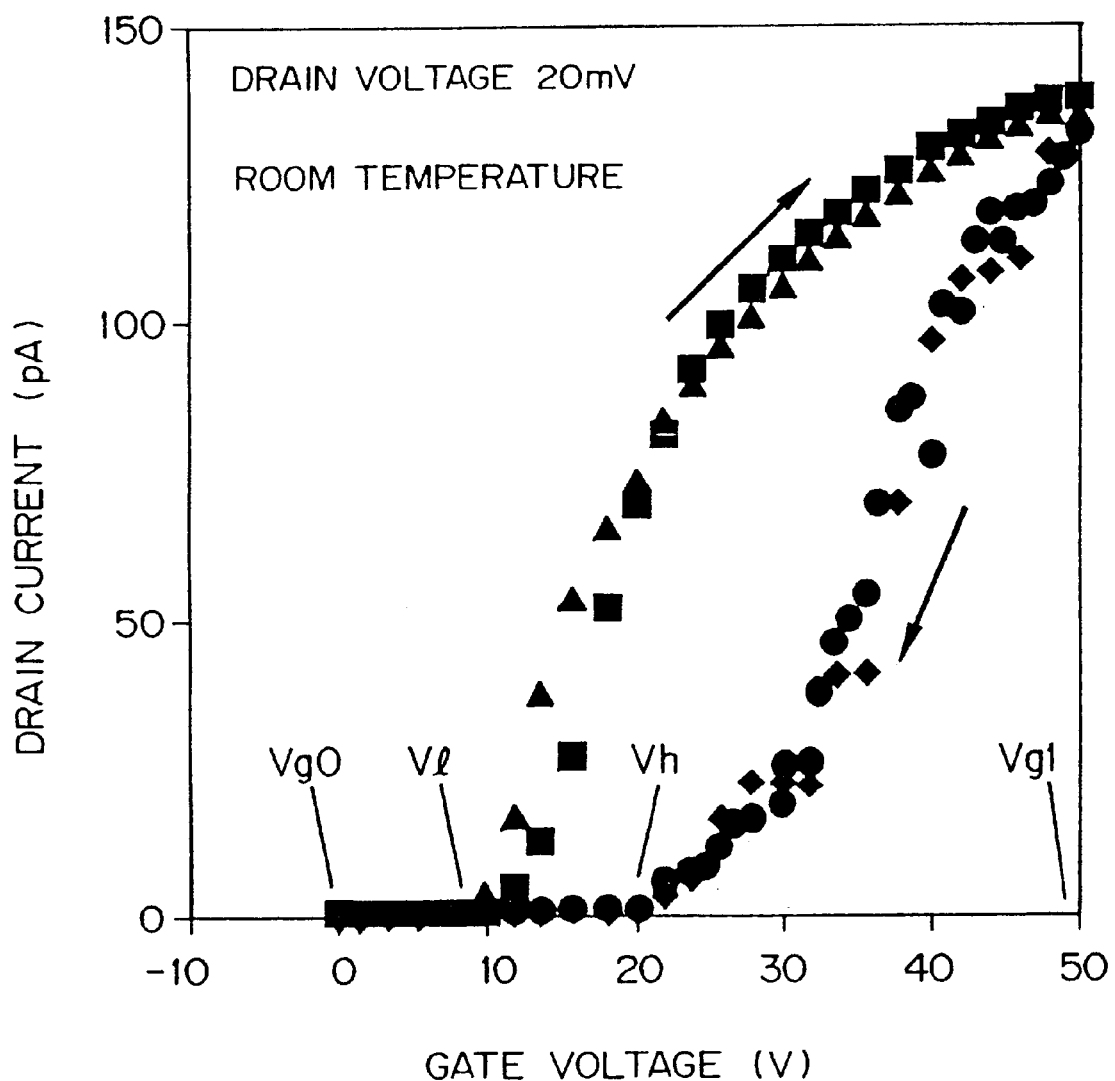
FIG. 2 is a view showing graphically measured values representing a gate-source voltage dependency of a drain current of the memory element according to the first embodiment of the invention.
Figure 3:
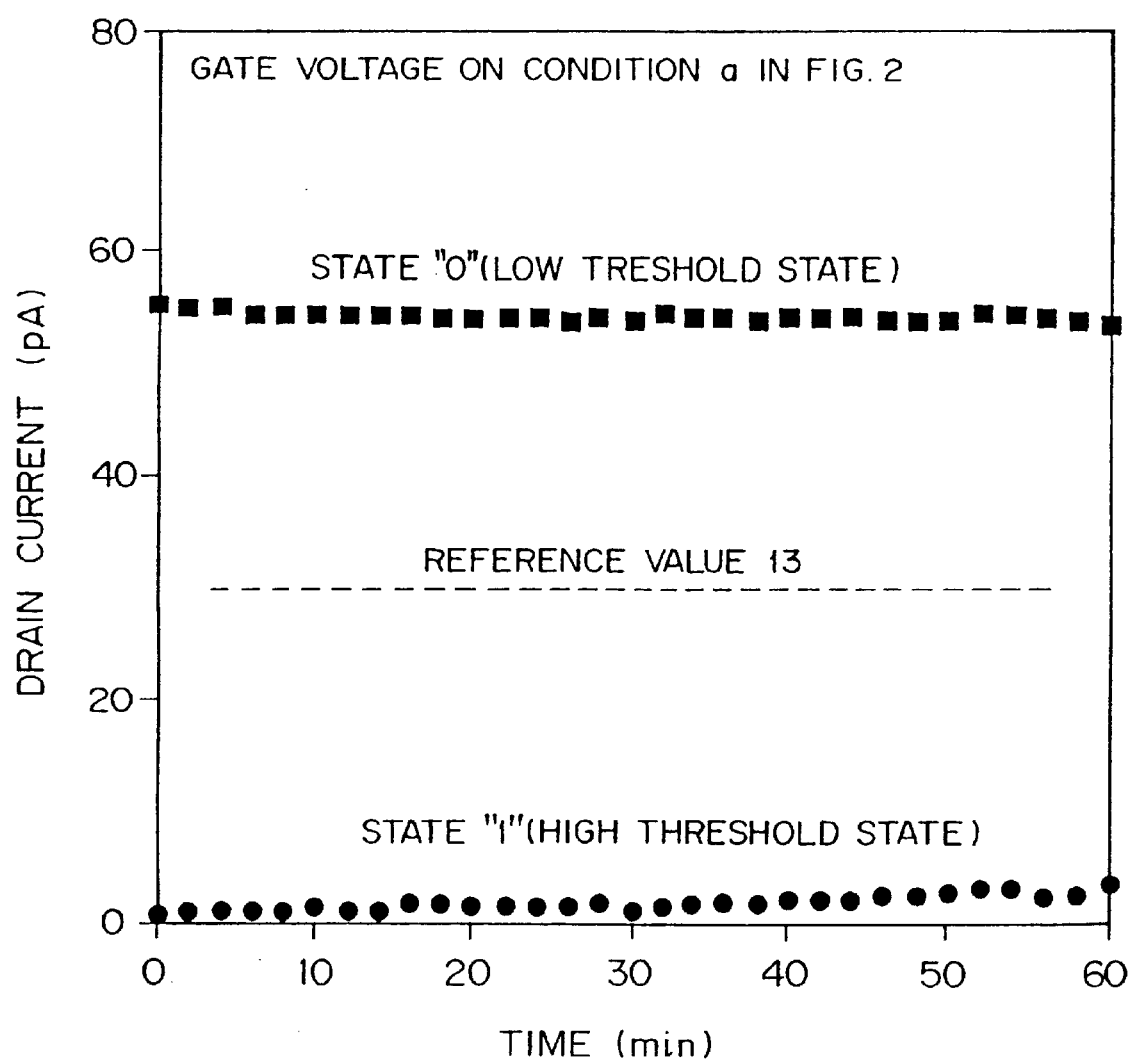
FIG. 3 is a view showing experimentally obtained results for illustrating holding of data by the semiconductor element according to the first embodiment after writing of logic "1" and "0"

Now, the present invention will be described in detail in conjunction with the preferred or exemplary embodiments thereof by reference to the drawings.

Embodiment 1

Description which follows is directed to a field effect semiconductor memory element (FET memory element) according to an exemplary embodiment of the present invention. FIGS. 1A to 1D are views for illustrating a structure of a semiconductor memory element according to a first embodiment of the invention, wherein FIG. 1C is a schematic perspective view illustrating an overall structure of the memory element, FIG. 1D is a sectional view of the same taken along the line C–C' in FIG. 1C, FIG. 1B is an enlarged microphotographic view showing a channel portion of the same, and FIG. 1A is a top plan view thereof. Referring to the figures, a source 1 and a drain 2 are each constituted by a region formed of n-type polycrystalline silicon and having a high impurity concentration while a channel portion 3 is constituted by a region formed of a non-doped polycrystalline silicon region. Each of the source 1, the drain 2 and the channel 3 is realized in the form of a thin and fine wire of polycrystalline silicon. In the case of a memory device manufactured actually by the inventors of the present application, the channel 3 is 0.1 $\mu$m in width and 10 nm, preferably 3.4 nm in thickness. Connected to the ends of the source 1 and the drain 2 are contacts 1A and 2A of polycrystalline silicon, respectively, each of which has a thickness greater than that of the source 1 and the drain 2, wherein the source 1 and the drain 2 are connected to metallic wiring conductors via the polycrystalline silicon contacts 1A and 2A, respectively. In the case of a typical example of the memory element, each of the polycrystalline silicon contacts 1A and 2A should preferably be implemented with a thickness of 0.1 $\mu$m which is ten times as large as that of the channel 3, because, if otherwise, polycrystalline silicon itself becomes insusceptible to etching upon forming contact holes directly in thin polycrystalline silicon. A gate electrode 4 is provided in such orientation as to intersect the channel region 3 through an interposed gate insulation film 5. In the case of the instant embodiment, the film thickness of the gate electrode 4 is 0.1 $\mu$m. The structure mentioned above can best be seen from FIG. 1C.

Parenthetically, the polycrystalline silicon film constituting the channel region 3 is wholly enclosed by a $SiO_2$-protection film 10 in the case of the instant embodiment (see FIG. 1D). Because the dielectric constant of silicon oxide ($SiO_2$) is about one third of that of silicon, capacitances of the channel region 3 and the gate electrode 4 can be reduced by enclosing them with the $SiO_2$-protection film 10 as mentioned above. This is one of the reasons why the hysteresis characteristic elucidated hereinbefore can be realized at a room temperature.

In the case of the memory element according to the instant embodiment, the channel of polycrystalline silicon is formed by depositing amorphous silicon (a-Si) in a thickness of 10 nm on a $SiO_2$-substrate and crystallizing by heat treatment at a temperature of 750° C. In this conjunction, it has been found that the thickness of amorphous silicon (a-Si) should preferably be in the order of 3.5 nm. A structure of a channel portion is shown in FIG. 1B. In the course of the heat treatment, silicon crystal grains in amorphous silicon grow progressively. However, when the size of the grain reaches the film thickness, any further growth in the direction perpendicular to the plane of the film is prevented. At the same time, the rate of the grain growth in the direction parallel to the film becomes retarded. As a consequence, the grain size in the lateral direction (i.e., in the direction parallel to the film surface) is substantially equal to the film thickness. For these reasons, the field-effect semiconductor memory element according to the instant embodiment of the invention features that the grain size of polycrystalline silicon forming the channel region is extremely small.

The small grain size mentioned above contributes to realization of small capacitance between the gate electrode and the channel region, the reason for which will be elucidated below. In the field effect element now under consideration, it is only a few current paths 6 having lowest resistance in the channel region 3 that a current can actually flow within a low-current range close to a threshold level (see FIG. 1A). To say in more concrete, the current flow takes place due to migration or transfer of electrons from one to another crystals grain. In the case of the instant embodiment, the current path is extremely fine or thin because of a very small grain size as mentioned above. Consequently, the region in which electrons exists is remarkably small when compared with whole the channel region. For this reason, the capacitance $C_{gc}$ which is effective between the gate electrode and the effective channel portion (in the sense defined hereinbefore) is significantly small.

In the case of a semiconductor memory element actually fabricated according to the instant embodiment, the gate-channel capacitance $C_{gc}$ mentioned above was set at an extremely small value, e.g. 0.02 aF (atto-Farad), with a view to observing the effect of change in the threshold value to a possible maximum extent. As a result of this, the range of voltages required for operation expanded to several ten volts. Of course, by setting the gate-channel capacitance $C_{gc}$ at a greater value, e.g. 0.2 aF, the operation voltage range can be set to a range of several volts usually employed in the conventional integrated circuit. To this end, the thickness of the gate insulation film 5 may be decreased and/or the length or width of the gate electrode may be increased, which can be realized without any appreciable technical difficulty.

In the case of the instant embodiment of the invention, the channel is formed of polycrystalline silicon. At this juncture, it should however be mentioned that the hysteresis characteristic can be realized even in a conventional bulk MOSFET formed in a crystal silicon substrate if the gate-channel capacitance mentioned above can be made so small that the conditions mentioned previously can be satisfied. In that case, the bulk MOSFET can be made use of as a memory element. In this conjunction, it is however noted that in the case of a bulk MOSFET, the effects of the grain mentioned above are absent. Besides, the lower side of the bulk MOSFET is covered with a Si-film having a high dielectric constant. Consequently, it is necessary to decrease the size of the bulk MOSFET element when compared with the element having the channel formed of polycrystalline silicon. This in turn means that difficulty will be aggravated in manufacturing the bulk MOSFET memory element. However, because the bulk MOSFET has a greater mobility of carriers, it can handle a large current and is suited for a high-speed operation, to an advantage. As a further version, the hysteresis characteristic mentioned previously can be realized by using a MOSFET of SOI (Silicon-On-Insulator) structure as well. The SOI structure can be implemented by growing monocrystalline silicon on an insulation film and by forming a MOSFET therein. Because the gate channel capacitance of the SOI MOSFET can be made smaller than that of the bulk MOSFET, the hysteresis characteristic can be realized with a greater size when compared With the bulk MOSFET.

The foregoing description has been made on the assumption that the channel for migration of electrons is of n-type. It should however be mentioned that similar operation can be accomplished by using holes. Further, other semiconductor material than silicon can be employed in forming the channel region.

Additionally, it has been assumed in the foregoing description that the gate electrode 4 is located beneath the channel region 3. However, similar operation can be effectuated equally with such structure in which the gate electrode lies above the channel region. Besides, gate electrodes may be provided above and beneath the channel, respectively, for realizing similar operation and effects as those mentioned previously. Furthermore, the gate electrode may be disposed at a side laterally of the channel region. Moreover, gate electrodes may be provided at both sides of the channel, respectively.

Figure 6:
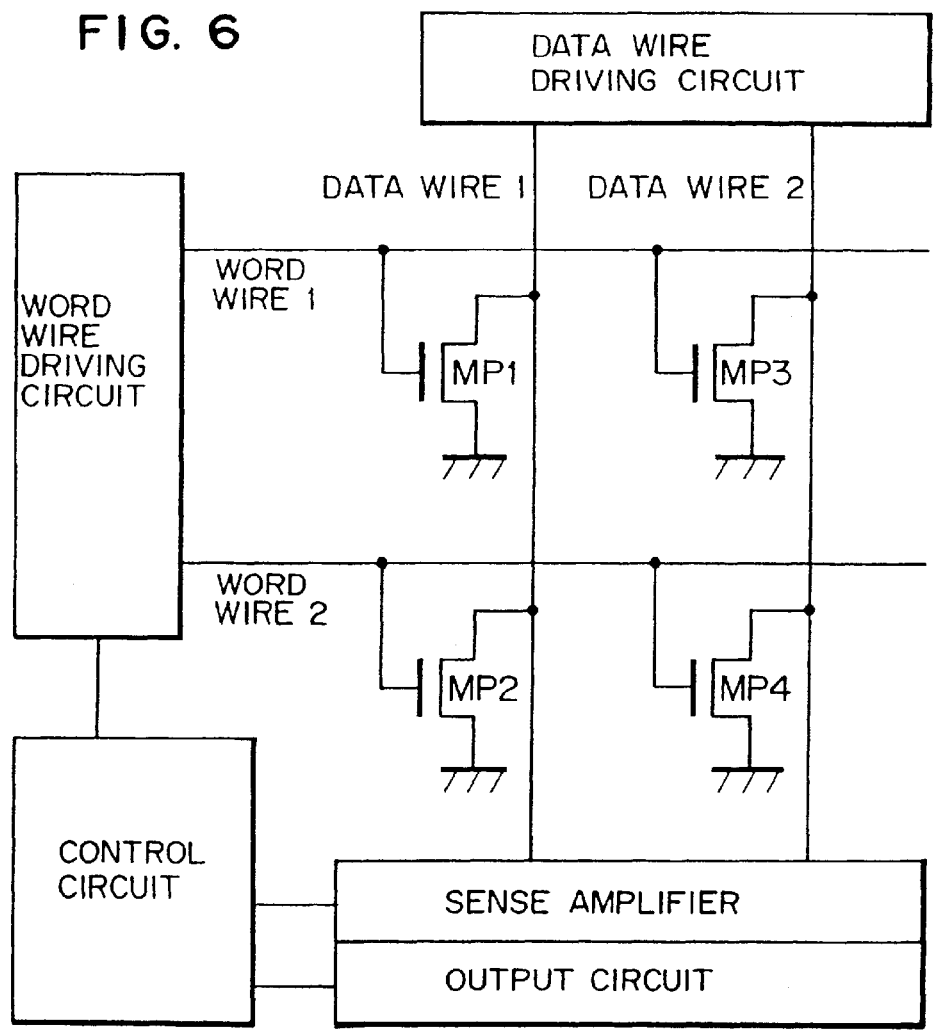
FIG. 6 is a schematic circuit diagram showing a structure of a memory IC device according to the invention in which the memory elements each having the structure shown in FIG. 1 are employed.
Figure 7:
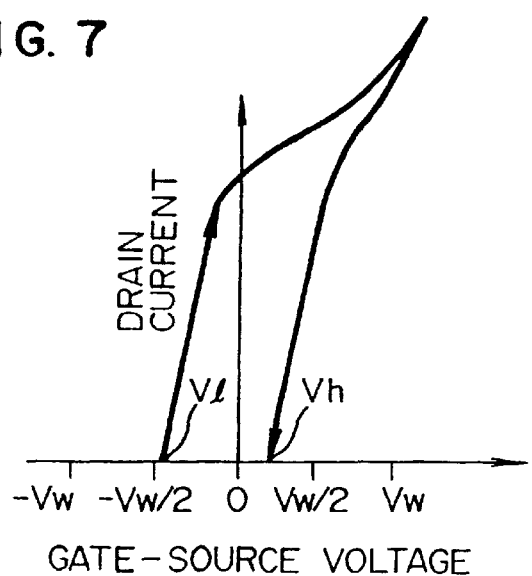
FIG. 7 shows a hysteresis characteristic expected to be exhibited by the memory device shown in FIG. 6.

Now, referring to FIG. 6, description will be made of an integrated memory circuit which is comprised of the semiconductor elements of the structure described above. FIG. 6 shows a structure of a memory IC device in which polycrystalline silicon memory elements each having the structure shown in FIG. 1 are employed. In this conjunction, it is assumed that each of the semiconductor elements or the polycrystalline silicon memory elements has such hysteresis characteristic as illustrated in FIG. 7. More specifically, it is presumed that when a voltage $V_w$ is applied between the gate and the source, the memory element takes on logic "1" state (state of high threshold value represented by $V_h$) while upon application of a voltage of $-V_w$ between the gate and the source, the memory element assumes logic "0" state (low threshold state $V_l$). On the other hand, application of a voltage in a range of $-V_w/2$ to $V_w/2$ between the gate and the source or between the gate and the drain, the threshold voltage undergoes no change. The characteristic illustrated in FIG. 7 is comparable to that shown in FIG. 2 except that the threshold value is lowered as a whole and can be realized by introducing a donor impurity in the channel region of the memory element upon manufacturing thereof.

Referring to FIG. 6, each of semiconductor memory elements MP1 to MP4 is constituted by a semiconductor element according to the invention which has the structure shown in FIG. 1 and the hysteresis characteristic illustrated in FIG. 7. Each of the semiconductor memory elements has a gate terminal connected to a word wire, a drain terminal connected to a data wire and a source terminal connected to the ground potential.

Operation for writing digital data in the integrated memory circuit is performed through cooperation of a word wire driver circuit and a data wire driver circuit shown in FIG. 6 in a manner described below. For writing logic "1" in the memory element MP1, the potential on the word wire 1 is set to a voltage level of $V_w/2$ with the potential of the data wire 1 being set to $-V_w/2$, while the other word wires and data wires are set to zero volt. As a result of this, a voltage of $V_w$ is applied between the gate and the drain of the memory element MP1, which thus takes on the logic "1" state (high threshold state). At this time point, all the other memory elements than the memory element MP1 are applied with a voltage not higher than $V_w/2$. Accordingly, no change takes place in the threshold voltage in these other memory elements. On the other hand, for writing logic "0" in the memory element MP1, the potential on the word wire 1 is set to $-V_w/2$ with the potential on the data wire 1 being set to $V_w/2$. Thus, the voltage of $-V_w$ is applied between the gate and the drain of the memory element MP1, whereby the memory element MP1 is set to logic "0" state (low threshold state $V_l$). At this time point, all the other memory elements than the memory element MP1 are applied with a voltage which is not higher than $-V_w/2$. Accordingly, no change can take place in the threshold value in these other memory elements.

On the other hand, reading of information or data is carried out in a manner described below (see FIG. 6). In the data wire driver circuit, the data wire is connected to a voltage source via a load element. On the other hand, the other end of the data wire is connected to a sense amplifier. Now, operations involved in reading out data from the memory element MP1 will be considered. To this end, the potential of the word wire 1 as selected is set to the level of zero volt while the potential on the other word wire 2 not selected is set to the voltage level of $-V_w/2$. When the memory element MP1 is in the logic "1" state, this means that the memory element MP1 is in the off-state (i.e., non-conducting state) with the data wire remaining in the logically high state. Even when the memory element MP2 is in the logical "0" state, no current can flow through the memory element MP1 because the word wire not select is at the potential level of $-V_w/2$. When the memory element MP1 is in the logic "0" state, a current flows from the data wire 1 to the grounded wire via the memory element MP1, resulting in lowering of the potential at the data wire 1. This potential drop is amplified by the sense amplifier, whereupon the data read-out operation comes to an end. The memory device can be implemented in this manner.

Figure 8:
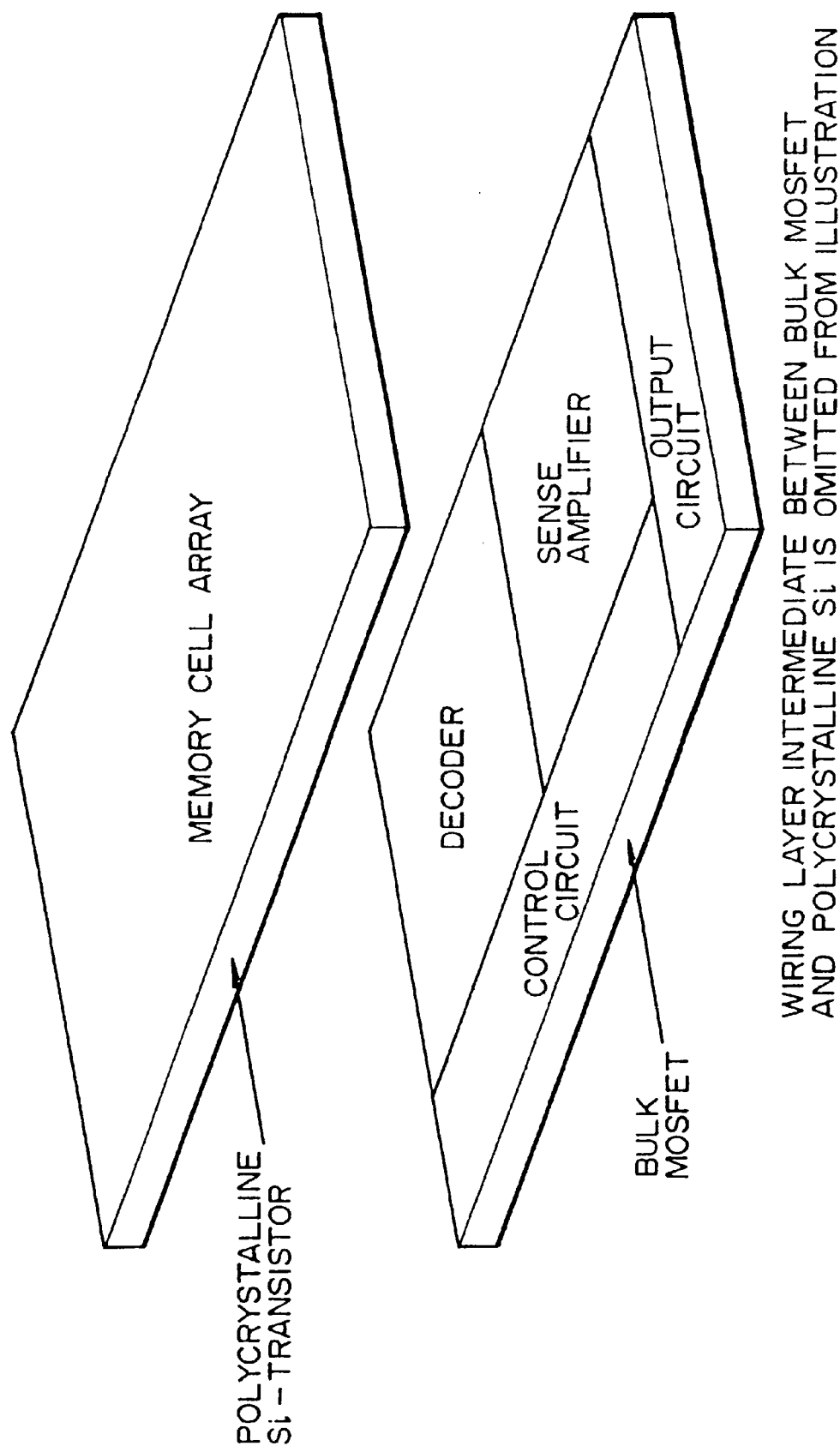
FIG. 8 is an exploded perspective view showing schematically a structure of a semiconductor memory device according to the first embodiment of the invention in which a memory cell array is formed as stacked on peripheral circuits formed in a Si-substrate surface.

In the memory device now under consideration, peripheral circuits thereof such as a decoder, the sense amplifier, an output circuit and the like are implemented by using the conventional bulk MOSFET formed in a surface of a Si-substrate in such an arrangement as illustrated in FIG. 8, and a memory cell array including the memory elements MP1 to MP4 each of the structure illustrated in FIG. 1 are fabricated on the peripheral circuits with an interposition of an insulation film. This is because polycrystalline silicon for the memory elements MP1 to MP4 can be fabricated on the bulk MOSFETs. By virtue of this structure, the space or area otherwise required for the peripheral circuits can be spared, whereby the memory device can be implemented with about twice as high an integration density when compared with that of the conventional dynamic RAM. Parenthetically, it should be added that a wiring layer which exists in actuality between the bulk MOSFETs and the polycrystalline silicon transistor layer is omitted from illustration in FIG. 8.

As will be appreciated from the foregoing description, with the structure of the memory device according to the instant embodiment of the invention, there can be realized a integrated memory circuit with a high integration density because of capability of storing single-bit information by the single memory element. Besides, the integration density can further be increased by stacking the memory cell array on the peripheral circuit layer in a laminated or stacked structure. Additionally, there is no necessity for reading out a quantity of electric charge, as required in the case of the conventional dynamic RAM, but the signal can be generated on the data wire in a static manner, so to say. Owing to this feature, fine structurization can further be enhanced without involving degradation in the signal-to-noise ratio (S/N ratio). Moreover, information as stored can be retained over an extended time period, which means that refreshing operation as required in the case of the dynamic RAM can be rendered unnecessary. Consequently, power consumption can be suppressed to a possible minimum. Further, the peripheral circuits can be implemented in much simplified configuration. Owing to the features mentioned above, there can be realized according to the teachings of the invention incarnated in the instant embodiment a semiconductor memory device with an integration density which is at least twice as high as that of the conventional dynamic RAM while the cost per bit can be reduced at least to a half of that required in the conventional dynamic RAM. Of course, electric power required for holding or retention of information (data) can significantly be reduced.

In the foregoing description, it has been assumed that the low threshold voltage $V_l$ is of negative polarity with the high threshold level $V_h$ being positive, as illustrated in FIG. 7. However, even when these threshold voltages $V_l$ and $V_h$ for the memory element are set at higher levels, respectively, similar operation can be ensured simply by setting correspondingly higher the gate control signal level.

Figure 9A:
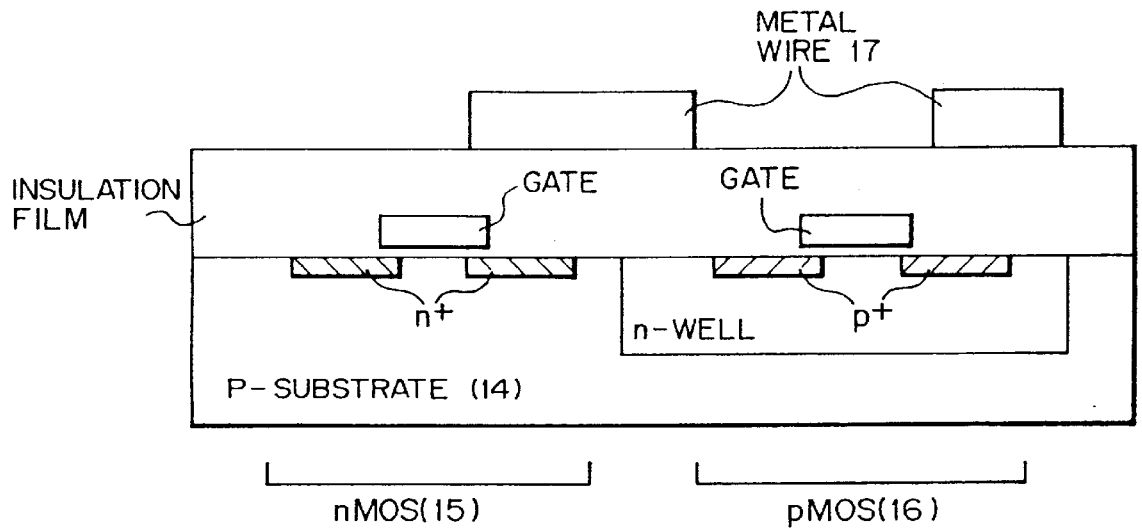
FIGS. 9A and 9B are sectional views for illustrating fabrication steps of a semiconductor memory device according to the first embodiment of the invention.
Figure 9B:
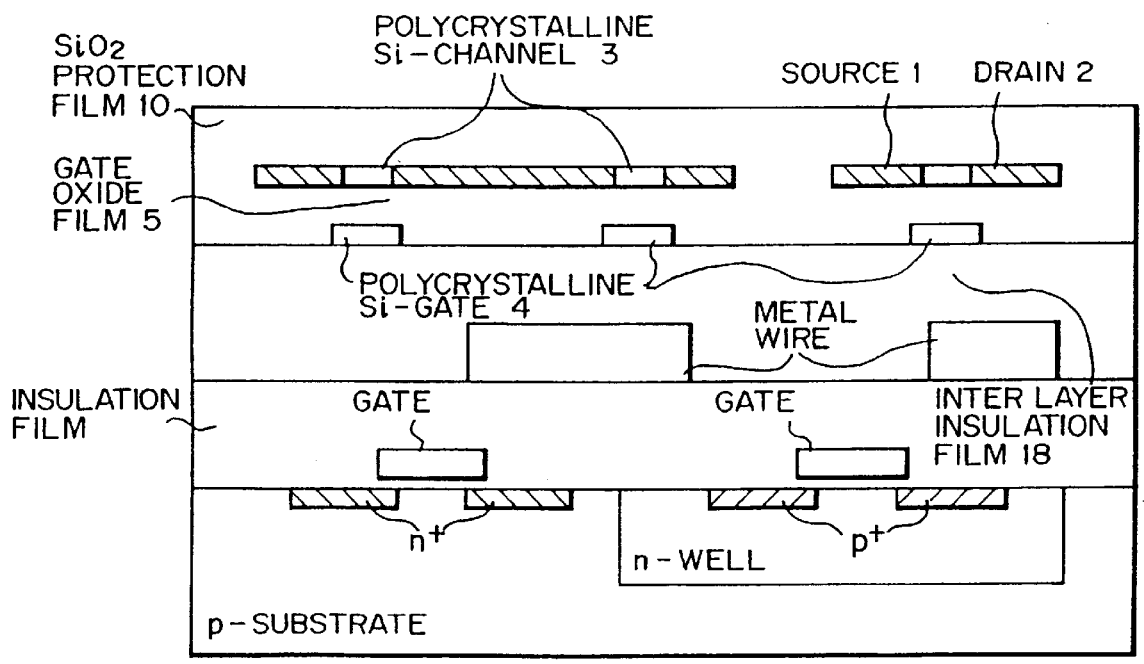

Next, by reference to FIGS. 9A and 9B, description will turn to a process for fabricating or manufacturing the memory element and the memory device according to the instant embodiment of the invention. At first, an n-channel MOS 15 and a p-channel MOS 16 (i.e., a CMOS (Complementary Metal-Oxide Semiconductor device) are fabricated on a surface of a p-type Si-substrate 14, which is then followed by formation of an insulation film over the CMOS device as well as formation of metal wires 17 (refer to FIG. 9A). Subsequently, an inter-layer insulation film 18 is deposited and the surface thereof is flattened for reducing roughness. Next, a polycrystalline silicon region which is to serve as a gate electrode 4 of the memory element is formed on the flat surface of the insulation layer 18. To this end, the polycrystalline silicon region is doped with n-type impurity at a high concentration so that it exhibits a low resistance. Next, a $SiO_2$-film which is to serve as a gate insulation film 5 is deposited in thickness on the order of 50 nm over the insulation layer 18 having the gate electrodes through a chemical vapor deposition method (i.e., CVD method in abbreviation), which is then followed by deposition of an amorphous silicon layer. After patterning of the amorphous silicon layer, source regions 1 and drain regions 2 are doped with n-type impurity such as As, P or the like through ion implantation and annealed at a temperature of about 750° C., whereby channels 3 of polycrystalline silicon are formed. Finally, a protection or passivation film 10 of $SiO_2$ is formed. Thus, there can be fabricated a memory device of high integration density according to the invention (refer to FIG. 9B). At this juncture, it should be added that an electrically conducting layer may be provided on the top surface of the memory device for the purpose of shielding the memory device against noise to thereby enhance the reliability thereof.

Embodiment 2

Figure 10A:
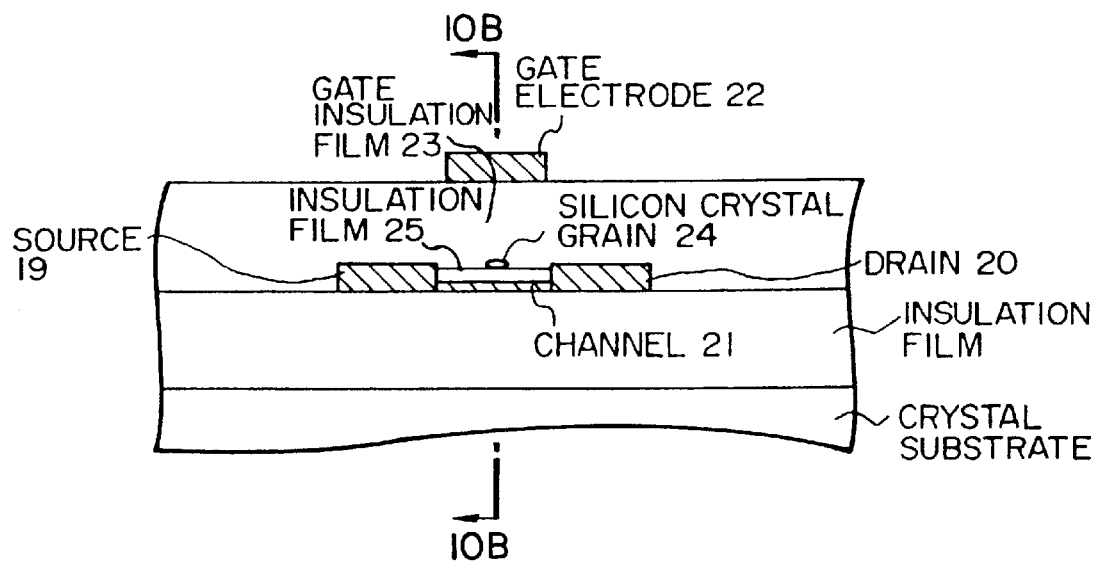
FIGS. 10A and 10B are sectional views showing a structure of a semiconductor memory element according to a second embodiment of the invention.
Figure 10B:
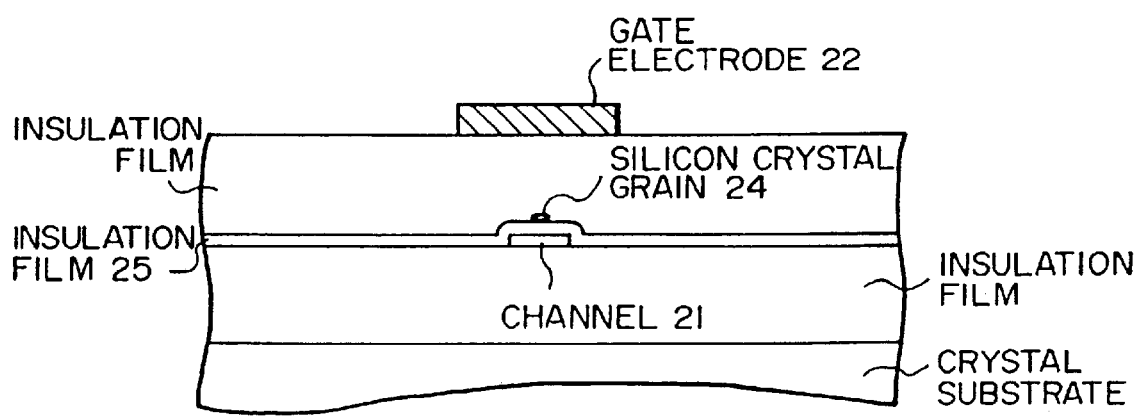

FIGS. 10A and 10B are sectional views showing a memory element according to a second embodiment of the invention. An SOI (Silicon-On-Insulator)-substrate is employed as the substrate, wherein FIG. 10B shows a section taken along as line a–a' in FIG. 10A. A source region 19 and a drain region 20 are each constituted by an n-type silicon region of high impurity concentration and low resistance, wherein a channel 21 of silicon extending between the source and drain regions 19 and 20 is formed in a fine or thin wire. A thin film 25 of $SiO_2$ is formed over the channel 21. Further, a storage node 24 for confining carriers with silicon grains is formed on the channel region 21. A gate electrode 22 is provided above the channel region 21 with a gate insulation film 23 being interposed therebetween.

With the structure of the memory element according to the instant embodiment, the capacitance $C_{gc}$ between the channel region 21 and the gate electrode 22 can be reduced because of a very small wire width of the channel 21. Writing and erasing operations can be effected by changing potential level. More specifically, the writing can be carried out by injecting electrons from the channel region into the storage node 24 by clearing a potential barrier provided by the insulation film 25, while for erasing the stored information, electrons are drawn out from the storage node 24. Thus, in the memory element according to the instant embodiment, writing and erasure of or data information to and from the storage node 24 are performed by transferring the electrons with the channel. It should however be mentioned that these operations can be realized through electron transferring with regions other than the channel region. The same holds true in the embodiments of the invention which will be described below. Further, although silicon is employed for forming the source, the drain and the channel with $SiO_2$ being used for forming the insulation films in the memory element according to the instant embodiment, it should be understood that the source and the drain may be formed of other semiconductor material or metal and that the insulation film may also be formed with other compositions so long as the capacitance $C_{gc}$ satisfying the requisite conditions mentioned previously can be realized.

Additionally, it is important to note that although the storage node 24 is provided above the channel 21 in the memory element according to the instant embodiment, the storage node 24 may be provided beneath the channel region or at a location laterally of the channel region. Besides, although it has been described that the SOI substrate is employed with monocrystalline silicon being used for forming the source, the drain and the channel, it should be understood that they may be formed by using polycrystalline silicon as in the case of the first embodiment. In that case, difference from the first embodiment can be seen in that the storage node 24 is provided independently. It should further be added that the material for the insulation film interposed between the channel region and the storage node need not be same as the material of the insulation film interposed between the gate and the storage node.

Although it is presumed that the carriers are electrons in the memory element and the memory device according to the instant embodiment, holes may equally be employed as the carriers substantially to the same effect. This holds true in the embodiments described below as well.

According to the teachings of the invention incarnated in the instant embodiment, the storage node 24 is formed by using crystal grains of a small size, wherein the storage node 24 of Si-grains is surrounded or enclosed by the gate insulation film 23 and the insulation film 25 of $SiO_2$ to thereby reduce surrounding parasitic capacitance. Because of the small size of the grains constituting the storage node 24, the surrounding or total capacitance $C_{tt}$ therefor may be determined in terms of intrinsic capacitance. In the case of a spherical body having a radius r and enclosed by a material having a dielectric constant $\in$, the intrinsic capacitance thereof is given by $4\pi\in r$. By way of example, for the storage node formed by silicon crystal grains having a grain size of 10 nm, the surrounding or total capacitance $C_{tt}$ of the storage node is about 1 aF.

Figure 11A:
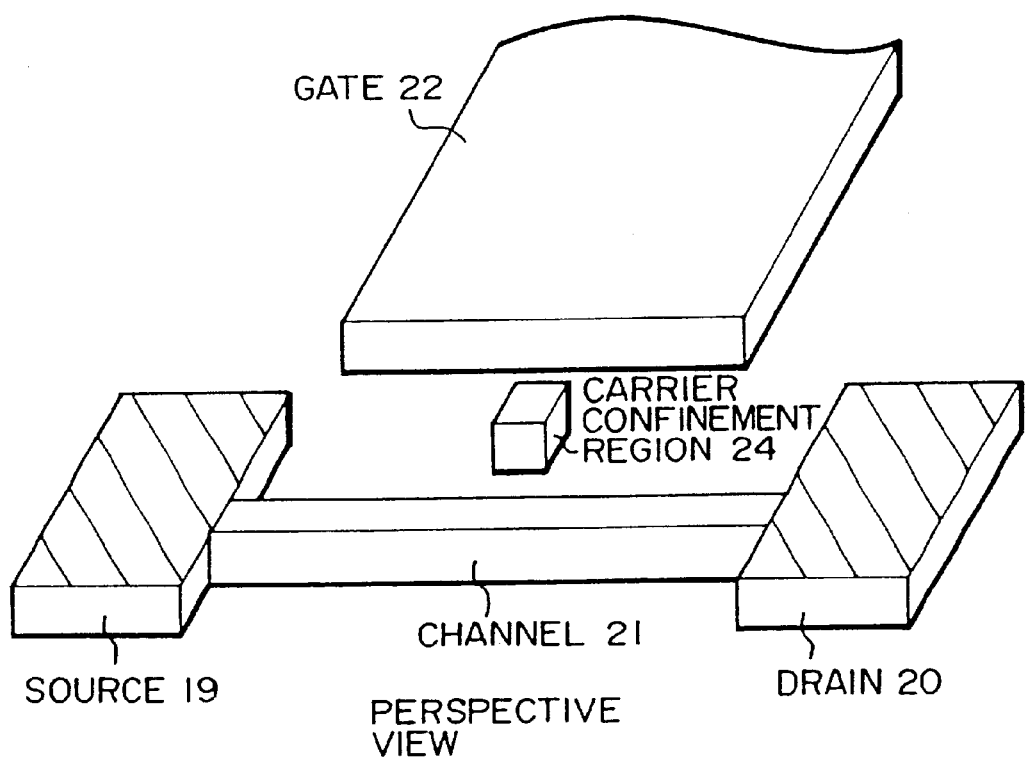
Figure 11B:
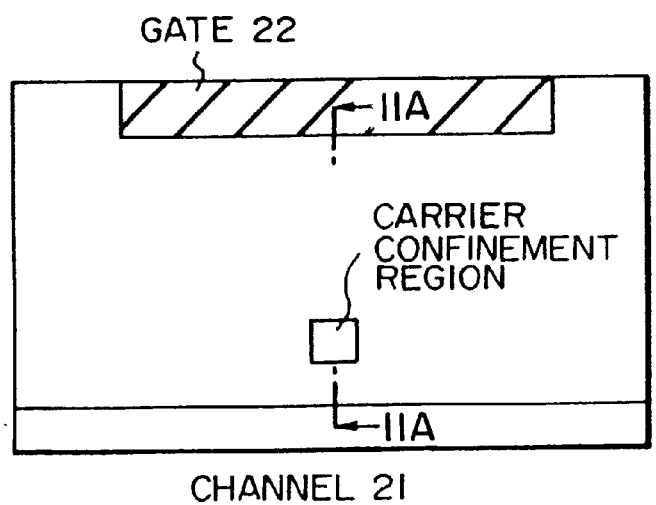

FIGS. 11A and 11B show schematically and exaggeratedly a channel region, a carrier confinement node and a gate electrode in a perspective view and a sectional view, respectively.

Figure 12:
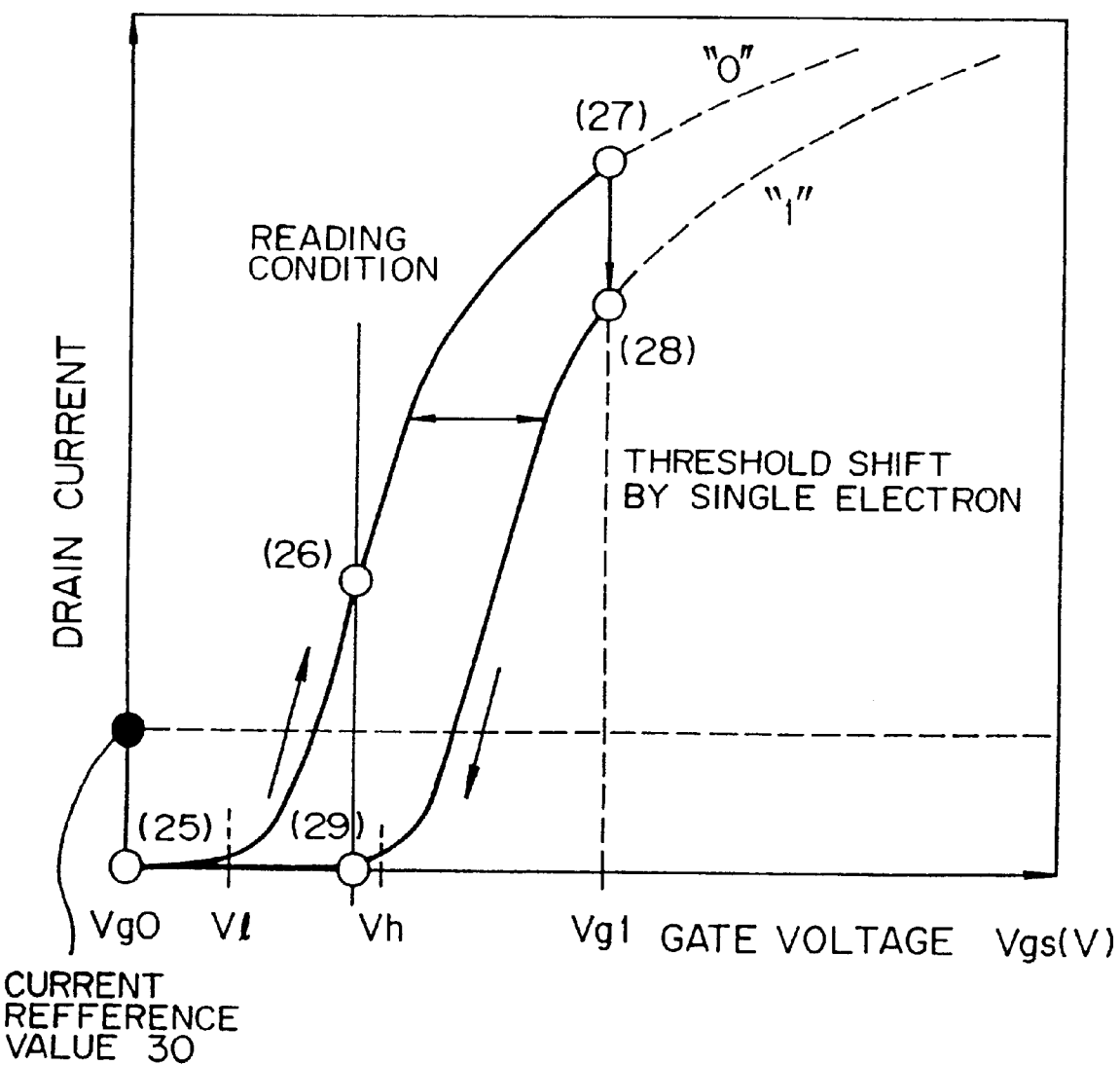
FIG. 12 is a view for illustrating graphically a gate-source voltage dependency of a drain current in the semiconductor memory element according to the second embodiment of the invention.

Referring to FIG. 12, when a gate-source voltage (i.e., voltage applied between the gate and the source) is swept between a first voltage $V_{g0}$ (zero volt) and a second voltage $V_{g1}$ (5 volts) in the vertical direction as viewed in FIG. 12, the drain current exhibits a hysteresis characteristic. In this conjunction, relevant potential distributions on and along a plane b–b' in FIG. 11B are illustrated in FIGS. 13A to 13C and FIGS. 14A to 14C. The reason why the hysteresis characteristic such as illustrated in FIG. 12 makes appearance will be elucidated below.

Figure 13A:
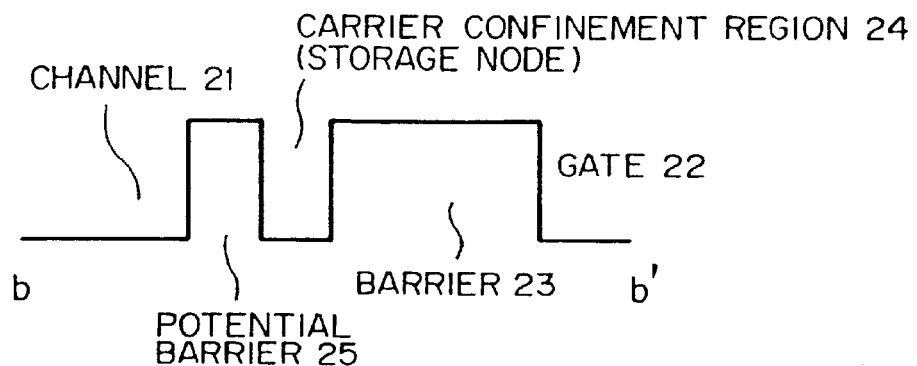
FIGS. 13A to 13C are schematic diagrams for illustrating exaggeratedly changes in potential distribution in the vicinity of a channel region and carrier confinement region of a semiconductor memory element when a gate voltage is increased.

In the semiconductor memory element shown in FIG. 10, potential distribution making appearance in the channel region 21 when the potential difference $V_{gs}$ between the gate and the source is zero volt is schematically shown in FIG. 13A. This corresponds to the state shown in FIG. 12. Parenthetically, it is assumed that the drain current flows in the direction perpendicular to the plane of the drawing FIG. 13A. The description which follows will be made on the assumption that the drain-source voltage is sufficiently low as compared with the gate voltage, being however understood that the following description applies valid as it is, even when the voltage between the drain and the source is high.

Now referring to FIG. 13A, in the channel region 21 surrounded by a potential barrier 25 formed between the channel region 21 and the storage node 24 and the peripheral $SiO_2$-film 23, there prevails a low-energy potential. Thus, the storage node 24 (carrier confinement region) formed of Si-grains and surrounded by the insulation films 23 and 25 can capture or trap the carriers or electrons. On the other hand, no electrons exist in the channel region 21 because energy level of the conduction band in the channel region 21 of P-type or N-type having low impurity concentration or i-type (intrinsic semiconductor type) is sufficiently higher than the energy level of the conduction band in the N-type source 19 of a high impurity concentration or Fermi level in the N-type degenerate source region 19 having a high impurity concentration. Consequently, no drain current can flow.

Incidentally, energy in the carrier confinement region or the storage node 24 is sufficiently higher than the Fermi level in the source region 19. Thus, no electron exists in this region 24 either.

Figure 13B:
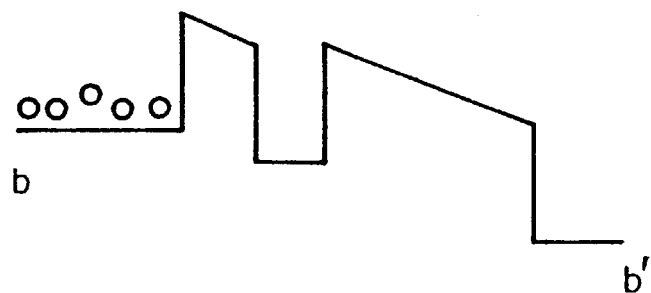
Figure 13C:
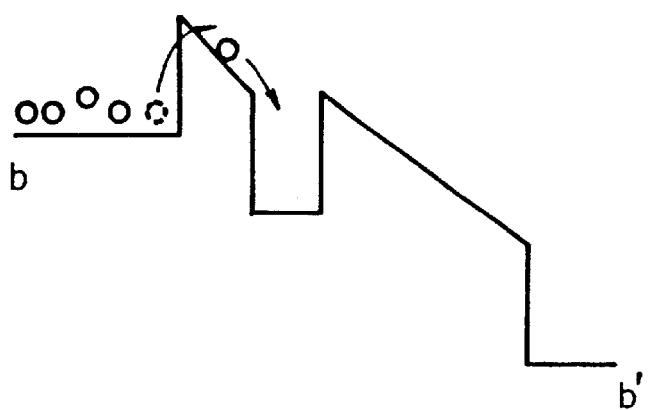

As the potential difference $V_{gs}$ between the gate electrode 22 and the source 19 is increased from zero volt to the low threshold voltage $V_l$, potential in the channel region 21 increases. As a consequence, potential in the channel region 21 for electrons becomes lower, as can be seen in FIG. 13B, hereby electrons are introduced into the channel region 21 from the source 19. Thus, a current flow takes place between the source and the drain.

When the gate voltage is further increased, the number of electrons existing in the channel region 21 increases correspondingly. However, when the gate-source voltage $V_{gs}$ reaches a writing voltage $V_{g1}$, energy in the storage node 24 becomes low, being accompanied with a corresponding increase of the potential gradient between the channel 21 and the storage node 24. As a consequence of this, at least one electron will be entrapped in the storage node 24 by clearing the potential barrier 25 due to thermal energy distribution of electron and/or tunneling phenomenon (tunnel effect). This corresponds to transition from the state 27 to the state 28, as illustrated in FIG. 12.

Figure 14A:
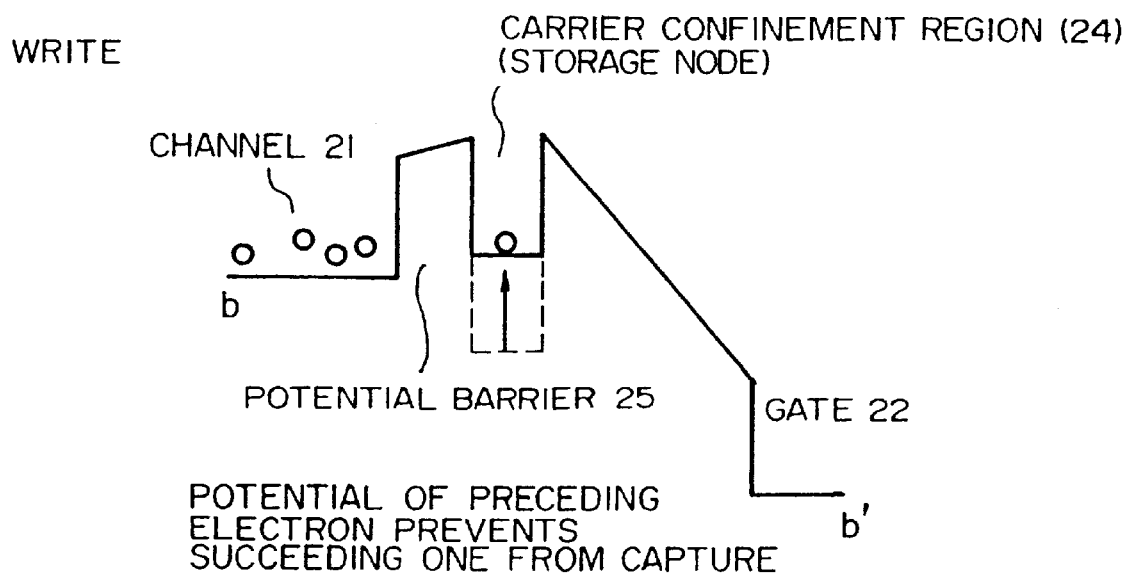
FIGS. 14A to 14C are schematic diagrams for illustrating exaggeratedly changes in potential distribution in the vicinity of a channel region and carrier confinement region of a semiconductor memory element when a gate voltage is lowered.

Thus, there takes place a Coulomb blockade owing to one electron trapped in the storage node 24 as well as potential increase, whereby injection of another electron in the storage node 24 is prevented, as is illustrated in FIG. 14A.

In this way, every time one electron is entrapped in the storage node 24, the threshold voltage of the semiconductor memory element shown in FIG. 10 changes from the low threshold $V_l$ to the high threshold voltage $V_{hs}$, the reason for which will be explained below.

When the gate-source voltage $V_{gs}$ is lowered within the range of $V_h$ (high threshold voltage)$<V_{gs}<V_l$ (low threshold voltage), starting from the state illustrated in FIG. 14A, the number of electrons in the channel region 21 decreases. However, electron captured or trapped in the storage node 24 remains as it is, because of existence of the potential barrier 25 between the storage node 24 and the channel 21.

Figure 14B:
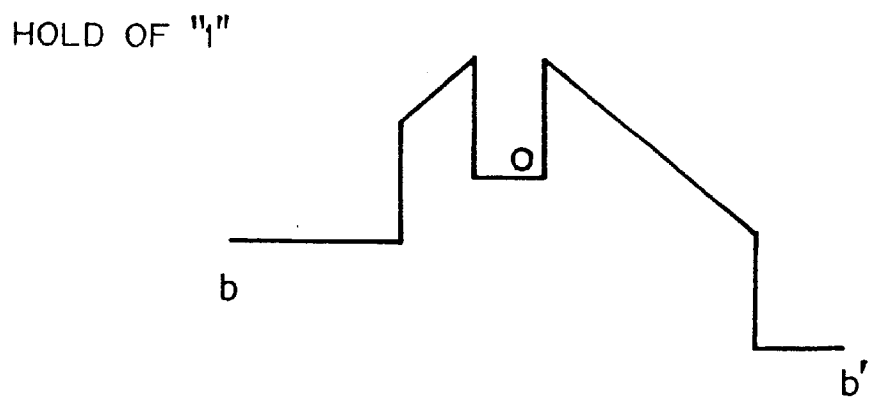

When the voltage of the gate electrode 22 is lowered to a level where the potential difference $V_{gs}$ is equal to the high threshold voltage $V_h$, the Fermi level in the source 19 becomes different from the energy level of the conduction band in the channel 21 by a magnitude on the order of kT, as a result of which substantially all of the electrons in the channel region make disappearance, (refer to FIG. 14B).

This corresponds to the state 29 shown in FIG. 12. At this juncture, it should however be mentioned that the threshold value $V_h$ at which the drain current can no more flow becomes higher than the low threshold voltage $V_l$ by an amount of the charge of the electrons captured in the storage node 24.

Figure 14C:
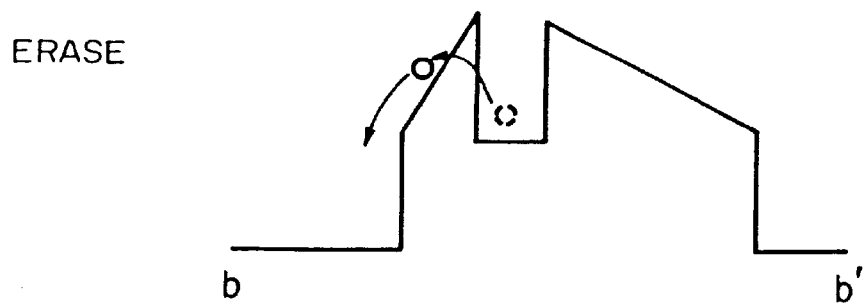

As the gate-source voltage $V_{gs}$ is further lowered to a level where it becomes equal to zero volt, the potential gradient between the storage node 24 and the channel region 21 becomes steeper correspondingly, as a result of which the electron captured in the storage node 24 is released owing to the tunneling effect brought about by thermal energy distribution of electrons and the field effect (refer to FIG. 14C). Potential profile in the state where electrons are dispelled is equivalent to the initial potential profile illustrated in FIG. 13A. This means that the semiconductor memory element resumes the state 25 shown in FIG. 12.

Subsequently, when the gate-source voltage $V_{gs}$ is again increased for effecting repeatedly the sweep in the vertical direction, hysteresis phenomenon which accompanies the capture/release of electron can be observed.

In the structure of the memory element now under consideration, the condition given by the expression (8) has to be satisfied in order to detect the presence/absence of a single electron in terms of a current.

Next, description will turn to a method of fabricating the memory element or memory device according to the instant embodiment of the invention. AS is shown in FIGS. 10A and 10B, the source region 19, the drain region 20 and the channel region 21 are formed in the SOI substrate by resorting to a photo etching process. The channel region is realized in the form of a fine or thin wire. The source and drain regions are doped with n-type impurity at a high concentration. By contrast, the channel region is doped with n-type or i-type or p-type impurity at a low impurity concentration. Subsequently, the $SiO_2$-film 25 is deposited through a CVD (chemical vapor deposition) process, which is then followed by formation of a crystal silicon grain or the storage node 24 through a CVD process.

In order to form the silicon crystal grain 24 (which is to serve as the storage node 24) having a very small radius r, a nucleus formed initially in the CVD deposition process is made use of for forming the crystal silicon grain 24. To this end, formation of the crystal silicon grain 24 by the CVD method should be carried out at a low temperature and completed within a short time.

Embodiment 3

Figure 15A:
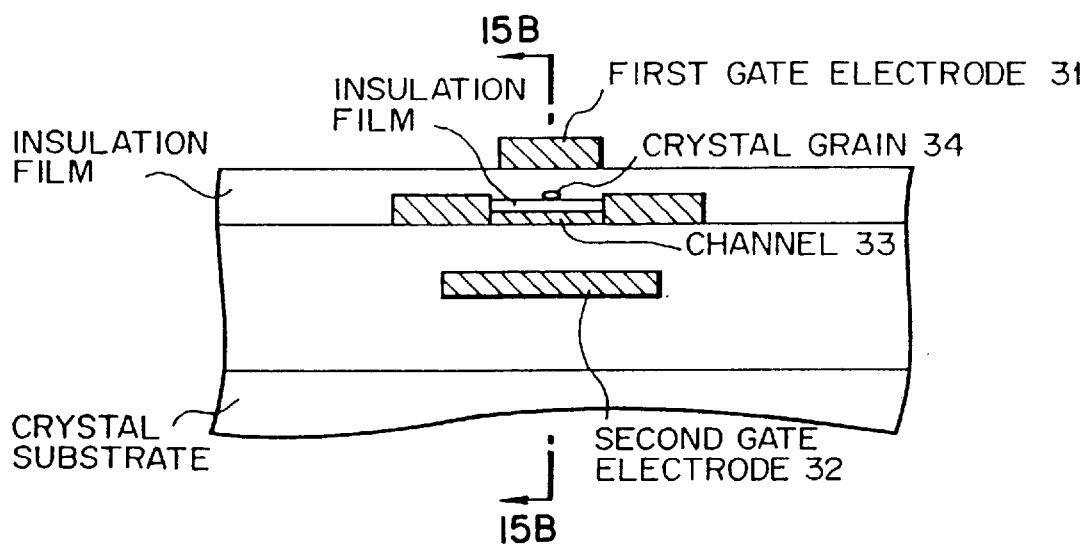
FIGS. 15A and 15B are sectional views showing a structure of a semiconductor memory element according to a third embodiment of the invention.
Figure 15B:
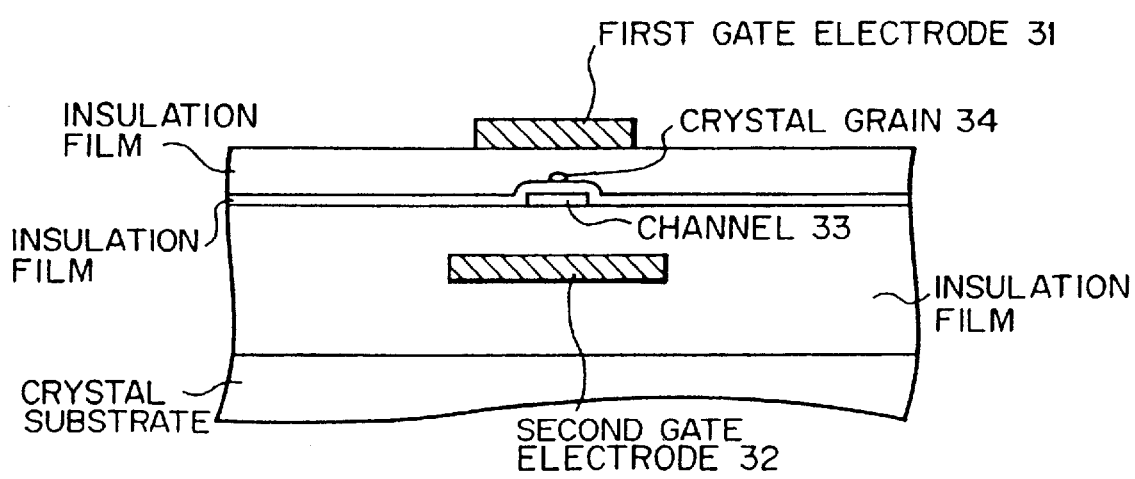

FIG. 15A and 15B show in sections a memory element according to a third embodiment of the present invention, respectively, in which FIG. 15B is a sectional view taken along a line a–a' in FIG. 15A. The memory element or memory device according to the instant embodiment differs from the second embodiment in that the former is implemented in such a structure in which a channel region 33 and a carrier confinement region or storage node 34 are sandwiched between a pair of gate electrodes 31 and 32. Thus, in the memory element or memory device according to the instant embodiment, writing and erasing operations can be performed not only from the first gate electrode 31 but also through the medium of the second gate electrode 32.

In the case of memory element or memory device according to the second embodiment of the invention, it is expected that potential profiles in the carrier confinement region and in the vicinity of the channel region inclusive thereof may undergo variation under the influence of change in the external potential. By contrast, the memory element or memory device according to the instant embodiment is less susceptible to the influence of such external potential change owing to the shielding effect of the gate electrodes provided at both sides, to an additional advantage.

Embodiment 4

Figure 16A:
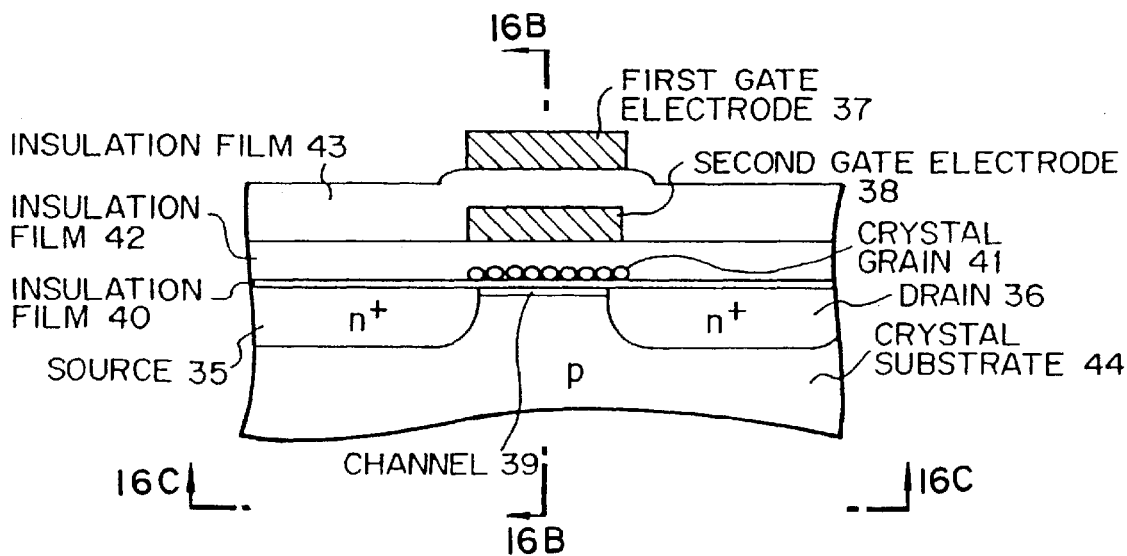
Figure 16B:
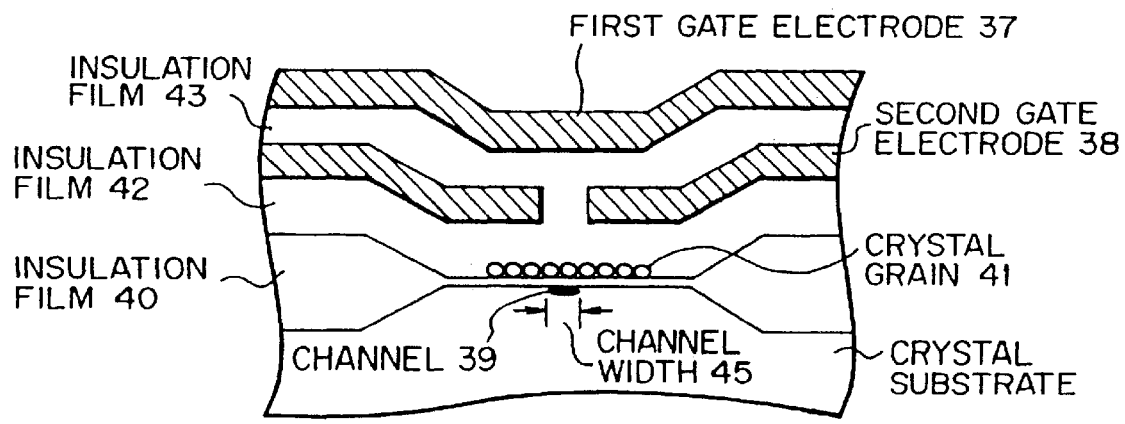
Figure 16C:
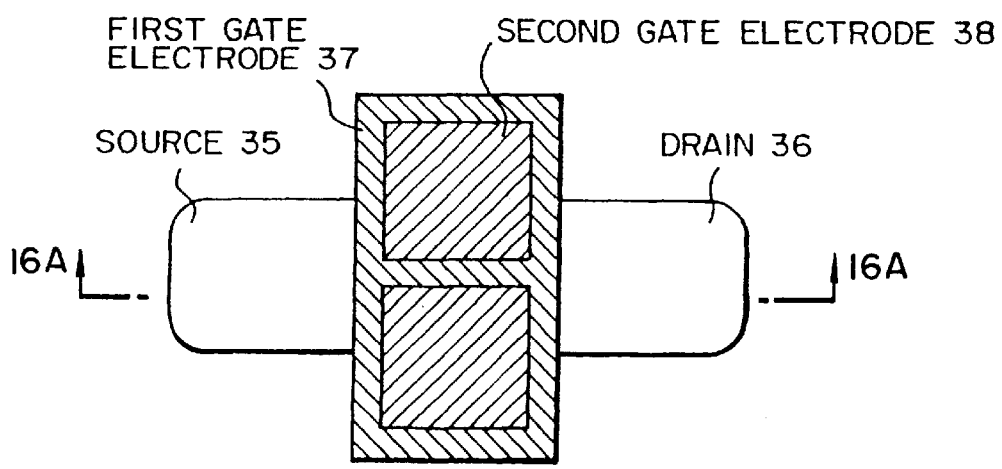

FIGS. 16A to 16C show a memory element according to a fourth embodiment of the invention, wherein FIG. 16A is a sectional view, FIG. 16B shows a section taken along a line a–a' in FIG. 16A and FIG. 16C is a top plan view. Referring to the figures, formed over a channel region 39 of a bulk MOSFET in which a source 35 and a drain 36 are formed in a silicon semiconductor crystal substrate is an insulation film 40 on which a plurality of silicon crystal grains 41 are formed. Further, an insulation film 42 is formed over the insulation film 40 and the grains 41. Additionally, a second gate electrode 38 is deposited on the insulation film 42. This gate electrode 38 is of such a shape that a gap exists in the direction interconnecting the source 35 and the drain 36. A first gate electrode 37 is provided above the second gate electrode 38 with an insulation film 43 being interposed therebetween. The source 35 and the drain 36 are each constituted by a region formed of an n-type bulk silicon having a high impurity concentration, wherein a p-type region 44 intervenes between the source region 35 and the drain 36.

By applying a voltage of positive or plus polarity to the first gate electrode 37, electrons are induced in a surface portion of the p-type region 44, whereby a channel 39 is formed. In that case, the potential of the second gate electrode 38 is set lower than the first gate electrode 37 so that the second gate electrode 38 also operates as an electrostatic shield electrode. As a result of this, the channel region 45 is formed only in a region located in opposition to the fine gap of the second gate electrode 38, whereby the effective capacitance $C_{gc}$ between the first gate electrode 37 and the channel region 39 can be made smaller. Writing and erasing operations can be realized by changing the potential of the first gate electrode 37 or the second gate electrode 38 or the substrate 37 in a substantially same manner as described hereinbefore in conjunction with the third embodiment.

Embodiment 5

Figure 17A:
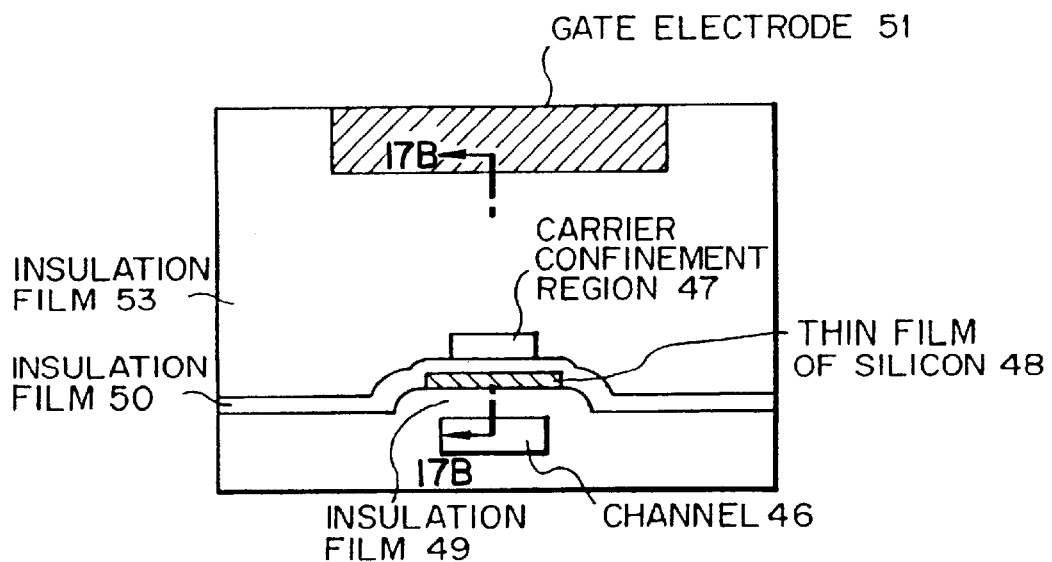

FIG. 17A shows a cross section of a memory element according to a fifth embodiment of the present invention. The direction in which the current flows extend perpendicularly to the plane of the drawing. The channel region and the carrier confinement region (storage node) as well as regions located in the vicinity are shown exaggeratedly. The source and the drain are implemented in same configurations as those of the memory element according to the second embodiment of the invention. The instant embodiment differs from the second embodiment in that a thin film 48 of silicon is formed in $SiO_2$-insulation films 49 and 50 between a channel region 46 of silicon and a storage node (carrier confinement node) 47 formed by a silicon crystal grain.

Figure 17B:
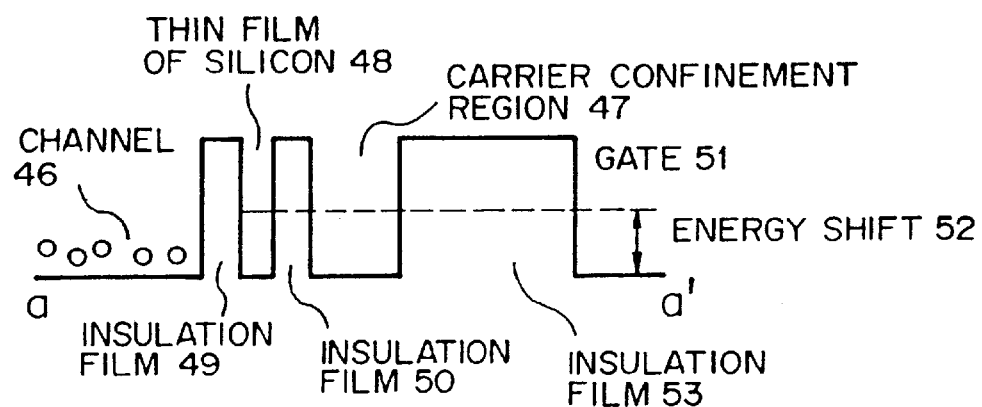

Carriers within a channel 46 can reach the storage node (carrier confinement region) 47 via the Si-thin film 48. FIG. 17B shows a potential profile in the memory element of the structure mentioned above. Referring to FIG. 17B, an energy shift 52 takes place in the Si-thin film 48 due to the quantum confinement effect in the direction thickness wise. The thin Si-film 48 plays a role as a barrier for the migration of electron from the Si-channel region 46 to the carrier confinement region (storage node) 47. As a result of this, for achieving the same barrier effect, the sum of film thicknesses of the $SiO_2$-films 49 and 50 existing between the channel and the carrier confinement region may be reduced as compared with the film thickness of the $SiO_2$-film located between the channel region and the carrier confinement region of the memory element in which the structure according to the instant embodiment is adopted (e.g. refer to FIGS. 10A and 10B). Accordingly, fatigue of the insulation film can be mitigated, whereby the number of the times the memory is rewritten can be increased.

It should further be mentioned that the potential barrier realized by making use of the quantum confinement effect described above is effective for protecting the insulation film against fatigue even in the case where a greater number of carriers are to be handled by the carrier confinement region.

Embodiment 6

Figure 18:
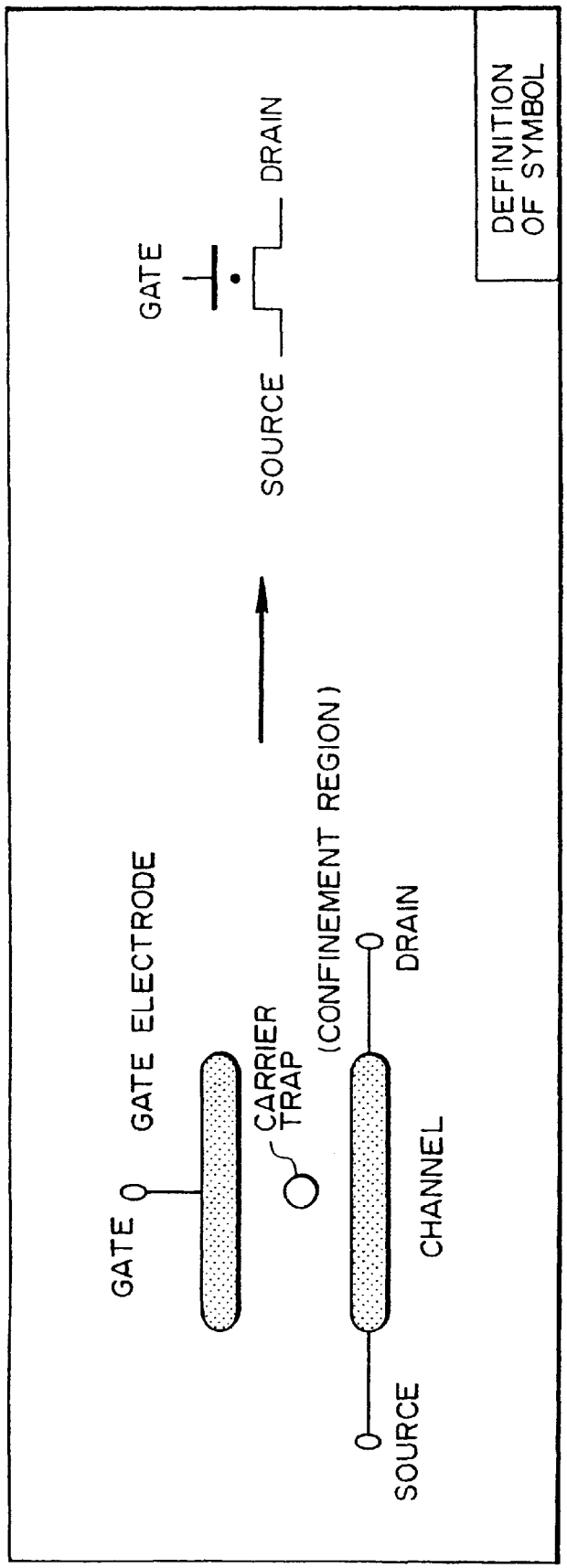
FIG. 18 is a view showing a symbol representing a semiconductor memory element according to the invention.
Figure 18A:
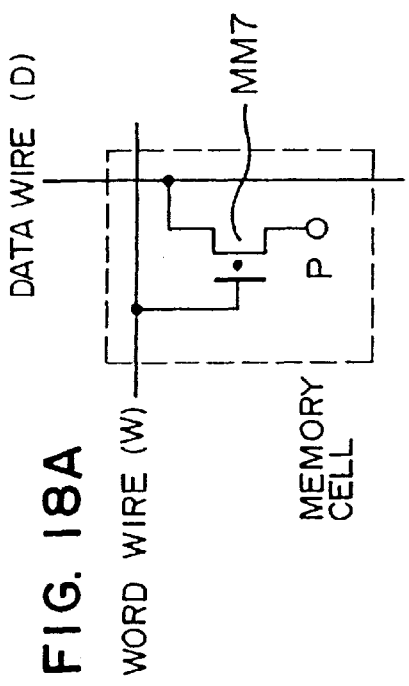
Figures 18B, 18C:
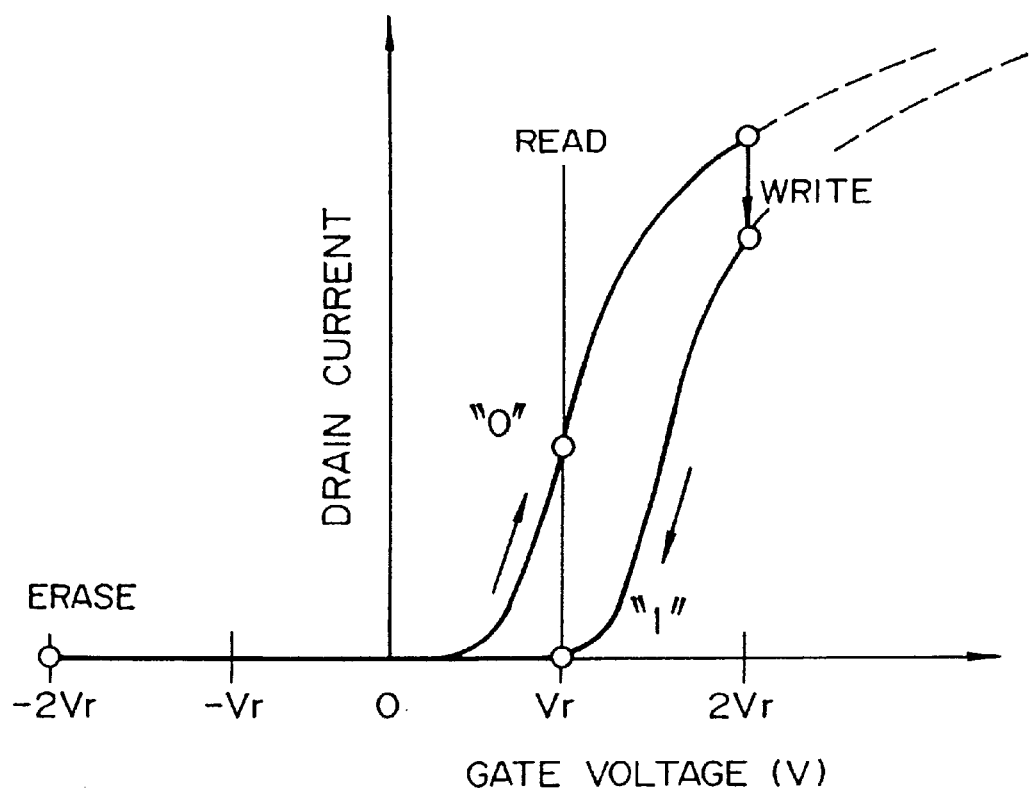

A structure of a memory read circuit for a semiconductor memory device according to the invention will be described by reference to FIGS. 18A to 18C and FIG. 19. In the description which follows, the semiconductor memory element according to the invention which may be one of the elements described hereinbefore by reference to FIGS. 1A–1D, FIG. 6, FIGS. 10A, 10B, FIGS. 15A, 15B, FIGS. 16A–16C and FIGS. 17A, 17B, respectively, is identified by representing the carrier trapping node (carrier confinement region) by a solid circle as shown in FIG. 18 for the purpose of discrimination from the conventional field effect transistor. On FIGS. 18A to 18C, FIG. 18A shows a circuit configuration of a single-bit memory cell, FIG. 18B shows voltages applied to a word wire W and a data wire D upon read and write operations, respectively, and FIG. 18C graphically illustrates a dependency of a drain current on a gate voltage (gate-source voltage) in a semiconductor element MM7 employed for realizing the memory cell. The circuit configuration per se is identical with that described hereinbefore in conjunction with the first embodiment by reference to FIG. 6.

Figure 19:
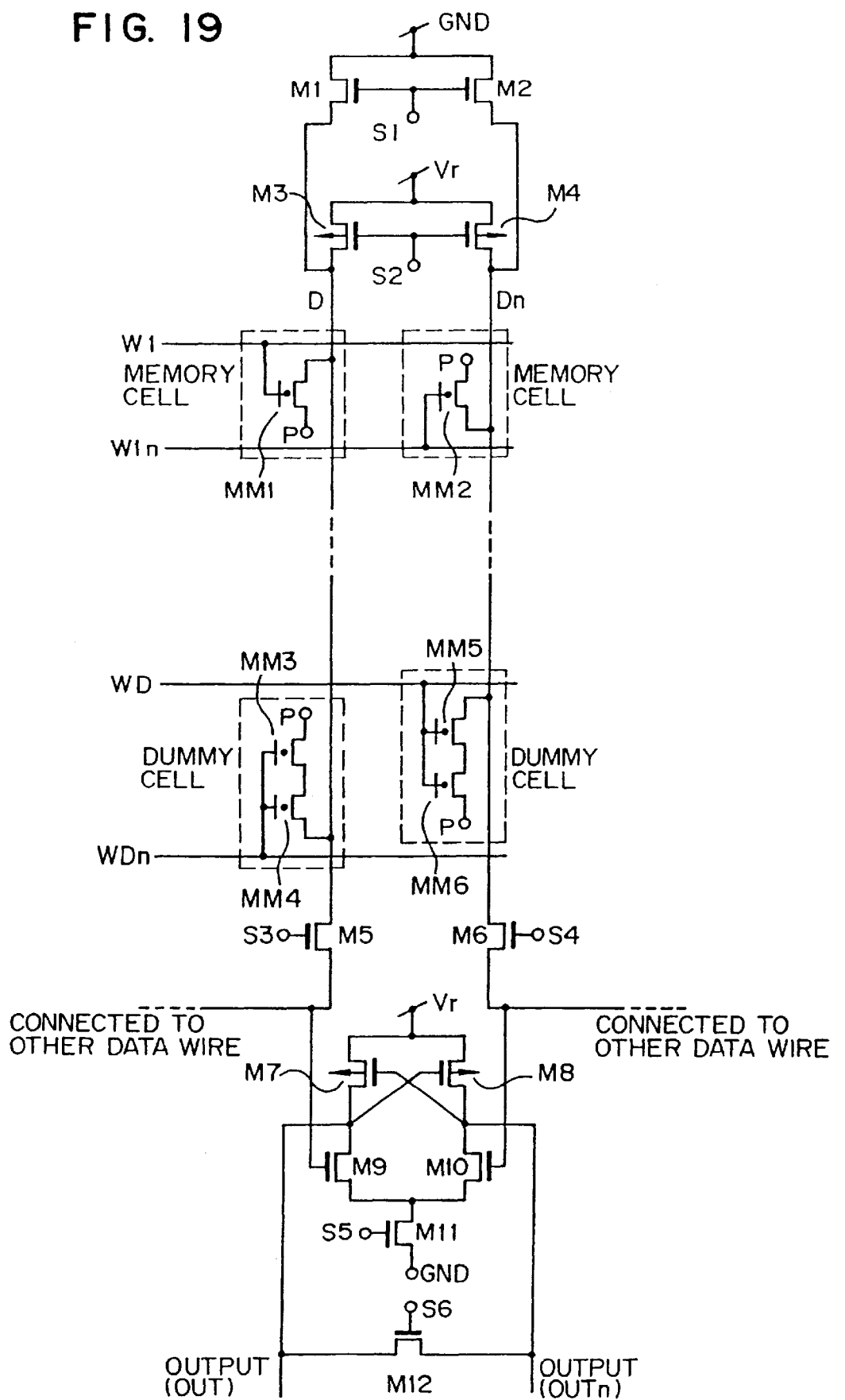
FIG. 19 is a circuit diagram showing circuit configuration of a read circuit for the memory cell according to the sixth embodiment of the invention.

FIG. 19 shows a circuit configuration for reading data or information stored in a memory cell MM1. Needless to say, a large number of memory cells similar to the memory cell MM1 are disposed in an array in the memory device which the invention concerns, although illustration thereof is omitted. The memory cell MM1 serving for storing information differs from the conventional MOSFET known heretofore in that the value of a current which can be handled by the memory cell is smaller as compared with that of the MOSFET. This is because the gate-channel capacitance is set small in the case of the memory cell according to the invention. A structure for reading such a small current value stably at a high speed will be described below. The memory cell constituted by the semiconductor memory element MM1 is connected to a data wire D which in turn is connected to an input transistor M9 constituting a part of a differential amplifier via a data wire selecting switch M5. Connected to another data wire Dn provided in pair with the data wire D are dummy cells constituted by semiconductor memory elements MM5 and MM6, respectively. The data wire Dn is connected to a gate terminal of an input transistor constituting the other part of the differential amplifier via a data wire selecting switch M6.

Figure 20:
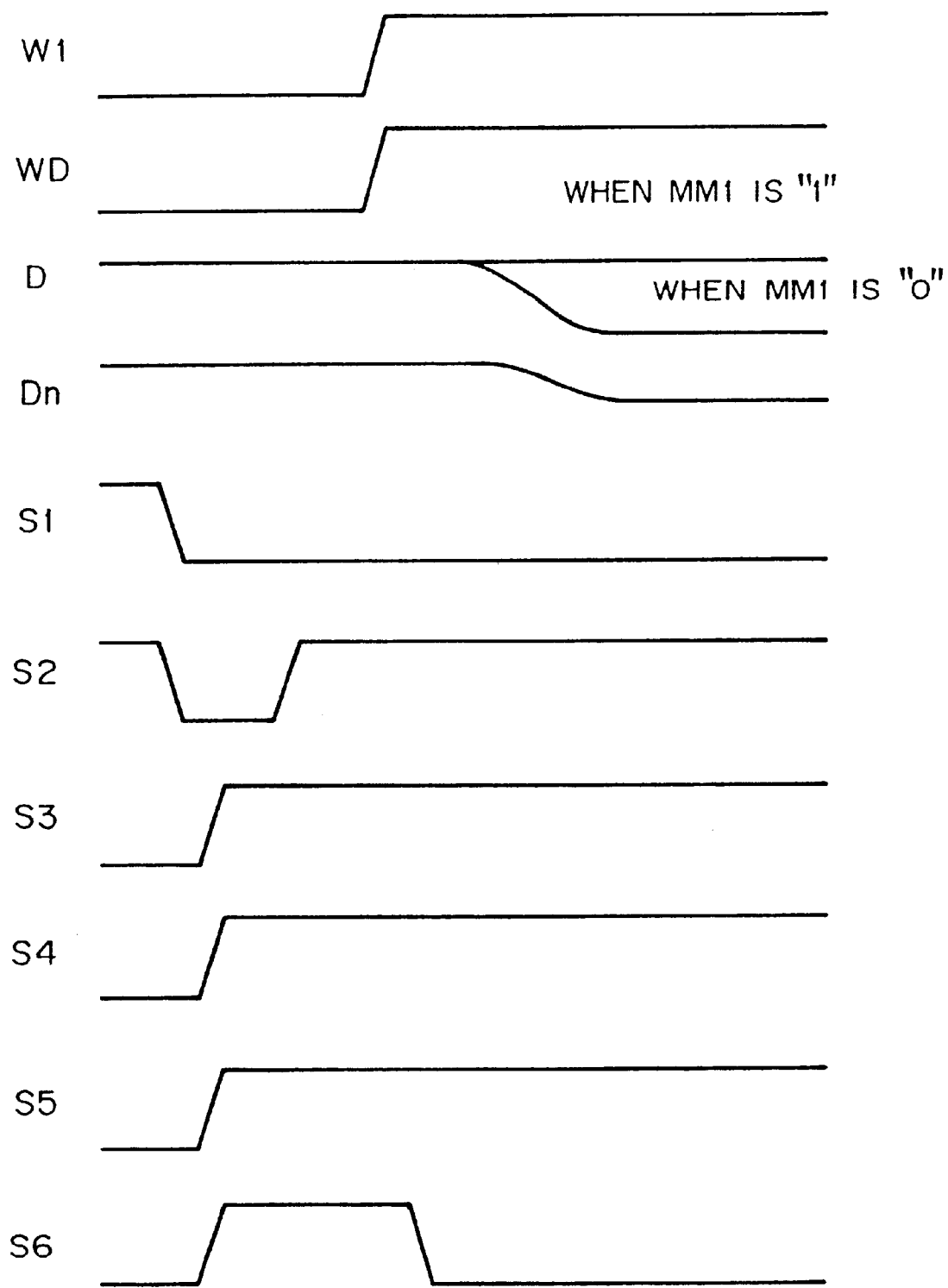
FIG. 20 is a signal waveform diagram for illustrating timings at which various signals are applied upon read operation.

Now, description will be directed to operation for reading data from the memory cell MM1. FIG. 20 shows timing of signals involved in the read operation. It is assumed that logic "0" is written in the memory cell MM1 which is thus in the state where the threshold voltage is low. Each of the dummy cells MM5 and MM6 is always written with logic "0" previously. Upon read operation, a signal S2 is set to a low level to thereby precharge both the data wires D and Dn to a source voltage Vr. At the same time, signals S3 and S4 are set to a high level to thereby allow the data wires D and Dn to be connected to the input transistors M9 and M10 of the differential amplifier, respectively. Further, at the same timing, signals S5 and S6 are set to the high level to thereby activate the differential amplifier so that the outputs OUT and $OUT_n$ are equalized to each other. By changing potentials of the word wire W1 and WD from the low level to the high level, the memory cell MM1 and the dummy cells MM5 and MM6 are selected. Then, the memory cell MM1 assumes the on-state (conducting state), which results in that the potential of the data wire D becomes low. At the same time, the dummy cells MM5 and MM6 are set to the on-state, whereby the potential of the data wire Dn becomes low. However, because the dummy cells MM5 and MM6 are connected in series, the current driving capability thereof is poor as compared with that of the memory cell MM1. Consequently, the potential of the data wire Dn changes more gently than that of the data wire D. When data of the data wires D and Dn are fixed, a signal S6 is set to the low level, whereby the differential amplifier can assume the state ready for operation. The potential difference between the data wires D and Dn is amplified by the differential amplifier, the output OUT of which thus assumes the high level while the other output OUTn becomes low. At this time point, operation for reading logic "0" from the memory cell MM1 is completed.

When the memory cell MM1 is in the state of logic "1" (i.e., in the state where the threshold value is high with only a small current flowing), the data wire D remains in the precharged state, as a result of which the potential of the data wire Dn lowers more speedily than that of the data wire D. The resultant difference is then amplified by the differential amplifier, whereupon the read operation comes to an end.

For reading information from the memory cell constituted by a semiconductor memory element MM2, the semiconductor memory elements MM3 and MM4 then serve as the dummy cells. It is sufficient to provide a single dummy cell for each of the data wires. Thus, the area requirement can be suppressed to a minimum.

With the circuit arrangement described above, information read operation can be effectuated even when only a small potential difference makes appearance between the data wires D and Dn. This means that the quantity of charge to be discharged from the data wire D via the memory cell MM1 may be small. By virtue of these features, high-speed operation can be realized.

In the case of the exemplary embodiment described above, the series connection of the dummy cells MM5 and MM6 is provided as the means for making the dummy cell current substantially equal to a half of the memory cell current. However, the reference potential can be generated by reducing the channel width to a half or lowering the applied gate voltage instead of resorting to the provision of the serial dummy-cell connection.

Figure 21A:
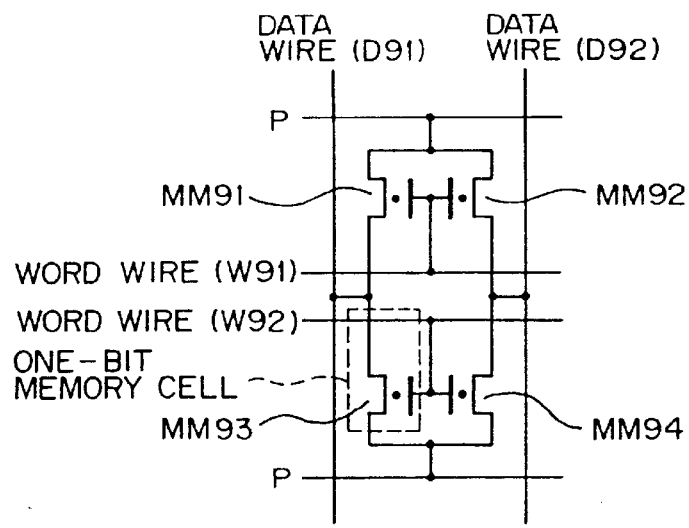
FIGS. 21A and 21B are diagrams showing a circuit configuration of a 4-bit memory cell array according to the sixth embodiment and a layout thereof, respectively.
Figure 21B:
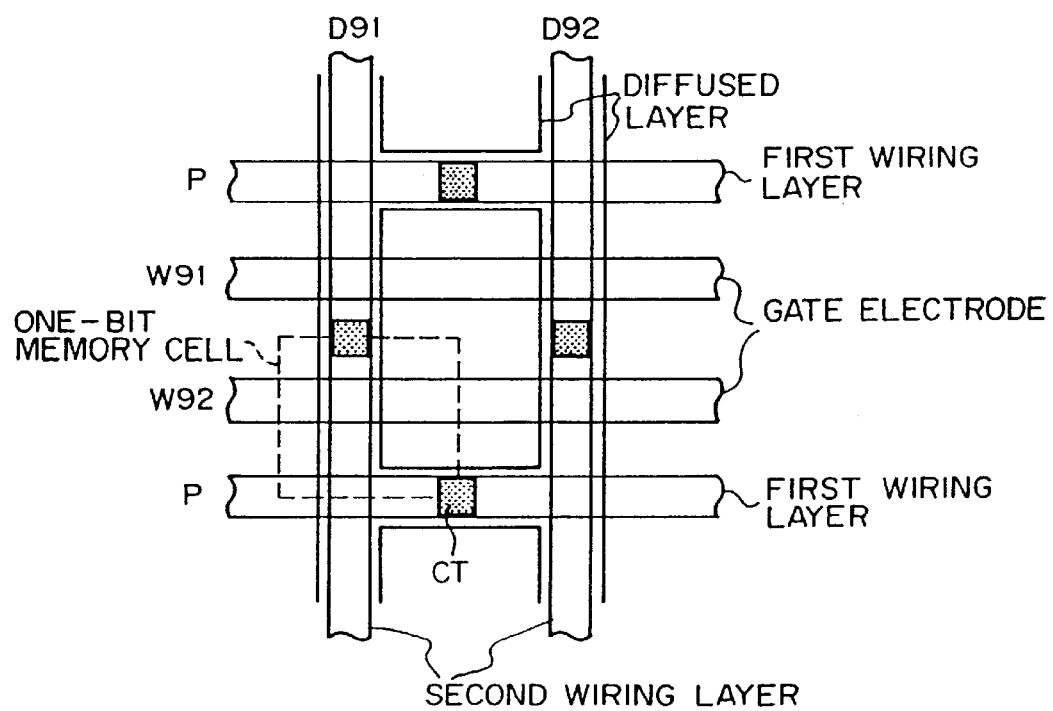

FIGS. 21A and 21B show a circuit configuration of memory cells in a semiconductor memory device and a layout thereof, respectively. More specifically, FIG. 21A is a circuit diagram showing four memory cells arrayed adjacent to one another, while FIG. 21B shows a mask layout corresponding to the circuit configuration shown in FIG. 21A. The two memory cells MM91 and MM92 connected to a word wire W91 share one and the same gate electrode in common, whereby the wiring required, if otherwise, can correspondingly be spared. On the other hand, for the other memory cells MM93 and MM91 which are connected to a same data wire D91, diffused layers thereof are directly connected to each other for allowing a single contact (CT) to be shared by both the memory cells MM93 and MM91, whereby the wiring area as required is correspondingly reduced.

Embodiment 7

Another embodiment of the semiconductor memory device according to the invention will be described by reference to FIGS. 22A to 22C and FIG. 23. With the structure of this embodiment, the read operation can be carried out at a higher speed than the semiconductor memory device according to the sixth embodiment.

Figure 22A:
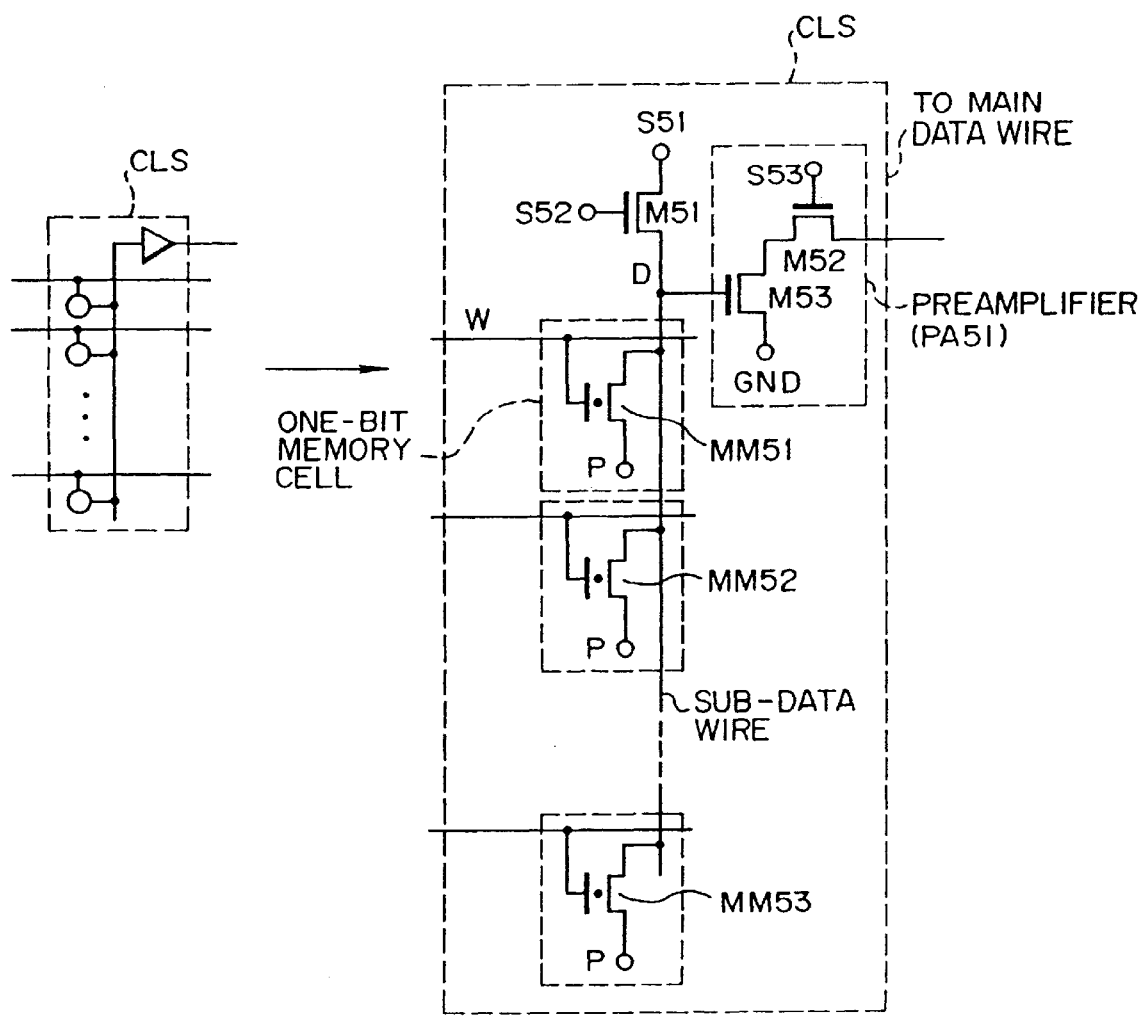
Figures 22B, 22C:
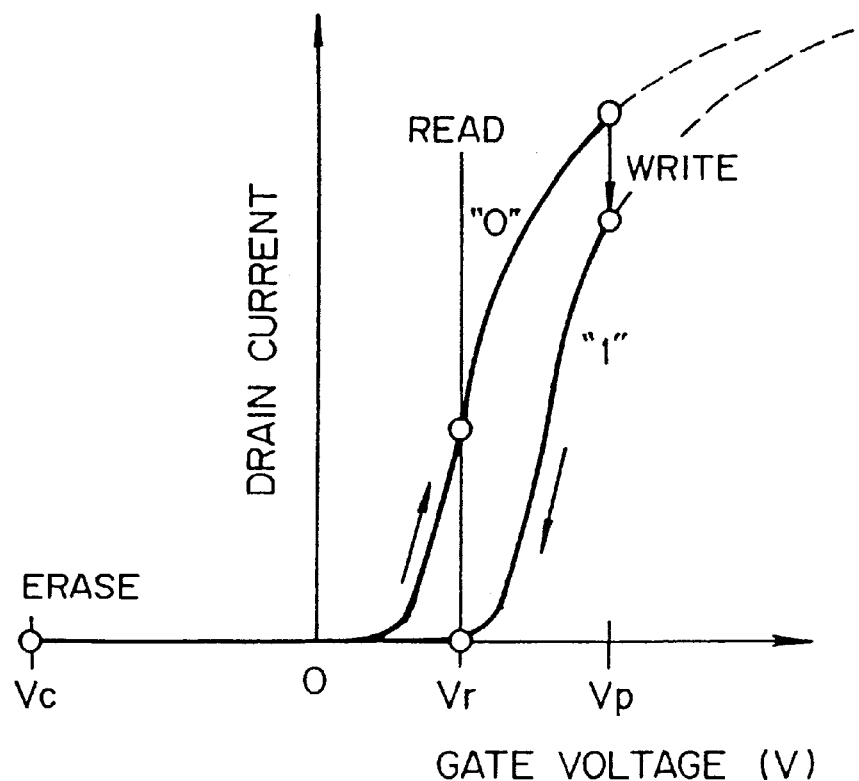
Figure 23:
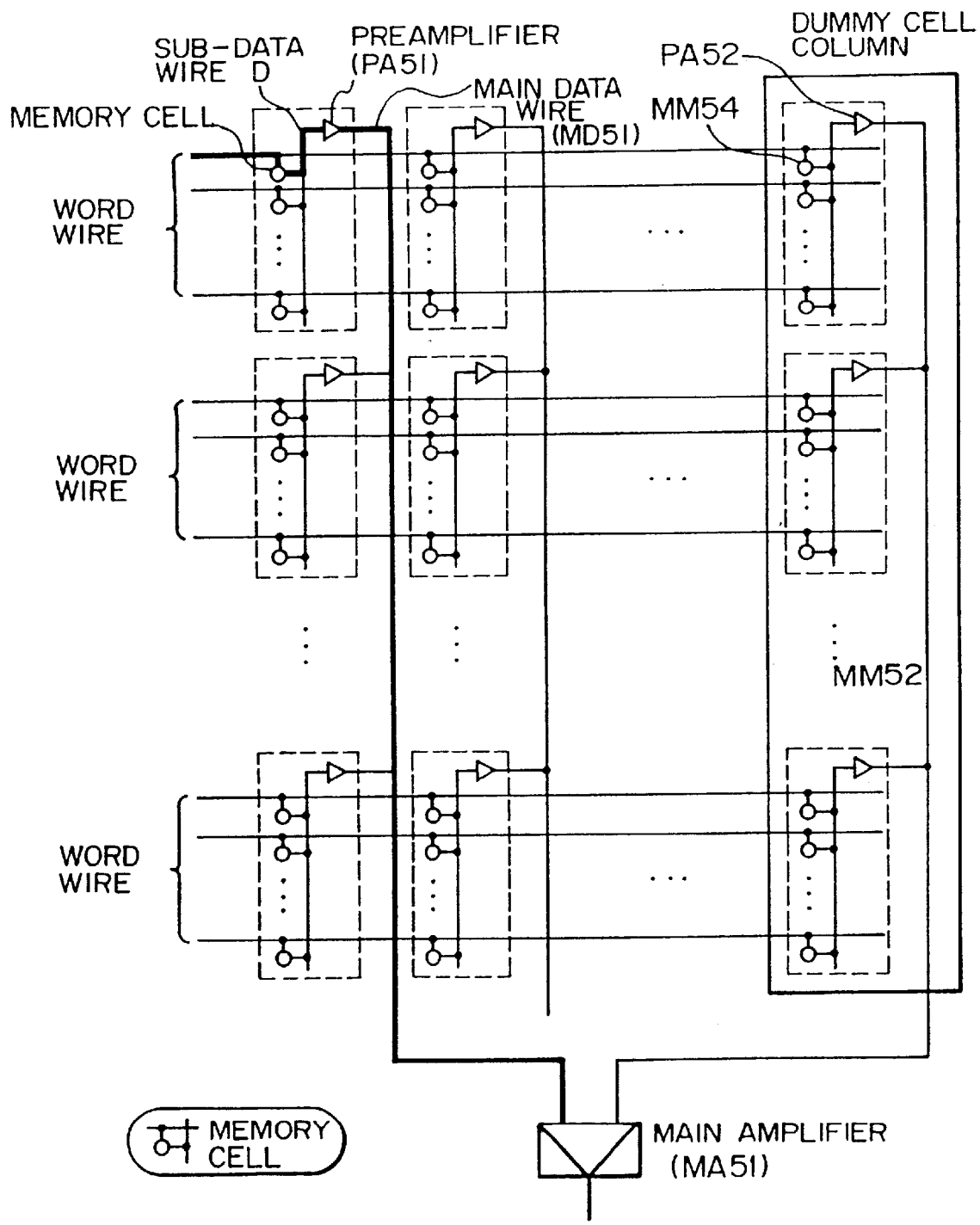
FIG. 23 is a circuit diagram showing a structure of a semiconductor memory device according to the seventh embodiment of the invention.

Of these drawings, FIG. 22A shows a circuit diagram of a cell set comprised of an assembly of plural memory cells MM51, MM52 and MM53 which are connected to the same sub-data wire D, FIG. 22B shows voltages applied to the memory element MM51 upon write and read operations, FIG. 22C graphically illustrates characteristic of the memory element MM51, and FIG. 23 shows a structure of a semiconductor memory device implemented by using the cell sets each of a structure shown in FIG. 22A. The instant embodiment differs from the sixth embodiment primarily in that the data wire is hierachized into a main data wire MD 51 and a sub-data wire D (see FIG. 23) in order to carry out read operation at a higher speed. As can be seen in FIG. 22A, the source terminals of the memory cells MM51, MM52 and MM53 are connected to the sub-data wire D, which in turn is connected to a preamplifier comprised of transistors M53 and M52 and generally denoted by PA51. The preamplifier PA51 has an output terminal connected to a main data wire MD 51 (see FIG. 23). Connected to the main data wire MD 51 are a plurality of cell sets each of the structure mentioned above via the respective preamplifiers. The main data wire MD 51 is connected to one of the input terminals of a main amplifier MA51 constituted by a differential amplifier. A column of dummy cells is constituted by cell sets disposed in an array. The dummy cell (e.g. MM54) is connected to another main data wire MD 52 via a preamplifier PA52. The main data wire MD 52 in turn is connected to the other input terminal of the main amplifier MA51. The preamplifier PA52 for the dummy cell set is so designed that the current driving capability thereof approximately corresponds to a half of that of the preamplifier PA51. This can be realized, for example, by diminishing the channel width of the transistor to the half.

Next, description will turn to operation for reading information from a memory cell MM51. Information of logic "0" is written in the dummy cell MM54 previously. It is first assumed that information of logic "0" is stored in the memory cell MM51. At first, high-level potential $V_r$ is applied to a gate terminal S52 of the transistor M51 to thereby set the source terminal S51 to the ground potential level, whereby the sub-data wire D is set to the ground potential level. Further, for the selection of cell set, high-level potential is applied to the gate terminal S53 to thereby set the transistor M52 of the preamplifier PA51 to the conducting state (on-state). At the same time, the main data wires MD 51 and the MD 52 are precharged to the high potential level $V_r$. When the potential of the word wire W changes from a low level to a high level $V_r$, the memory cell MM51 becomes conductive, whereby the sub-data wire D is charged from a source terminal P (=$V_r$) via the memory cell MM51. Consequently, the transistor M53 is turned on, which results in that the main data wire MD 51 is discharged through the memory cells MM52 and MM53 with the potential of the main data wire MD 51 being lowered. Through similar operation, the dummy cell MM54 connected to the same word wire assumes the on-state. In response, the preamplifier PA52 operates to cause the main data wire MD 52 to be discharged. Thus, the potential of the main data wire MD 52 is lowered. However, because the current driving capability of the preamplifier PA52 is poor as compared with that of the preamplifier PA51, the potential of the main data wire MD 52 is lowered at a slower rate than that of the main data wire MD 51. Thus, there makes appearance between the main data wires MD 51 and MD 52 a potential difference, which is detected by the main amplifier MA51, whereby corresponding output information is derived from the main amplifier MA51. Operation for reading out logic "1" is carried out in the similar manner.

In the case of the instant embodiment, it is sufficient for the memory cell MM51 only to drive the sub-data wire D. The sub-data wire features that the parasitic capacitance is small, because the number of the cells connected to the sub-data wire is as small as in a range of 8 to 32 and because the length of the sub-data wire is short. Thus, the sub-data wire can be driven by the memory cell or memory element MM51 at a high speed. Equally, high-speed operation of the main data wire MD 51 can be achieved because it can be driven at a high speed by the preamplifier PA51.

According to the teaching of the invention incarnated in the instant embodiment, the preamplifiers PA52 and PA51 are so implemented that they differ in respect to the current driving capability for the purpose of generating a reference voltage for the differential amplifier PA51. When compared with the sixth embodiment in which the current is reduced to a half by the memory cell per se, the instant embodiment according to which the current level is changed in the preamplifier constituted by the transistors of higher rating is advantages in that it is less susceptible to the influence of the dispersions mentioned hereinbefore.

Parenthetically, the main amplifier MA51 can be implemented by using an appropriate one of various circuits known in the art such as differential amplifier employed in the device of the sixth embodiment, a current-mirror type differential amplifier circuit and the like.

Figure 24A:
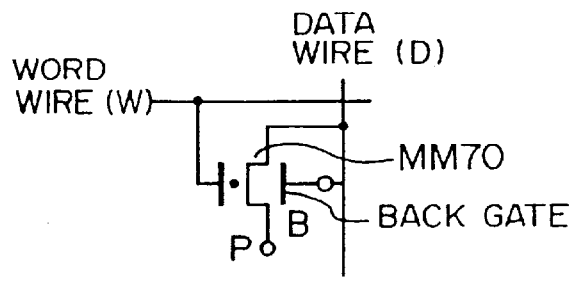
FIGS. 24A to 24E are circuit diagrams showing various configurations of the memory cell according to the invention.

In the case of the sixth and seventh embodiments described above, it has been assumed that the memory cell is constituted by a single transistor. It should however be mentioned at this juncture that the memory cell may be implemented in other configurations such as exemplified by those shown in FIGS. 24A to 24E. More specifically, FIG. 24A shows a memory cell in which a back gate is provided in opposition to the gate electrode with the channel being interposed between the back gate and the gate electrode. This structure of the memory cell provides an advantage that when a plurality of memory cells are connected to a same back gate terminal, information or data contained in these memory cells can simultaneously be set to logic "0" by applying a voltage of minus polarity to the back gate. Of course, by applying a voltage of plus or positive polarity to the back gate, it is equally possible to write simultaneously logic "1" in these memory cells.

In this junction, the back gate terminal may be realized by making use of the semiconductor substrate itself, a potential well or the like.

Figure 24B:
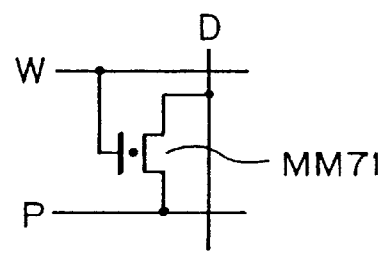
Figure 24C:
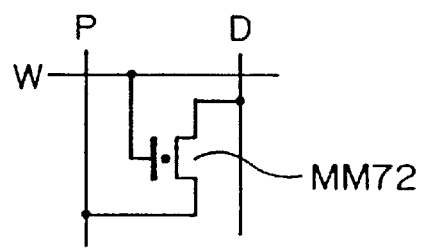
Figure 24D:
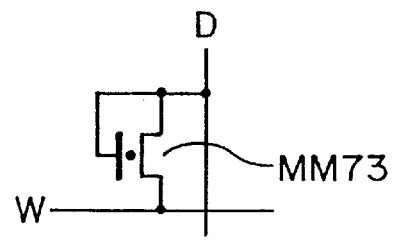
Figure 24E:
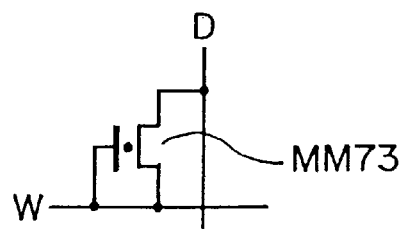

FIG. 24B shows a memory cell in which the terminal wire P extends in parallel with the word wire so that control of the memory device can be performed on a row-by-row basis independently. On the other hand, FIG. 24C shows a memory cell in which the terminal wire P extends in parallel with the data wire. Further, FIG. 24D shows a memory cell in which the gate of the memory element MM73 is connected to the data wire. In this case, the terminal P can be spared, which contributes to reduction of the area as involved in implementing the semiconductor memory device. Finally, FIGS. 24E shows a memory cell in which the gate of the memory element MM74 is connected to the word wire and which thus can ensure an advantage similar to that of the memory cell shown in FIG. 24D.

Embodiment 8

FIGS. 25A to 25C and FIG. 26 show a semiconductor memory device according to an eighth embodiment of the invention. As can be seen in FIG. 25A, the memory cell of the memory device according to the instant embodiment is constituted by a circuit including a memory element MM21 according to the invention and a switching FET (field-effect transistor) M25 which are connected in series. More specifically, the word wire is connected to the gate of the switching FET M25 so that the voltage applied to the memory element MM21 from the data wire D can be interrupted by the switching FET M25. Thus, necessity for applying a voltage to nonselected memory cells which shares the word wire or the data wire with the selected memory cell can be obviated. This in turn means that the device according to the instant embodiment is excellent over the sixth and seventh embodiments in respect to the data hold characteristic, to an advantage.

Writing operation for the memory cell according to the instant embodiment is performed in a manner described below. First, operation involved in writing logic "0" will be considered. Applied to the word wire to be selected is a voltage of $(V_{cc}+V_t)$ while the potential level of zero volt is applied to the data wire to be selected. As a result, the switching FET M25 is turned on, whereby a node N21 assumes approximately the ground potential level. Since the source terminal P is at a voltage level of $V_{cc}/2$, a voltage of $-V_{cc}/2$ is applied across the gate and the source of the memory element MM21, whereby information of logic "0" is written in the memory cell (refer to FIG. 25C). Next, operation for writing logic "1" is considered. Also in this case, the voltage of $(V_{cc}+V_t)$ is applied to the word wire while applying the voltage $V_{cc}$ to the data wire. Thus, the voltage $V_{cc}/2$ is applied between the gate and the source of the memory element MM21, whereby logic "1" is written in the memory cell (refer to FIG. 25C).

Figure 26:
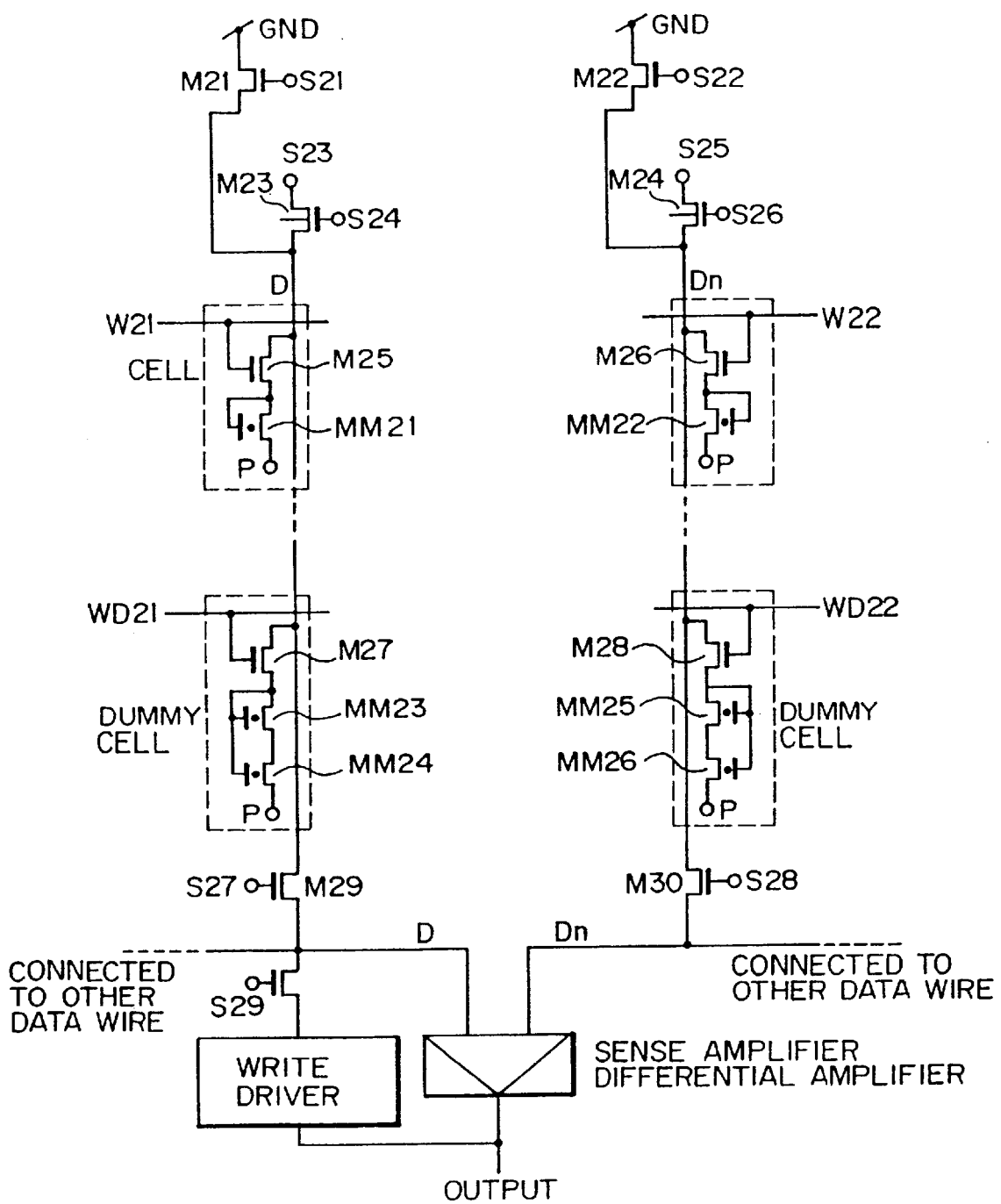
FIG. 26 is a circuit diagram showing circuit configuration of a read circuit for the memory cell according to the eighth embodiment of the invention.

The operation for reading data or information from the memory cell according to the instant embodiment can be carried out by the means of the similar to those adopted in the sixth and seventh embodiments. However, in connection with the instant embodiment, the invention teaches an arrangement which allows the read/write operation to be performed at a lower source voltage. Referring to FIG. 26, for reading out information from the memory cell comprised of the memory element M25 and the switching FET MM21, the potential level of the word wire W21 is changed to the source voltage level $V_{cc}$ from the ground potential level, and at the same time the potential of the word wire WD22 of the dummy cell comprised of a switching FET M27 and memory elements MM25 and MM26 is changed from low level to high level. Succeeding operation is the same as that of the sixth embodiment except that after the output is fixed, rewriting is performed for the memory cell by a writing driver connected to the output of the sense amplifier. By way of example, when logic "1" is to be written in the memory element MM21, the voltage $V_{cc}$ is applied to the data wire D. In that case, a voltage substantially equal to $V_{cc}$ is applied across the gate and the source of the memory element MM21, whereby logic "1" can be written in the memory element MM21. On the other hand, when logic "0" is to be written, the data wire is set to the ground potential level. Thus, the voltage of $-V_{cc}/2$ is applied between the gate and the source of the memory element MM21, whereby logic "0" is written in the memory cell.

In the memory device according to the instant embodiment, every time the data read operation is performed, rewriting operation is carried out in succession. By virtue of this arrangement, inversion of the information or data held by the memory element MM21 from logic "0" to logic "1" will present no problem so long as such inversion takes place only after the potential difference of such a magnitude which enables the read operation has occurred between the data wire D and the dummy data wire Dn. Thus, the read voltage $V_r$ and the write voltage $V_{cc}/2$ can be set at values or levels which are relatively close to each other. This in turn means that the write voltage can be set at a low level. By way of concrete example, the read voltage $V_r$ may be set at 3 volts with the write voltage $V_{cc}/2$ being set at 4 volts. By contrast, in order to ensure positively prevention of the information or data inversion from occurrence in the read operation as described hereinbefore in conjunction with the seventh embodiment (see FIG. 22C), the write voltage VP has to be set at about three times as high as the read voltage $V_r$. This necessitates application of a high voltage for the write operation.

Figure 27A:
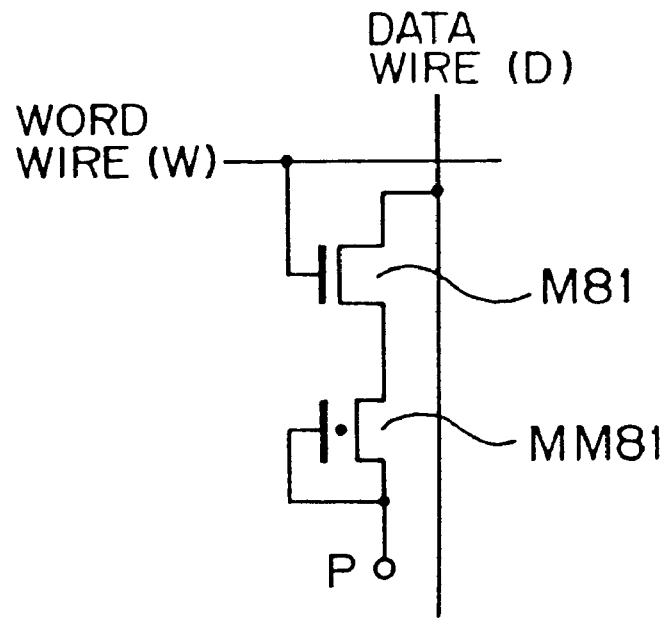
FIGS. 27A and 27B are circuit diagrams showing versions of the memory cell circuit according to the eighth embodiment, respectively.
Figure 27B:
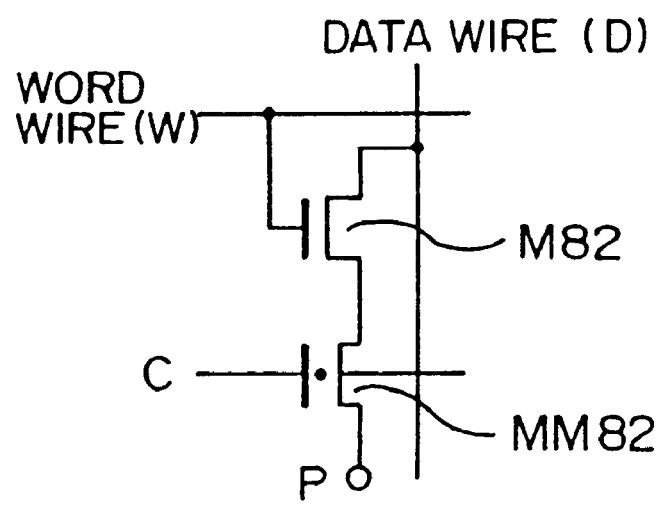

FIGS. 27A and 27B are circuit diagrams showing versions of the memory cell circuit according to the instant embodiment, respectively. The memory cell shown in FIG. 27A differs from the one shown in FIG. 25A in that a source terminal P is connected to the gate of the memory element MM81. On the other hand, in the memory cell shown in FIG. 27B, the gate of the memory element MM82 is controlled by a control signal C supplied externally of the memory cell.

Figure 28A:
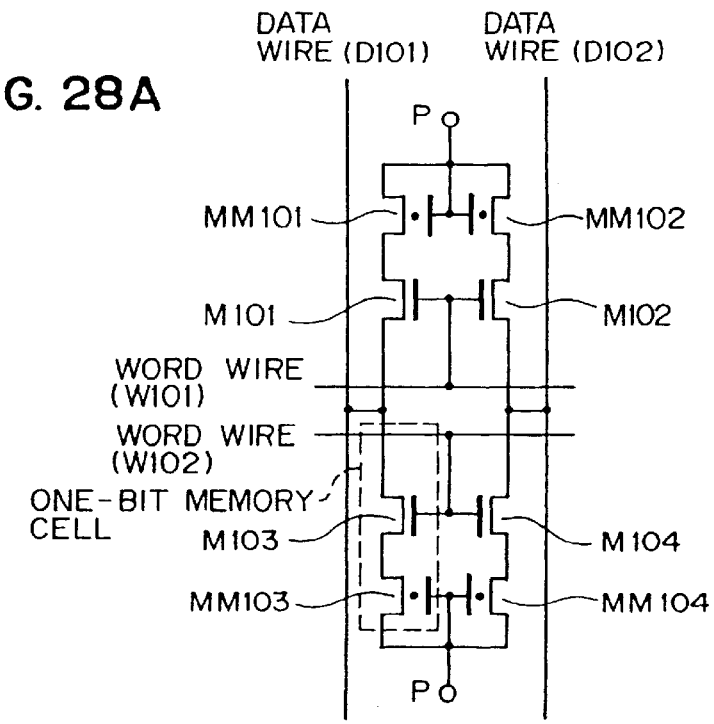
FIGS. 28A and 28B are a circuit diagram showing a configuration of a four-bit memory cell and a corresponding mask layout of the same, respectively.
Figure 28B:
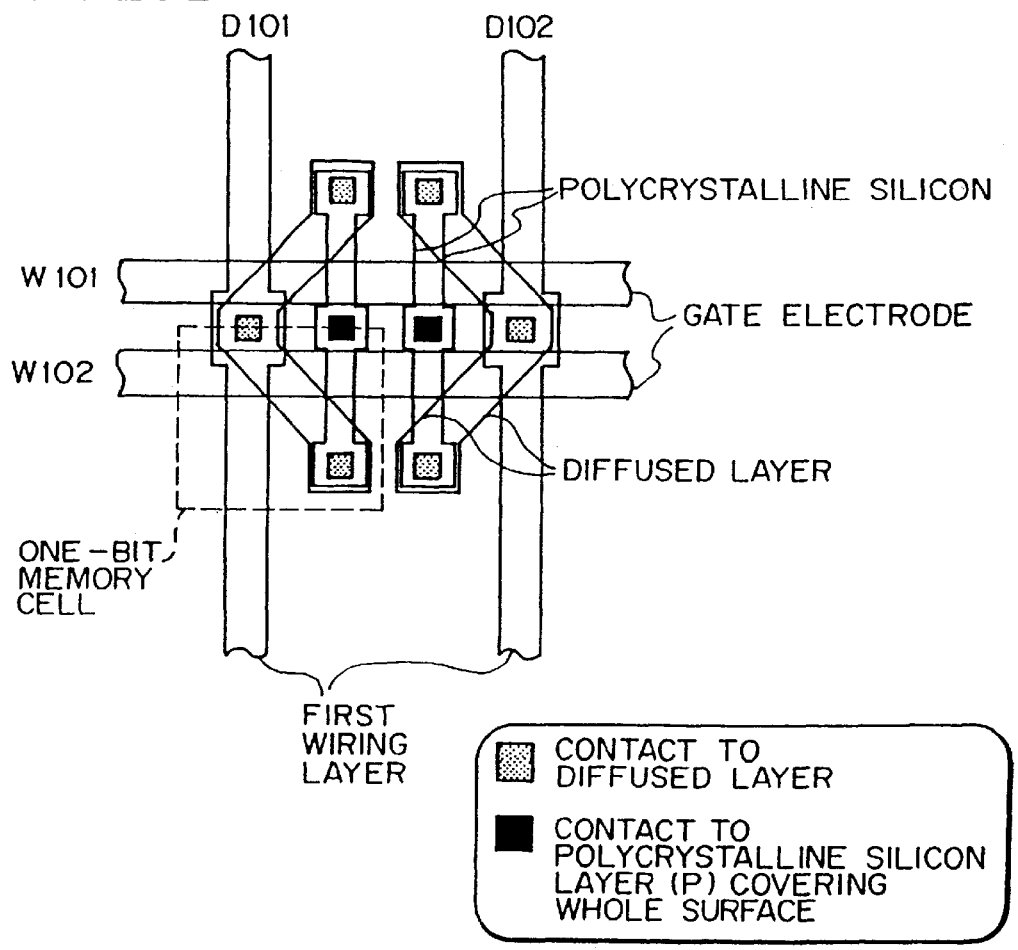

FIGS. 28A and 28B show a circuit configuration and a layout of a semiconductor memory device including a number of memory cells each of the structure shown in FIG. 27A which corresponds to four bits. In these figures, the memory cells MM101 to 104 are each constituted by the polycrystalline silicon memory element described hereinbefore in conjunction with the first embodiment. As can be seen from FIG. 28B, the word wires for the adjacent memory cells are constituted by one and the same electrode, while a contact is shared in common by the two adjacent memory cells and connected to the data wire. It will thus be understood that the area required for implementation of the memory cell can significantly be decreased.

Embodiment 9

Figure 30:
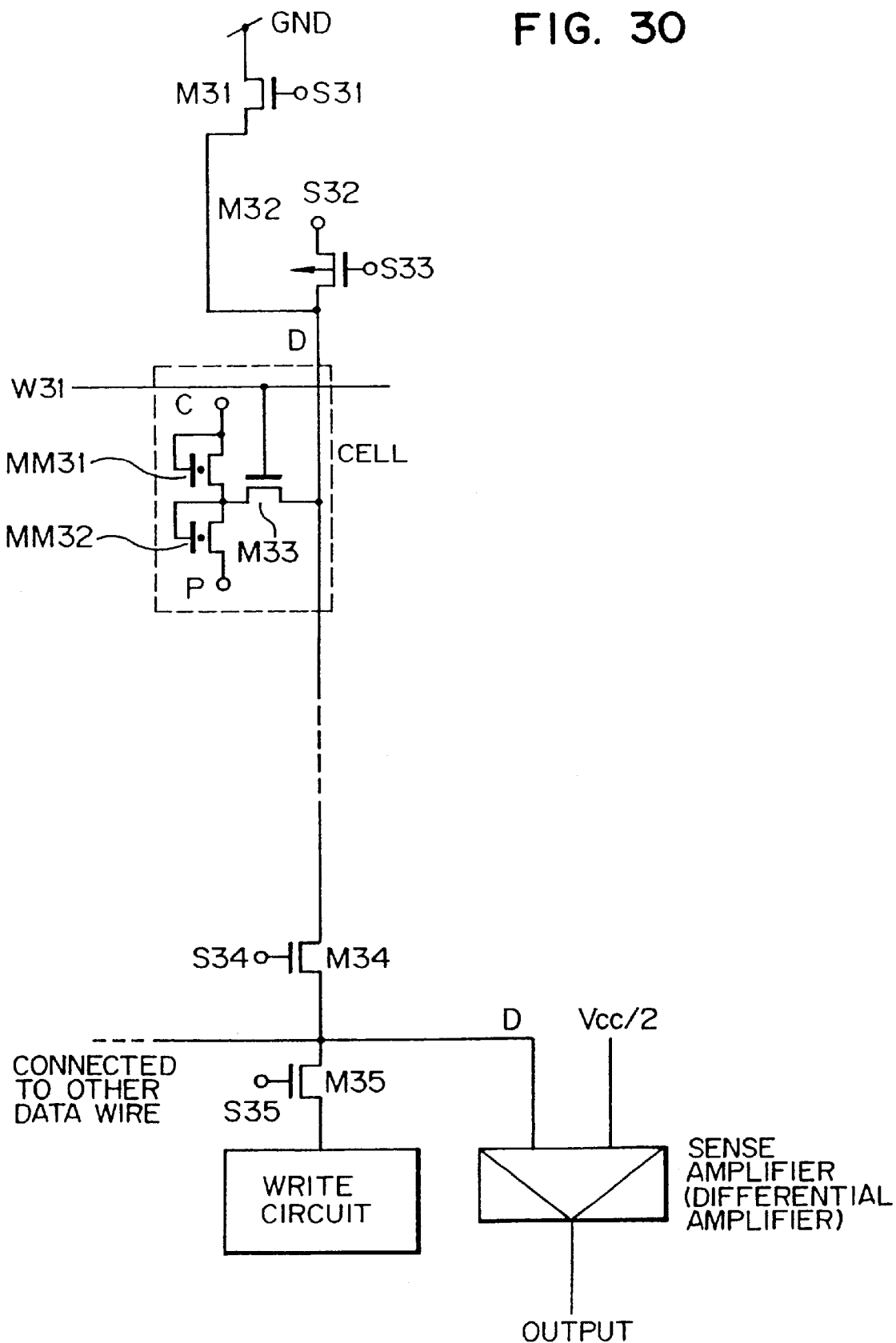
FIG. 30 is a circuit diagram showing a read/write circuit according to the ninth embodiment of the invention.
Figure 32:
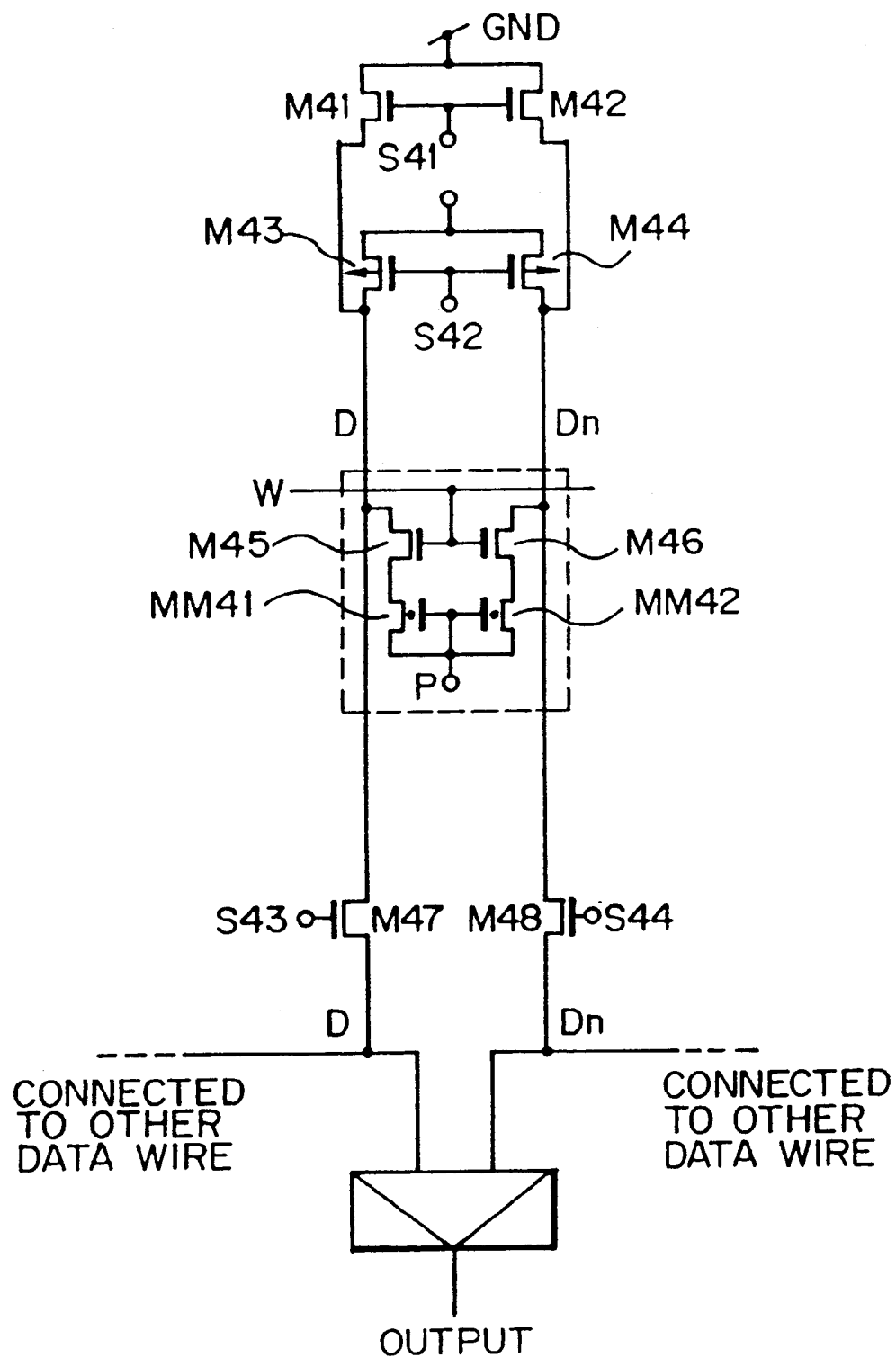
FIG. 32 is a circuit diagram showing a read circuit according to the tenth embodiment of the invention.

FIGS. 29A to 29C show a memory cell circuit and a read circuit according to a ninth embodiment of the invention. More specifically, FIG. 29A shows a circuit diagram of a memory cell according to the instant embodiment, FIG. 29B shows voltages as applied upon read and write operations performed for the memory cell, and FIG. 29C graphically illustrates characteristics of memory elements MM31 and MM32 employed in the memory cell. A feature of the memory cell according to the instant embodiment of the invention resides in that complementary information or data are written in the memory elements MM31 and MM32. More specifically, for writing logic "1", a voltage of $V_{cc}$ is applied to the word wire W while a voltage of $V_e$ (of negative polarity) is applied to the data wire D, as a result of which a switching FET M33 is turned on, whereby the potential of the data wire D is applied to a node N31 which thus assumes the potential level $V_e$. Since the voltage $V_e$ is applied between the gate and the source of the memory element MM32, the latter is set to a low threshold state. In contrast, a voltage of $(V_{cc}-V_e)$ is applied between the gate and the source of the memory element MM31, which thus assumes a high threshold state. For writing logic "0" in the memory cell, the data wire D is set to the write voltage level $V_p$. As a result of this, the memory element MM31 assumes the low threshold state with the memory element MM32 in the high threshold state. In succession to the write operation, the potential level of the data wire is set to $V_{cc}/2$, which results in application of voltage of about $V_{cc}/2$ between the gates and the sources of the memory elements MM31 and MM32, respectively. In the logic "1" state, the data wire D tends to discharge, while in the state of logic "0", the data wire D is charged. This trend or state is detected by the differential amplifier for reading the data or information, as can be seen in FIG. 30.

In the memory cell according to the instant embodiment of the invention, the potential level of the data wire lowers or rises in dependence on whether the information or data of the memory cell to be read out is logic "1" or "0". Accordingly, it is possible to apply directly the reference voltage $(V_{cc}/2)$ to one of input terminals of the differential amplifier. For this reason, no dummy cell is required, to an advantage. In this conjunction, it should be recalled that in the case of the circuit configurations according to the embodiments described hereinbefore, the dummy cells have to be provided because it is indefinite whether the potential level of the data wire is maintained or lowered in dependence on whether the memory cell data is logic "1" or "0".

Embodiment 10

Description will now turn to a memory cell circuit according to a further embodiment of the invention by reference to FIGS. 31A to 31C, in which FIG. 31A shows a memory cell circuit for a single bit according to the instant embodiment of the invention, FIG. 31B shows voltages for read and write operations, respectively, and FIG. 31C graphically illustrates characteristics of the memory elements MM41 and MM42. In the memory cell according to the instant embodiment, such arrangement is adopted that a pair of memory cells each of the structure shown in FIG. 27A can be selected by means of one and the same word wire. To this end, memory elements MM41 and MM42 are adapted to store information or data which are complementary to each other. Namely, when the memory element MM41 is set to a low threshold state, the memory element MM42 is set to a high threshold state, and vice versa. Consequently, when the word wire is set to a high potential level after the write operation, there makes appearance between the data wires D and Dn a potential difference reflecting a difference in the current driving capability between the memory elements MM41 and MM42. Thus, by connecting the data wires D and Dn to a pair of input terminals of a differential amplifier, it is possible to read information or data stored in the memory cell.

Figure 33:
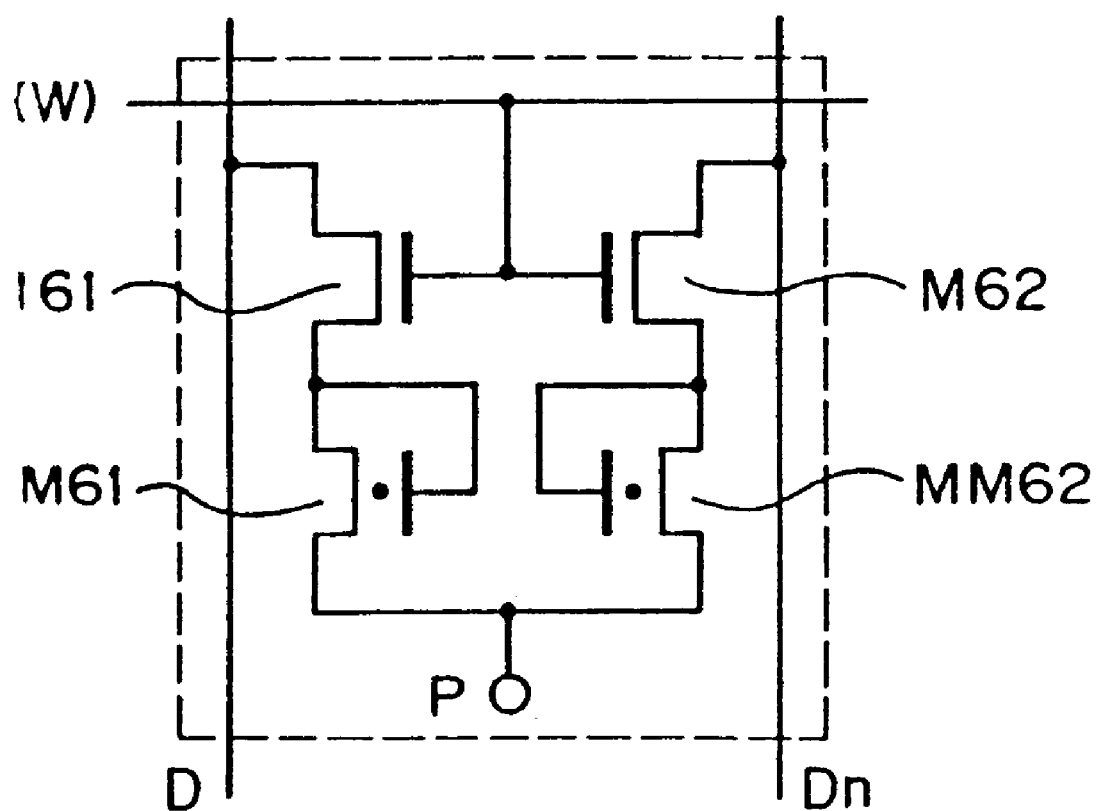
FIG. 33 is a view showing a version of a memory cell according to the tenth embodiment.

In the memory cell or memory device according to the instant embodiment of the invention, stable operation can be ensured without need for provision of the dummy cell as well as need for generation of the reference potential level for the differential amplifier. Thus, the circuit design can be simplified. Parenthetically, similar advantage can be assured by using a memory cell circuit shown in FIG. 33.

In the foregoing description of the exemplary embodiments, it has been assumed that an n-channel gate insulated field effect transistor is employed as the switching element. It goes, however, without saying that it may be replaced by other type of switching element. By way of example, a p-channel field effect transistor may be employed. In that case, the polarity of the voltage applied to the gate electrode must of course be inverted.

Besides, in the foregoing description, it has been assumed that the semiconductor memory element is of n-channel type. It is however obvious that the memory element as well as the memory device can be implemented by using p-channel memory element (i.e., element capable of operating with holes).

Embodiment 11

The semiconductor memory devices or simply the memories described hereinbefore in conjunction with the sixth to tenth embodiments feature that information or data can be held without being volatilized. Thus, the time taken for data write operation is extremely short when compared with the conventional non-volatile memory, and no limitation is imposed to the number of times the rewriting operation is performed. Further, because the writing operation is completed by injecting only a few electrons, the writing operation of a very high speed can be achieved. The reason why no limitation is imposed on the number of times for the writing operation can be explained by the fact that the writing is realized by the move of a few electrons.

Figure 34:
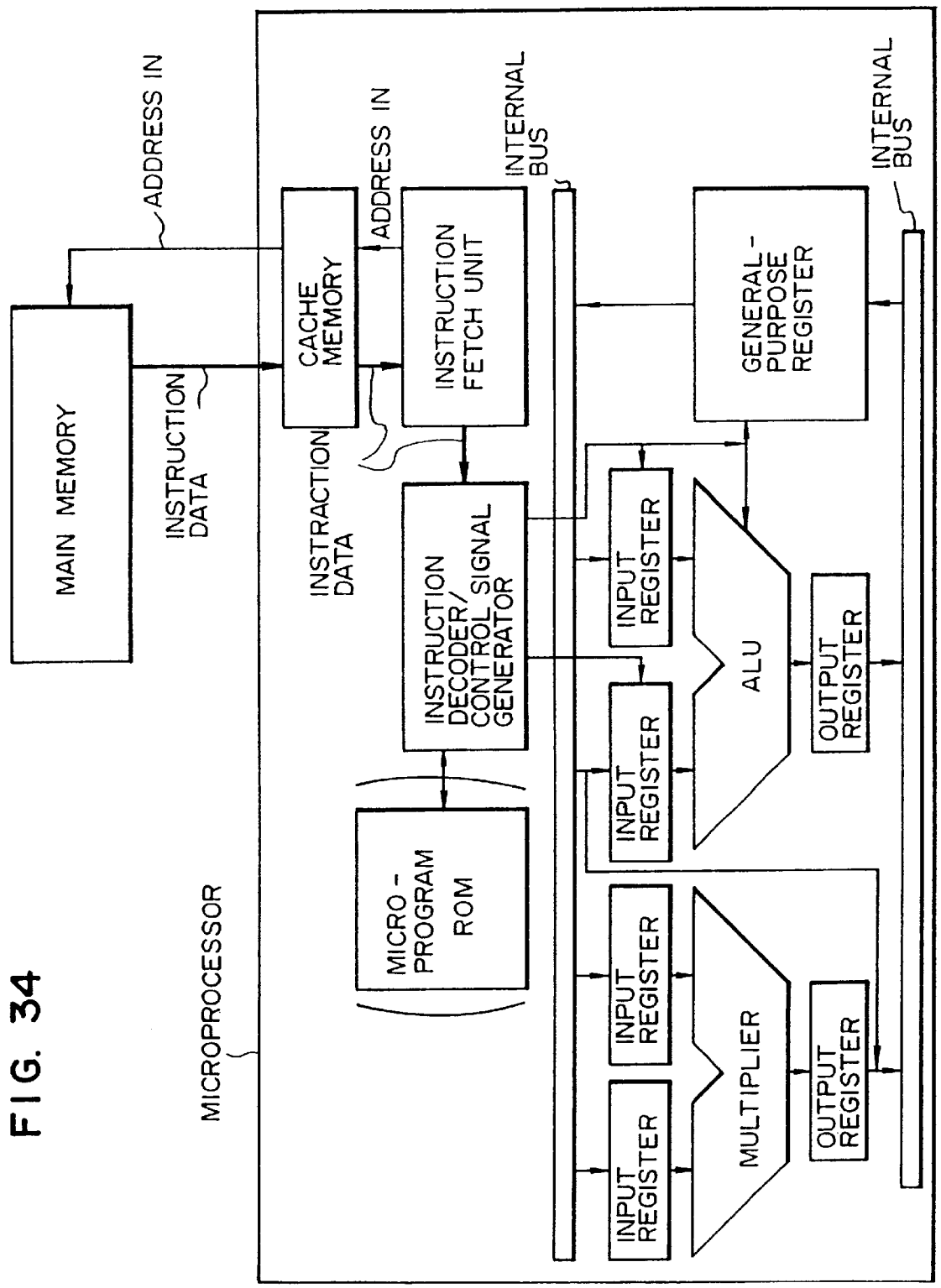
FIG. 34 is a block diagram showing a structure of a data processing apparatus in which a memory device according to the invention be employed as a main memory.

The memory devices according to the invention can very profitably be employed as a main memory of a microprocessor in a data processing system such as shown in FIG. 34. Since the memory device according to the instant embodiment is nonvolatile, information stored once in the memory device can be held even after a source power supply is interrupted. Owing to this feature, the external storage implemented in the form of a hard disk or floppy disk can be realized by a memory chip fabricated according to the teachings of the invention. Besides, because of nonvolatileness of the main memory, a computer incorporating this type of main memory can instantaneously be restored to the state prevailing immediately before interruption of the power supply.

Additionally, by using the semiconductor memory device described in conjunction with the sixth to tenth embodiments as a cache memory in a microprocessor, not only the cache memory can be made nonvolatile but also power consumption of the microprocessor can be decreased significantly.

As is apparent from the foregoing description, there is provided according to the invention the semiconductor memory devices which can be implemented with a small number of memory elements which per se have information or data storing capability while mitigating the requirement imposed on the area for implementation without need for cooling at a cryogenic level of temperature. Thus, by using the semiconductor memory device according to the invention, there can be realized a nonvolatile memory device susceptible to high speed rewrite operation.

What is claimed is:

1. A semiconductor memory cell array comprising:
   a plurality of data lines;
   a plurality of word lines; and
   a plurality of memory cells, each of said memory cells comprising:
   a first field effect transistor having a first source region connected to a corresponding data line of said plurality of data lines, a first drain region, a first channel region between said first source region and said first drain region, and a first gate electrode located opposite to said first channel region, said first gate electrode being connected to a corresponding word line of said plurality of word lines; and a second field effect transistor having a second source region connected to said first drain region, a second drain region, a second channel region between said second source region and said second drain region, a second gate electrode located opposite to said second channel region, and a carrier confinement region controlled by said second gate electrode, said second gate electrode being connected to said first drain region.

2. A semiconductor memory cell array according to claim 1, wherein said carrier confinement region is formed between said second gate electrode and said second channel region.

3. A semiconductor memory cell array according to claim 2, wherein each of said memory cells has a conductance between the second source region and the second drain region which exhibits a hysteresis when a potential difference between the second gate electrode and the second source region changes with a voltage between the second drain region and the second source region being constant.

4. A semiconductor memory cell array according to claim 2, wherein said second gate electrode is formed of a metal or a semiconductor, wherein said second channel region is formed of a semiconductor on an insulating layer, wherein said carrier confinement region is formed of a metal or a semiconductor and of fine grains, and wherein each of said word lines controls a potential of a corresponding second gate electrode.

5. A semiconductor memory cell array according to claim 2, wherein said plurality of data lines include a plurality of main data lines and a plurality of sub-data lines, said first source region being connected to a corresponding sub-data line of said plurality of sub-data lines, each of said sub-data lines being connected to a corresponding main data line of said plurality of main data lines through a switch or a preamplifier, and wherein said plurality of memory cells are arrayed with said lines in a matrix.

6. A semiconductor memory cell array according to claim 1, wherein said carrier confinement region is formed within the second channel region.

7. A semiconductor memory cell array according to claim 6, wherein each of said memory cells has a conductance between the second source region and the second drain region which exhibits a hysteresis when a potential difference between the second gate electrode and the second source region changes with a voltage between the second drain region and the second source region being constant.

8. A semiconductor memory cell array according to claim 6, wherein said second gate electrode is formed of a metal or a semiconductor, wherein said second channel region is formed of a semiconductor on an insulating layer, wherein said carrier confinement region is formed of a metal or a semiconductor and of fine grains, and wherein each of said word lines controls a potential of a corresponding second gate electrode.

9. A semiconductor memory cell array according to claim 6, wherein said plurality of data lines include a plurality of main data lines and a plurality of sub-data lines, said first source region being connected to a corresponding sub-data line of said plurality of sub-data lines, each of said sub-data lines being connected to corresponding main data line of said plurality of main data lines through a switch or a preamplifier, and wherein said plurality of memory cells are arrayed with said lines in a matrix.

* * * * *